United States Patent
Lin et al.

(10) Patent No.: US 7,354,830 B2
(45) Date of Patent: Apr. 8, 2008

(54) METHODS OF FORMING SEMICONDUCTOR DEVICES WITH HIGH-K GATE DIELECTRIC

(75) Inventors: Chun-Chieh Lin, Hsin-Chu (TW);
Wen-Chin Lee, Hsin-Chu (TW);
Chenming Hu, Hsin-Chu (TW);
Shang-Chih Chen, Hsin-Chu (TW);
Chih-Hao Wang, Hsin-Chu (TW);
Fu-Liaog Yang, Hsin-Chu (TW);
Yee-Chia Yeo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 120 days.

(21) Appl. No.: 11/377,105

(22) Filed: Mar. 16, 2006

(65) Prior Publication Data

US 2006/0177997 A1   Aug. 10, 2006

Related U.S. Application Data

(62) Division of application No. 10/832,020, filed on Apr. 26, 2004, now Pat. No. 7,045,847.

(60) Provisional application No. 60/534,642, filed on Jan. 6, 2004, provisional application No. 60/494,173, filed on Aug. 11, 2003.

(51) Int. Cl.
*H01L 21/8234* (2006.01)

(52) U.S. Cl. .............................. 438/275; 257/E21.625

(58) Field of Classification Search ............. 257/391, 257/392, E27.064, E21.421, E21.625, E21.639, 257/E21.675, E21.689; 438/275, 981
See application file for complete search history.

(56) References Cited

U.S. PATENT DOCUMENTS

| 5,321,289 A | 6/1994 | Baba et al. |
| 5,668,035 A | 9/1997 | Fang et al. |
| 6,013,553 A | 1/2000 | Wallace et al. |
| 6,015,739 A | 1/2000 | Gardner et al. |
| 6,030,862 A | 2/2000 | Kepler |
| 6,166,417 A | 12/2000 | Bai et al. |

(Continued)

FOREIGN PATENT DOCUMENTS

TW         426941       3/2001

OTHER PUBLICATIONS

"Bake and Cure of Low-k Dielectric Layers," Koyo Thermo Systems Co., Ltd., http://www.crystec.com/killowe.htm. Jan. 7, 2004.

(Continued)

*Primary Examiner*—David Vu
(74) *Attorney, Agent, or Firm*—Slater & Matsil, L.L.P.

(57) ABSTRACT

A method of fabricating an integrated circuit is provided. A first gate dielectric portion is formed on a substrate in a first transistor region. The first gate dielectric portion includes a first high-permittivity dielectric material. The first gate dielectric portion has a first equivalent silicon oxide thickness. A second gate dielectric portion is formed on the substrate in a second transistor region. The second gate dielectric portion includes the first high-permittivity dielectric material. The second gate dielectric portion has a second equivalent silicon oxide thickness. The second equivalent silicon oxide thickness is different than the first equivalent silicon oxide thickness.

28 Claims, 33 Drawing Sheets

U.S. PATENT DOCUMENTS

| | | | |
|---|---|---|---|
| 6,168,958 | B1 | 1/2001 | Gardner et al. |
| 6,221,114 | B1 | 4/2001 | Würthner et al. |
| 6,265,325 | B1 | 7/2001 | Cao et al. |
| 6,303,418 | B1 | 10/2001 | Cha et al. |
| 6,383,861 | B1 | 5/2002 | Gonzalez et al. |
| 6,432,776 | B1 | 8/2002 | Ono |
| 6,448,127 | B1 | 9/2002 | Xiang et al. |
| 6,479,341 | B1 | 11/2002 | Lu |
| 6,495,422 | B1 | 12/2002 | Yu et al. |
| 6,528,374 | B2 | 3/2003 | Bojarczuk, Jr. et al. |
| 6,528,858 | B1 | 3/2003 | Yu et al. |
| 6,632,714 | B2 | 10/2003 | Yoshikawa |
| 6,640,403 | B2 | 11/2003 | Shih et al. |
| 6,737,354 | B2 * | 5/2004 | Miles et al. ........... 438/666 |
| 6,777,761 | B2 | 8/2004 | Clevenger et al. |
| 6,906,398 | B2 | 6/2005 | Yeo et al. |
| 6,927,414 | B2 | 8/2005 | Ouyang et al. |
| 7,045,847 | B2 | 5/2006 | Lin et al. |
| 2004/0198009 | A1 | 10/2004 | Chen et al. |
| 2005/0048722 | A1 | 3/2005 | Saito et al. |
| 2006/0011949 | A1 | 1/2006 | Yang et al. |
| 2006/0024893 | A1 | 2/2006 | Min et al. |
| 2006/0211195 | A1 | 9/2006 | Luan |

OTHER PUBLICATIONS

Chen, et al., "Downscaling Limit of Equivalent Oxide Thickness in Formation of Ultrathin Gate Dielectric by Thermal-Enhanced Remote Plasma Nitridation," IEEE Transactions on Electron Devices, May 2002, vol. 49, No. 5, pp. 840-846.

Gustafsson, et al., "High-Resolution Depth Profiling Of Ultrathin Gate Oxides Using Medium-Energy Ion Scattering," Nuclear Instruments And Methods In Physics Research B 183, 2001, pp. 146-153.

Mahapatra, et al., "$ZrO_2$ As A High-k Dielectric For Strained SiGe MOS Devices," Bull. Mater. Sci., Nov. 2002, vol. 25, No. 6, pp. 455-457.

Yeo, et al., "Direct Tunneling Leakage Current And Scalability Of Alternative Gate Dielectrics," Applied Physics Letters, Sep. 9, 2002, vol. 81, No. 11, pp. 2091-2093.

* cited by examiner

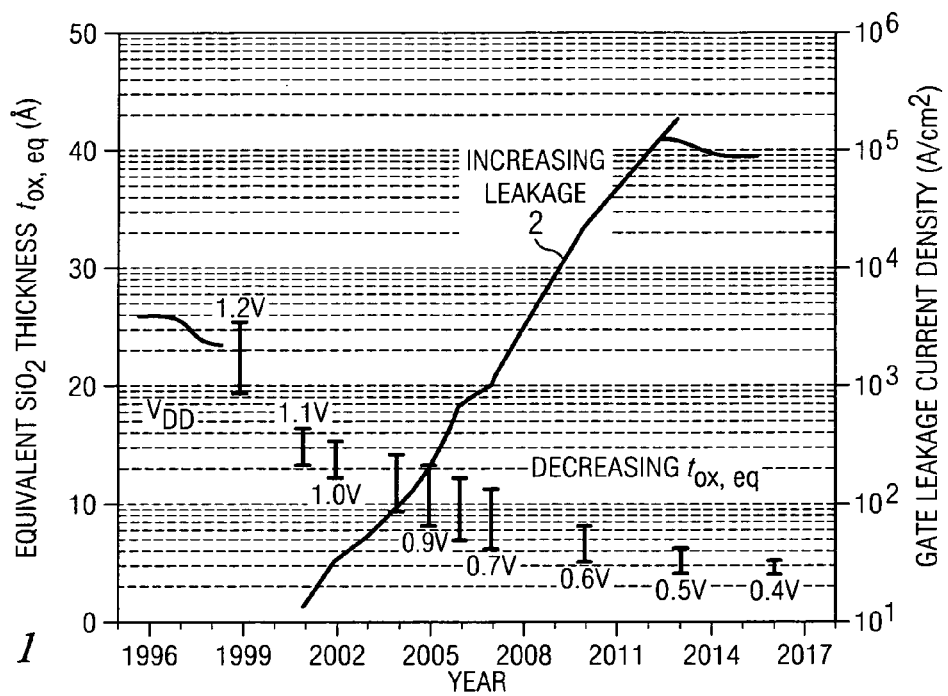
FIG. 1
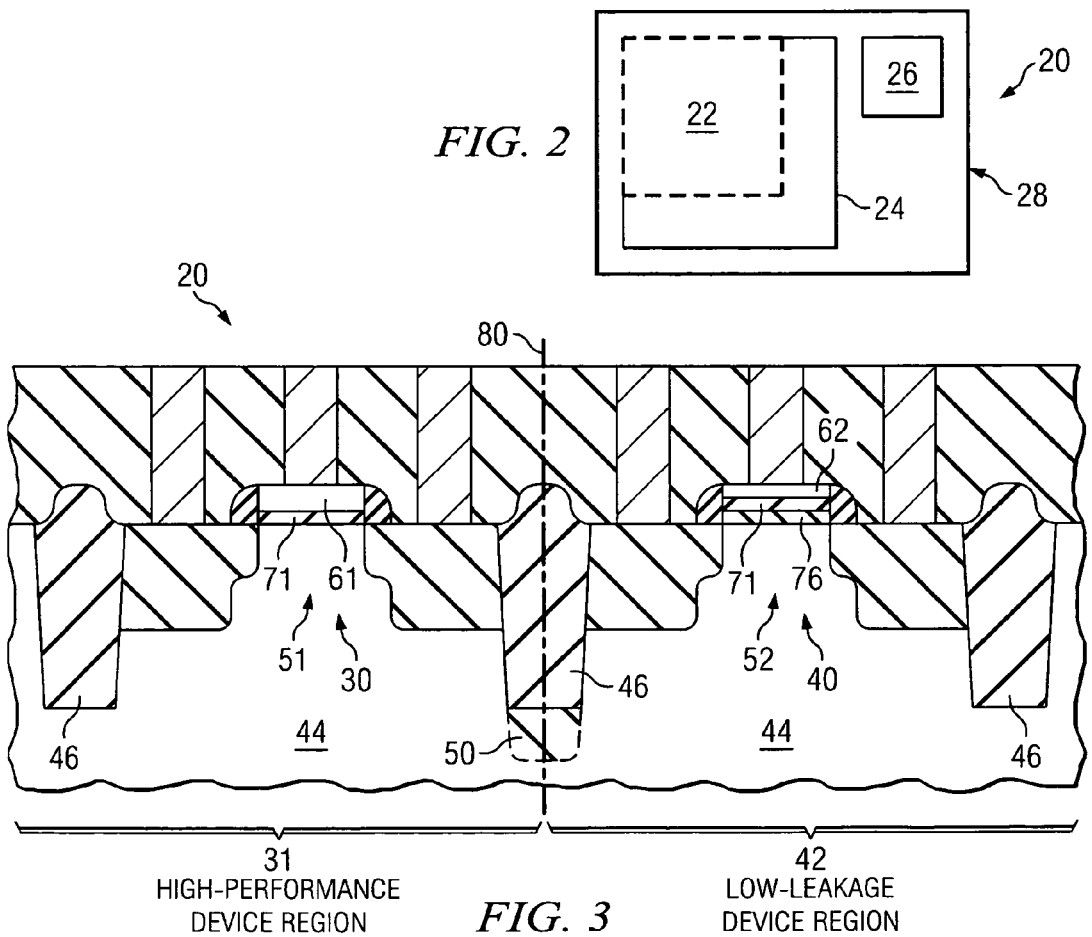
FIG. 2
FIG. 3

METHODS OF FORMING SEMICONDUCTOR DEVICES WITH HIGH-K GATE DIELECTRIC

This application is a divisional of patent application Ser. No. 10/832,020, now U.S. Pat. No. 7,045,847 entitled Semiconductor Device With High-K Gate Dielectric, filed on Apr. 26, 2004, which application claims the benefit of U.S. Provisional Application No. 60/494,173 entitled MOSFET Devices Having Different Gate Dielectrics And Method Of Formation, filed on Aug. 11, 2003 and also claims the benefit of U.S. Provisional Application No. 60/534,642, entitled Semiconductor Device With High-K Gate Dielectric, filed on Jan. 6, 2004, all of which applications are incorporated herein by reference.

CROSS-REFERENCE TO RELATED APPLICATION

This application relates to the following commonly assigned patent application: Ser. No. 10/335,962, filed Jan. 2, 2003, entitled Semiconductor Chip With Gate Dielectrics For High-Performance And Low-Leakage Applications, which issued as U.S. Pat. No. 6,906,398, and which application is hereby incorporated herein by reference.

TECHNICAL FIELD

The present invention generally to the field of semiconductor devices and more particularly to semiconductor chips having differing gate dielectrics in different regions of the chips and the methods for the manufacturing of same.

BACKGROUND

Size reduction of the metal-oxide-semiconductor field-effect transistor (MOSFET) has enabled the continued improvement in speed performance, density, and cost per unit function of integrated circuits over the past few decades. As the gate length of the conventional bulk MOSFET is reduced, it suffers from problems related to the inability of the gate to substantially control the on and off states of the channel. Phenomena such as reduced gate control associated with transistors with short channel lengths are termed short-channel effects. These short channel effects become particularly pronounced as device geometries shrink to 0.13 microns and below. One of the primary means by which short-channel effects are kept under control is the downscaling of the gate dielectric thickness in conjunction with transistor size reduction.

The scaling trend of the MOSFET gate dielectric thickness is shown in FIG. 1. The projected range of the equivalent silicon oxide ($SiO_2$) thickness $t_{ox,eq}$ for high-performance logic applications is plotted using bars (plotted against the left axis). For example, in the year 2016, $t_{ox,eq}$ is expected to be less than 6 angstroms for high performance logic applications. The supply voltage $V_{DD}$ is also indicated in FIG. 1. Assuming the most conservative $t_{ox,eq}$ scaling, i.e., largest value for each bar, the gate leakage current density through $SiO_2$ is calculated and plotted as the solid line 2 (plotted against the right axis). Even with conservative $t_{ox,eq}$ scaling, excessive gate leakage prohibits continued gate dielectric scaling using $SiO_2$. Under current process technologies, ultra-thin films are in the range of 2 angstroms to 20 angstroms. Preferably, ultra-thin $SiO_2$ films are less than 10 angstroms. Such ultra-thin films not only lead to excessive leakage, but also aggravate the problems of poly-silicon (poly-Si) gate depletion, gate dielectric integrity, and gate dopant penetration to the channel region.

So-called high-k gate dielectrics have been proposed because of their improved gate leakage properties. High-k gate dielectrics may be suitable candidates, examples of which include (but are not limited to) metallic oxides such as aluminum oxide ($Al_2O_3$), zirconium oxide ($ZrO_2$), and hafriium oxide ($HfO_2$), silicates such as $ZrSiO_4$, and aluminates such as lanthanum aluminate. Many high-k gate dielectrics in direct contact with the silicon substrate have poorer interface properties than $SiO_2$ or SiON on silicon. Therefore, an interfacial $SiO_2$ or SiON layer is sometimes inserted below the high-k gate dielectric to obtain reasonable carrier mobilities in the transistor channel.

U.S. Pat. No. 6,015,739 describes a method for the fabrication of a gate dielectric stack where a dielectric film with a relative dielectric permittivity or relative permittivity of 20-200 overlies a silicon nitride film over a native oxide layer formed on a semiconductor substrate. U.S. Pat. No. 6,448,127 describes a method for the formation of a high-k gate dielectric overlying silicon oxide. The relative permittivity of a material is the ratio of the electric permittivity of the material to the permittivity of free space $\in_0$. The permittivity of free space is $8.85 \times 10^{-12}$ F/m.

The gate dielectric stack structures such as those described above have limited scalability to ultra-thin equivalent $SiO_2$ thicknesses below approximately 7 angstroms for high performance applications. Although transistors with high-k/$SiO_2$ or high-k/SiON stack gate dielectrics provide improved gate leakage current performance, they often do so at the sacrifice of switching speed. As such, the high-k devices are not a satisfactory solution in applications where speed performance is important.

Other attempts at improving device performance have involved the provision of transistors on the same chip with differing gate oxides. Examples include U.S. Pat. No. 5,668,035 issued to Fang et al., U.S. Pat. No. 6,030,862 issued to Kepler, U.S. Pat. No. 6,265,325 issued to Cao et al., U.S. Pat. No. 6,383,861 issued to Gonzalez et al., and U.S. Pat. No. 6,168,958 issued to Gardner et al. Hence, a need exists to overcome the various shortcomings in the prior art for chips having regions where gate leakage current is more important and regions where switching speed is more important.

SUMMARY OF THE INVENTION

The problems and needs outlined above may be addressed by embodiments of the present invention. In accordance with one aspect of the present invention, an integrated circuit is provided, which includes a substrate, a first transistor, and a second transistor. The first transistor has a first gate dielectric portion located between a first gate electrode and the substrate. The first gate dielectric portion includes a first high-permittivity dielectric material and/or a second high-permittivity dielectric material. The first gate dielectric portion has a first equivalent silicon oxide thickness. The second transistor has a second gate dielectric portion located between a second gate electrode and the substrate. The second gate dielectric portion includes the first high-permittivity dielectric material and/or the second high-permittivity dielectric material. The second gate dielectric portion has a second equivalent silicon oxide thickness. The second equivalent silicon oxide thickness may be different than the first equivalent silicon oxide thickness.

In accordance with another aspect of the present invention, an integrated circuit is provided, which includes a substrate, a first transistor, and a second transistor. The first transistor has a first gate dielectric portion located between a first gate electrode and the substrate. The first gate dielectric portion includes a first high-permittivity dielectric material. The first gate dielectric portion has a first equivalent silicon oxide thickness. The second transistor has a second gate dielectric portion located between a second gate electrode and the substrate. The second gate dielectric portion includes the first high-permittivity dielectric material. The second gate dielectric portion has a second equivalent silicon oxide thickness. The second equivalent silicon oxide thickness is different than the first equivalent silicon oxide thickness.

In accordance with yet another aspect of the present invention, an integrated circuit is provided, which includes a substrate, a first transistor, and a second transistor. The first transistor has a first gate dielectric portion located between a first gate electrode and the substrate. The first gate dielectric portion includes a first high-permittivity dielectric material. The second transistor has a second gate dielectric portion located between a second gate electrode and the substrate. The second gate dielectric portion includes a second high-permittivity dielectric material. The second high-permittivity dielectric material is different than the first high-permittivity dielectric material.

In accordance with another aspect of the present invention, a method of fabricating an integrated circuit is provided. This method includes the following steps described in this paragraph, and the order of steps may vary. A first gate dielectric portion is formed on a substrate in a first transistor region. The first gate dielectric portion includes a first high-permittivity dielectric material. The first gate dielectric portion has a first equivalent silicon oxide thickness. A second gate dielectric portion is formed on the substrate in a second transistor region. The second gate dielectric portion includes the first high-permittivity dielectric material. The second gate dielectric portion has a second equivalent silicon oxide thickness. The second equivalent silicon oxide thickness is different than the first equivalent silicon oxide thickness.

In accordance with still another aspect of the present invention, a method of fabricating an integrated circuit is provided. This method includes the following steps described in this paragraph, and the order of steps may vary. A first gate dielectric portion is formed on a substrate in a first transistor region. The first gate dielectric portion includes a first high-permittivity dielectric material. A second gate dielectric portion is formed on the substrate in a second transistor region. The second gate dielectric portion includes a second high-permittivity dielectric material. The second high-permittivity dielectric material is different than the first high-permittivity dielectric material.

In accordance with yet another aspect of the present invention, a method of fabricating an integrated circuit is provided. This method includes the following steps described in this paragraph, and the order of steps may vary. A first gate dielectric portion is formed on a substrate in a first transistor region. The first gate dielectric portion includes a first high-permittivity dielectric material. The first gate dielectric portion has a first equivalent silicon oxide thickness. A second gate dielectric portion is formed on the substrate in a second transistor region. The second gate dielectric portion includes a second high-permittivity dielectric material. The second high-permittivity dielectric material is different than the first high-permittivity dielectric material. The second gate dielectric portion has a second equivalent silicon oxide thickness. The second equivalent silicon oxide thickness is different than the first equivalent silicon oxide thickness.

The foregoing has outlined rather broadly features of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which:

FIG. 1 is a graph showing the relationships between gate equivalent $SiO_2$ thickness, gate leakage current, and supply voltage;

FIG. 2 illustrates a top view of an exemplary integrated circuit;

FIG. 3 shows a first embodiment of the present invention;

DETAILED DESCRIPTION OF ILLUSTRATIVE EMBODIMENTS

Figure 4A:
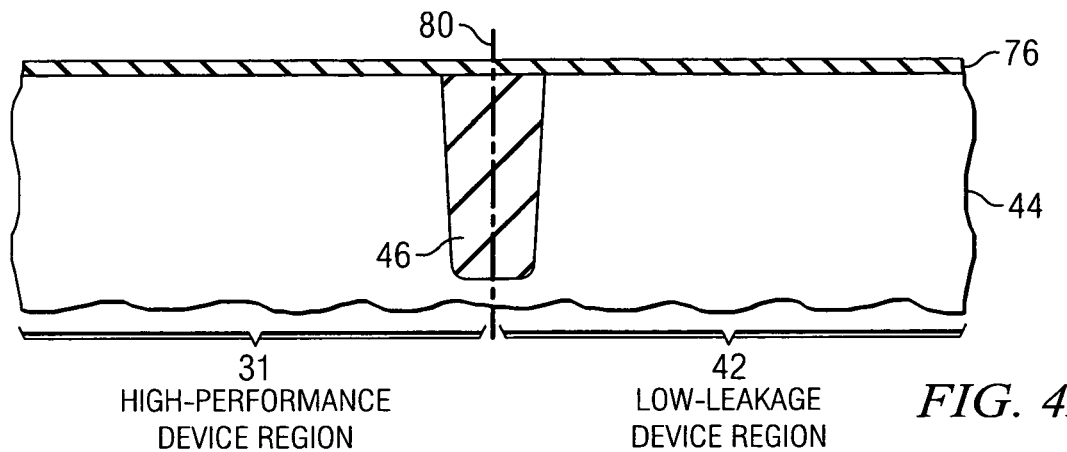
FIGS. 4A-4D show some example steps for fabricating a first embodiment of the present invention.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

FIG. 2 illustrates in top view an exemplary integrated circuit 20 having a first memory array region 22, such as an array of embedded DRAM memory, for example. The memory array 22 is comprised of low leakage current transistors, such as transistor 40 illustrated in FIG. 3 (discussed below). Surrounding support logic, comprised of high-performance transistors, such as transistor 30 of FIG. 3 (discussed below), are shown adjacent memory array 22 in region 24. A second embedded memory region 26 is also illustrated adjacent logic region 28. Embedded memory region 26, having all or primarily low leakage current transistors is preferably an embedded cache memory for a CPU or DSP circuit comprising high-performance transistors in region 28, for example. The example layout shown in FIG. 2 is just one example among many possible layouts and configurations. Other combinations and arrangements of high-performance and low-leakage current regions and transistors may be realized by those of ordinary skill in the art.

As used herein, "high-performance" refers generally to devices having gate delays on the order of picoseconds or less. To achieve such short gate delays, high performance devices typically employ ultra-thin gate dielectrics with high gate leakage current of 1 A/cm$^2$ or higher. "Low-leakage" devices refers generally to devices having leakage current that is approximately three orders of magnitude lower than that of high-performance devices. One skilled in the art will recognize that gate delays and leakage currents are functions of multiple variables, including device design, minimum feature size, materials, and the like, for example. An embodiment of the present invention may be applicable to a broad range of feature sizes and device designs. As feature sizes continue to shrink, gate delay and leakage current performance parameters will likely change significantly. As such, the terms "high-performance" and "low leakage" should not be considered as absolute parameters or characteristics, but should be construed as being relativistic terms with a high-performance device switching at appreciably faster speeds or shorter gate delays than a low leakage device (for the given application) and a low leakage device showing appreciably improved leakage current performance relative a high-performance device (again relative to the technology in which the invention is embodied).

FIG. 3 shows a first embodiment of the present invention. FIG. 3 illustrates a simplified cross-section view of an exemplary integrated circuit having a first transistor region 31, e.g., high-performance region as a logical circuit region, and a second transistor region 42, e.g., low-leakage current region as a memory array region, for example. One exemplary transistor is illustrated in each exemplary region for the sake of clarity.

While a bulk semiconductor substrate 44 is illustrated in FIG. 3, this invention is not restricted to bulk semiconductor substrates, and generally applies to any substrate, e.g. silicon-on-insulator (SOI) substrates. In the preferred embodiment, as shown in FIG. 3, an isolation structure 46 is shallow trench isolation, for example. It is understood that isolation 46 may also be accomplished by other means of isolation such as any of a number of variations of local oxidation of silicon (LOCOS), such as recessed, semi-recessed LOCOS, field oxide (FOX), through the formation of silicon "islands" on an insulating substrate, and the like, for example. For purposes of explanation, substrate 44 is illustrated as being divided into two adjacent regions 31 and 42. Regions 31 and 42 are illustrated as being separated by isolation structure 46. One skilled in the art will recognize that FIG. 3 is for illustration only and that the size, placement, and arrangement of regions 31 and 42 may vary considerably in actual implementations. Additionally, multiple regions (e.g., multiple high-performance and low-leakage current regions) may be formed on a single chip. As an example, a low leakage current region may have a memory array formed therein, where leakage current is a primary design parameter, and a high-performance region may have support logic for the memory array formed therein, where switching speed is a more important consideration, for example.

For purposes of discussion, embodiments and methods of the present invention will be described in terms of forming a first transistor 30 in a first transistor region 31 and forming a second transistor 40 in a second transistor region 42. One skilled in the art will recognize, however, that each region will typically contain multiple transistors and other structures, and that typically, transistors in the different regions will not necessarily be adjacent one another. The "first transistor region" (as used herein) may be for high performance devices or low-leakage devices, for example. Likewise, the "second transistor region" (as used herein) may be for high performance devices or low-leakage devices, for example.

In FIG. 3, a first transistor 30 is isolated from a second transistor 40 by a shallow trench isolation (STI) region 46, for example. The STI region 46 may be formed from a trench about 2500 to about 5000 angstroms, for example. Such trench is filled with an insulator (e.g., silicon dioxide).

As an optional feature, a more heavily doped semiconductor region 50 may be formed to provide further isolation, as shown in FIG. 3, for example. As noted above, other isolation, such as field isolation, may be used in alternative.

In the first embodiment shown in FIG. 3, a first gate dielectric portion 51 is located between a first gate electrode 61 and the substrate 44 in the first transistor region 31, and a second gate dielectric portion 52 is located between a second gate electrode 62 and the substrate 44 in the second transistor region 42. The first gate dielectric portion 51 has a first high-permittivity dielectric material 71. Such high-permittivity dielectric materials are often referred to as high-k dielectric materials or high-k dielectrics, where k is the dielectric constant or the relative permittivity. The first gate dielectric portion 51 has a first equivalent silicon oxide thickness. The second gate dielectric portion 52 also includes the first high-k dielectric material 71. But, the second gate dielectric portion 52 has a second equivalent silicon oxide thickness that differs from the first equivalent silicon oxide thickness because in this embodiment the second dielectric portion also includes a normal-permittivity dielectric material 76.

As used herein, a "normal-permittivity dielectric material" is a dielectric material with a relative permittivity between about 3.9 and about 8. A normal-permittivity dielectric material (76) may be any suitable dielectric material with a relative permittivity between about 3.9 and about 8, including (but not limited to): silicon oxide, silicon oxynitride, silicon nitride, or combinations thereof, for example. A first high-permittivity dielectric material (71) (as well as a second high-permittivity dielectric material (72), discussed below) may be any suitable dielectric material with a relative permittivity greater than 7, including (but not limited to): metal oxides, metal nitrides, metal silicates, transition metal-oxides, transition metal-nitrides, transition metal-silicates, oxynitrides of metals, metal aluminates, zirconium silicate, zirconium aluminate, $HfO_2$, $ZrO_2$, $ZrO_xN_y$, $HfO_xN_y$, $Al_2O_3$, $TiO_2$, $Ta_2O_5$, $La_2O_3$, $CeO_2$, $Bi_4Si_2O_{12}$, $WO_3$, $Y_2O_3$, $LaAlO_3$, $Ba_{1-x}Sr_xTiO_3$, $PbTiO_3$, $BaTiO_3$, $SrTiO_3$, $PbZrO_3$, PST, PZN, PZT, PMN, or combinations thereof, for example. Also, a first high-permittivity dielectric material (71) (as well as a second high-permittivity dielectric material (72), discussed below) may be: $HfSi_xO_y$ with a relative permittivity equal to or greater than about 3.9; $HfSi_xO_yN_z$ with a relative permittivity equal to or greater than about 3.9; $HfAl_xO_y$ with a relative permittivity equal to or greater than about 9; oxides of haftiium, zirconium, cerium, aluminum, titanium, yttrium, and transition metals, with a relative permittivity equal to or greater than about 3.9; silicates of hafnium, zirconium, cerium, aluminum, titanium, yttrium, and transition metals, with a relative permittivity equal to or greater than about 3.9; barium strontium titanate with a relative permittivity equal to or greater than about 3.9; ferroelectrics with a relative permittivity equal to or greater than about 3.9; nitrided, multilayer, or mixed of hafnium, zirconium, cerium, aluminum, titanium, yttrium, and transition metals, whether an oxide or not, whether a silicate or not, and with a relative permittivity equal to or greater than about 3.9, or combinations thereof, for example. Hence, the terms first high-permittivity dielectric material and second high-permittivity dielectric material may be interchangeable. The first high-permittivity dielectric material may be hafnium oxide and the second high-permittivity dielectric material, if any, may be zirconium oxide, for example. Typically, the first high-permittivity dielectric material will differ (i.e., in material and/or dielectric constant) from the second high-permittivity dielectric material—hence the different labels used herein. Either or both of the high-permittivity dielectric materials used in an embodiment may be formed in a variety of ways. For example, a high-permittivity dielectric material may be deposited by chemical vapor deposition (CVD) process. As an example, hafnium oxide ($HfO_2$) may be grown by CVD using precursor gases, such as hafnium t-butoxide (Hf $(OC_4H_9)_4$ and oxygen ($O_2$)). The growth temperature may be between 350 to 500 degrees Celsius, and the pressure may be about $1 \times 10^{-5}$ torr, for example. Also, a post-deposition anneal in nitrogen ($N_2$) ambient at temperatures of up to 950 degrees Celsius and time of up to 30 seconds may be performed to improve the gate dielectric quality, for example. Other methods of deposition may be used also, such as sputtering, reactive sputtering, atomic layer deposition (ALD), metalorganic chemical vapor deposition (MOCVD), molecular beam epitaxy (MBE), etc., for example. A high-permittivity dielectric material (first and/or second) may be formed to a thickness between 2 and 500 angstroms, for example.

FIGS. 4A-4D illustrate a method of fabricating part of an integrated circuit 20 incorporating the first embodiment of the present invention. In FIGS. 4A-4D, a dashed line 80 is shown as a separator between a first transistor region 31 and a second transistor region 42, and a simplified isolation structure 46 is shown between these regions. Other isolation regions that may be present are not shown for purposes of simplifying the illustrations. Other steps before and after those shown in FIGS. 4A-4D are not shown for purposes of simplification and focusing on the present invention, and because such other steps may vary, as will be apparent to one of ordinary skill in the art. The same is true for the steps selected to be shown while describing other illustrative embodiments of the present invention below. Also, although not show in the figures herein while describing this and other illustrative embodiments below, there is sometimes a thin native oxide and/or an interfacial layer included between the substrate and one or both of the gate dielectric portions 51, 52 (or as part of one or both of the gate dielectric portions 51, 52). A thin native oxide layer may have a thickness of several angstroms, and usually less than 5 angstroms, for example. As is known to those of ordinary skill in the art, such native oxide and/or interfacial layer(s) are sometimes desired or needed to provide better adhesion between layers, for example. Examples of interfacial layer material may include (but are not necessarily limited to): $SiO_2$, SiON, metallic silicates (e.g., zirconium silicate), and metallic aluminates (e.g., zirconium aluminate), for example.

Figure 4B:
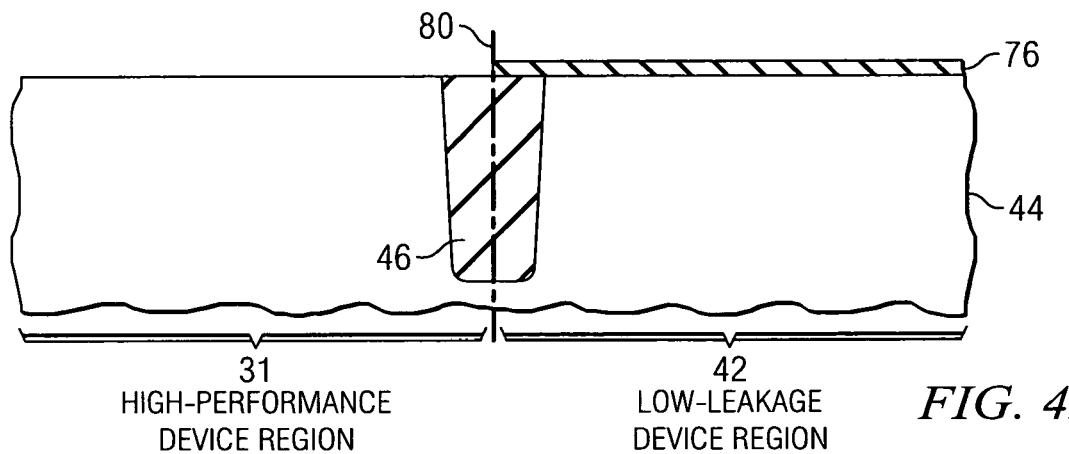

Referring to FIG. 4A, a normal-permittivity dielectric material 76 is formed on the substrate 44 in the first and second transistor regions 31, 42. For example, if the normal-permittivity dielectric material 76 is silicon oxide ($SiO_2$) formed on the substrate 44, it may be grown in an oxidizing ambient at elevated temperature. Such oxidizing ambient may include species such as $H_2O$, $O_2$, $O_3$, or $N_2O$, for example. As another example, an in-situ steam growth (ISSG) at 850 degrees C. and at a pressure of 6 torr may be used to form $SiO_2$. As yet another example of an oxidization step of forming $SiO_2$ is furnace oxide growth in an $O_2$ ambient at atmospheric pressure for a time between 1 to 30 minutes and a temperature ranging from 600-800 degrees Celsius. A silicon oxide may be formed to a thickness between 2 and 30 angstroms, for example. As shown in FIG. 4B, the normal-permittivity dielectric material 76 is then removed from the first transistor region 31. A lithography step (not shown) may be performed to mask the second transistor region 42 using photolithographic techniques, for example. The normal-permittivity dielectric material 76 may be removed from the first transistor region 31 by etching (e.g., wet etching, reactive-ion etching, and/or dry etching).

Figure 4C:
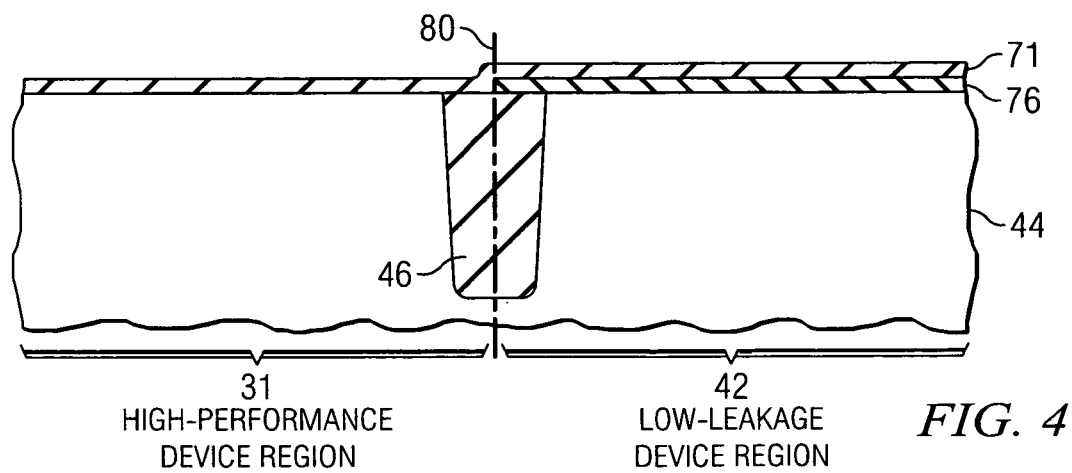
Figure 4D:
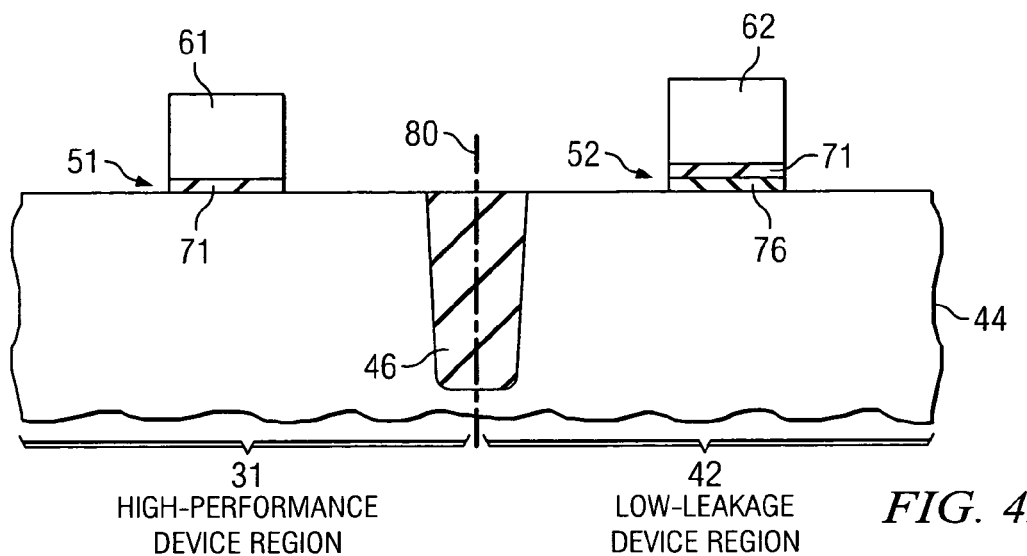

Next, a first high-permittivity dielectric material 71 is formed on the substrate 44 and over the remaining portion of the normal-permittivity dielectric material 76 in the second transistor region 42, as shown in FIG. 4C. A gate electrode material is then deposited over the structure of FIG. 4C. In FIG. 4D, the first and second gate electrodes 61, 62 and the first and second gate dielectric portions 51, 52 are formed. Thus, in the first embodiment (see FIGS. 3 and 4D), the first gate dielectric portion 51 includes the first high-permittivity dielectric material 71, and the second gate dielectric portion 52 includes the first high-permittivity dielectric material 71 and the normal-permittivity dielectric material 76.

Figure 5A:
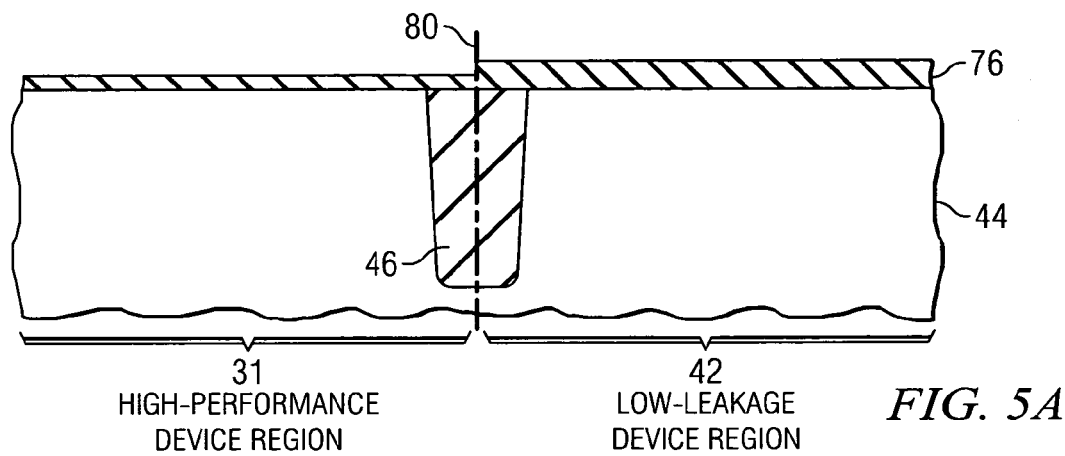
FIGS. 5A-5C show some example steps for fabricating a second embodiment of the present invention.
Figure 5B:
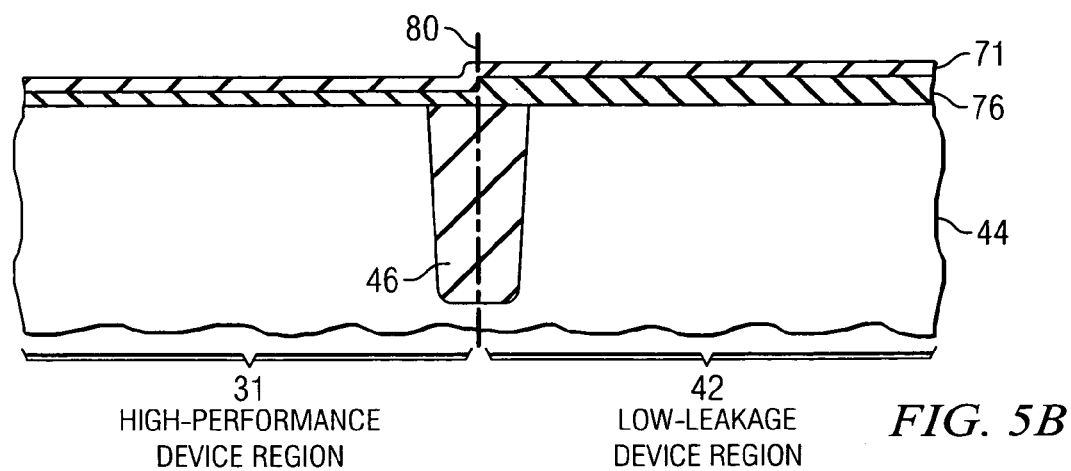
Figure 5C:
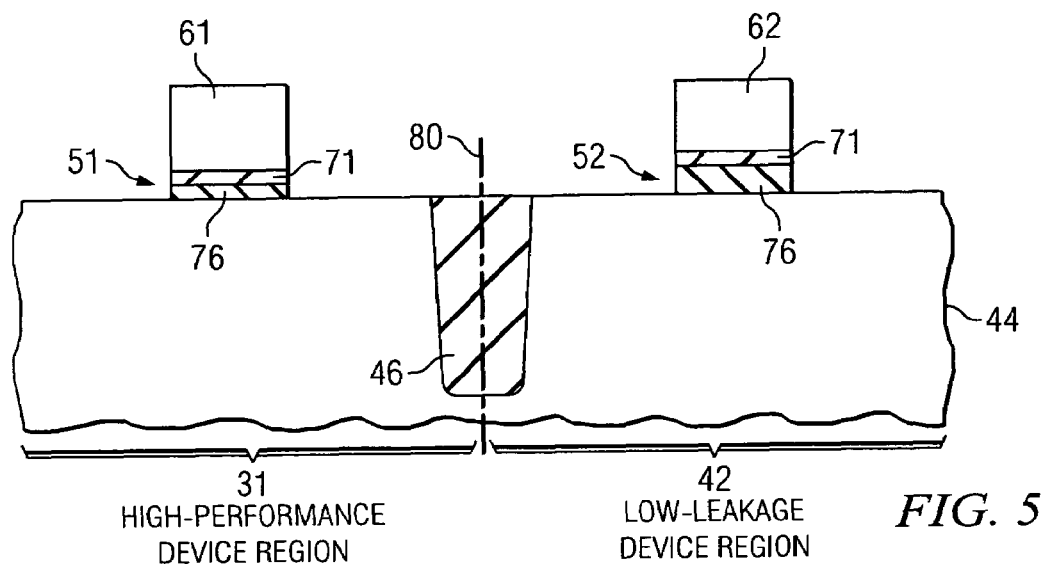

FIGS. 5A-5C show some example steps for fabricating a second embodiment of the present invention. The second embodiment is a variation on the first embodiment. The second embodiment begins with the structure shown in FIG. 4A. In the second embodiment, only part of the normal-permittivity dielectric material 76 is removed from the first transistor region 31 to leave a thinner remainder of the normal-permittivity dielectric material 76 in the first transistor region 31 than that of the second transistor region 42 (see FIG. 5A). Then, the process to form the structures in FIGS. 5B and 5C may be essentially the same those for FIGS. 4C and 4D, respectively. By adjusting the thickness of the normal-permittivity dielectric material 76 when it is initially formed (i.e., the thickness of the normal-permittivity dielectric material 76 in the second transistor region 42) and the resulting thickness of the normal-permittivity dielectric material 76 in the first transistor region 31 (as well as adjusting the thickness of the first high-permittivity dielectric material 71 formed), the equivalent silicon oxide thickness of the first and second gate dielectric portions 51, 52 may be adjusted. Thus, the first gate dielectric portion 51 of the second embodiment (see FIG. 5C) includes the first high-permittivity dielectric material 71 and the relatively thinner portion of the normal-permittivity dielectric material 76, whereas the second gate dielectric portion 52 includes the first high-permittivity dielectric material 71 and the relatively thicker portion of the normal-permittivity dielectric material 76.

Figure 6A:
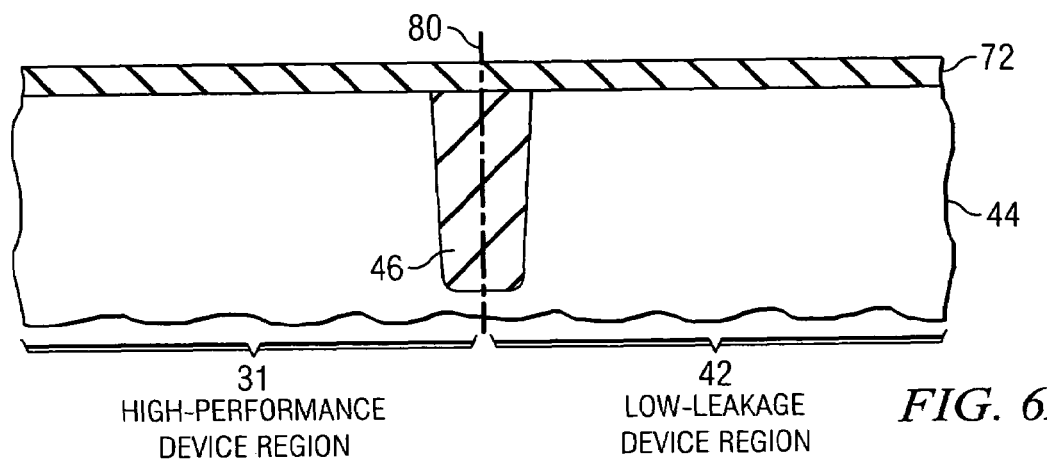
FIGS. 6A-6D show some example steps for fabricating a third embodiment of the present invention.
Figure 6B:
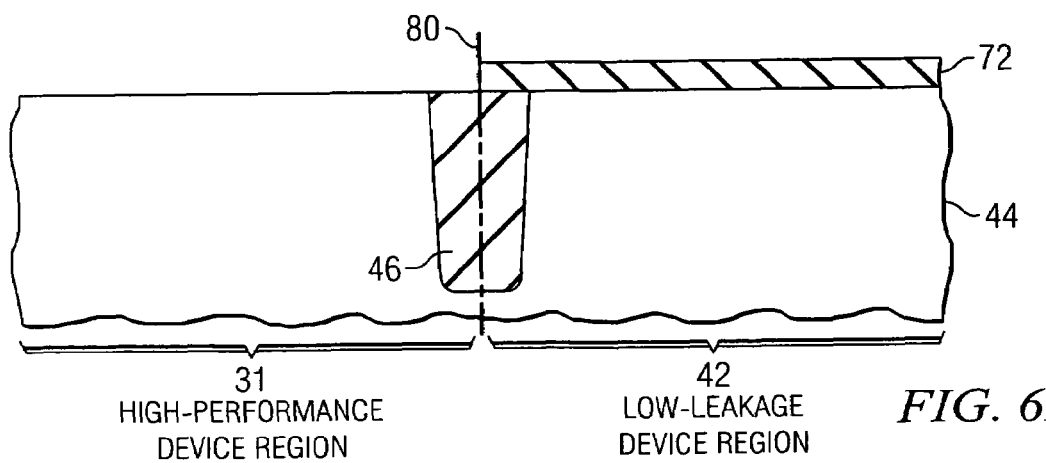
Figure 6C:
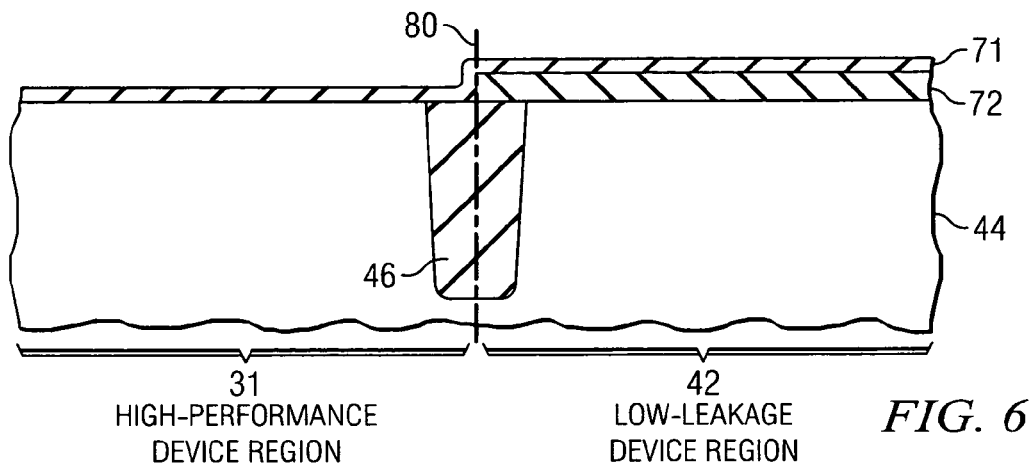
Figure 6D:
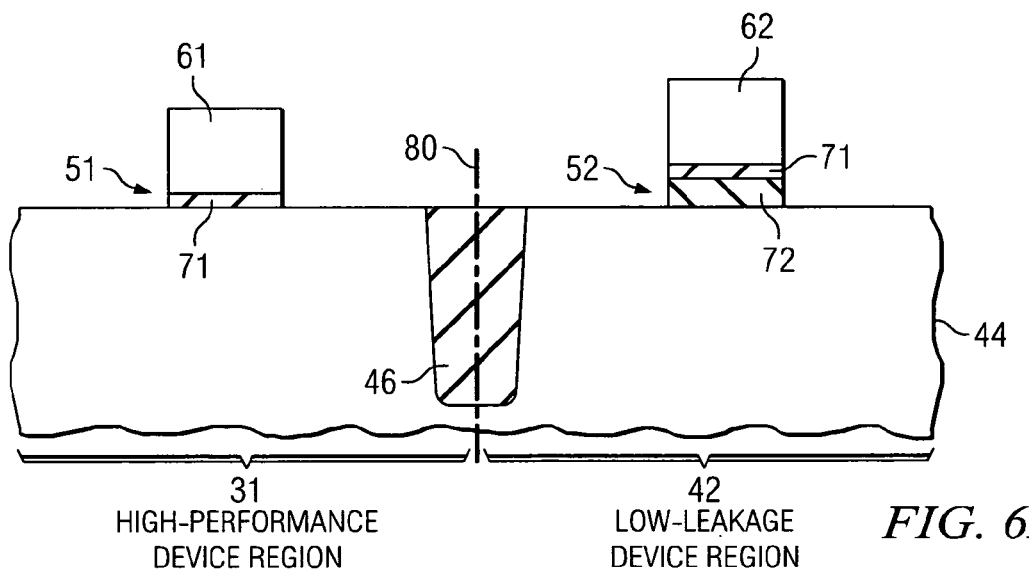

FIGS. 6A-7C illustrate methods of fabricating third and fourth embodiments of the present invention. The third and fourth embodiments are similar to the first and second embodiments, except that a second high-permittivity dielectric material 72 is provided instead of the normal-permittivity dielectric material 76. In FIG. 6A, a second high-permittivity dielectric material 72 is formed on the substrate 44. In FIG. 6B, the second high-permittivity dielectric material 72 is removed from the first transistor region 31. If the second high-permittivity dielectric material 72 is $HfO_2$ or $ZrO_2$, for example, the etching of the $HfO_2$ (or $ZrO_2$) may be accomplished by wet etching using sulfuric acid ($H_2SO_4$), for example. In FIG. 6C, the first high-permittivity dielectric material 71 is formed over the structure of FIG. 6B. Then, the first and second gate electrodes 61, 62, as well as the first and second gate dielectric portions 51, 52 are formed, as shown in FIG. 6D. Therefore, in the third embodiment shown in FIG. 6D, the first gate dielectric portion 51 includes the first high-permittivity dielectric material 71 and the second gate dielectric portion 52 includes the first high-permittivity dielectric material 71 and the second high-permittivity dielectric material 72.

Figure 7A:
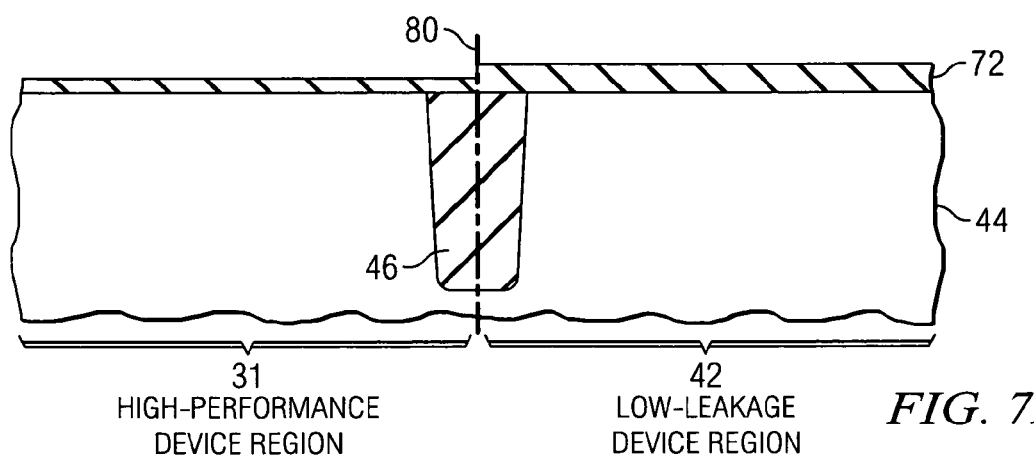
FIGS. 7A-7C show some example steps for fabricating a fourth embodiment of the present invention.
Figure 7B:
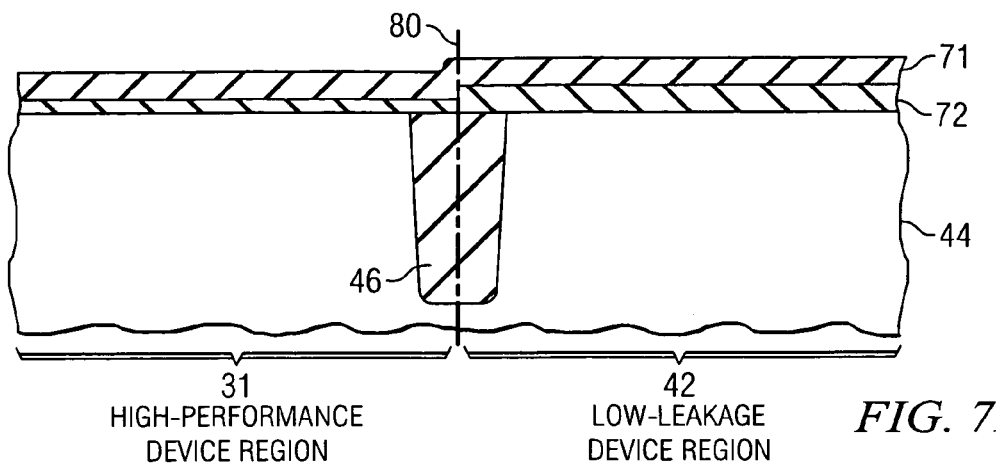
Figure 7C:
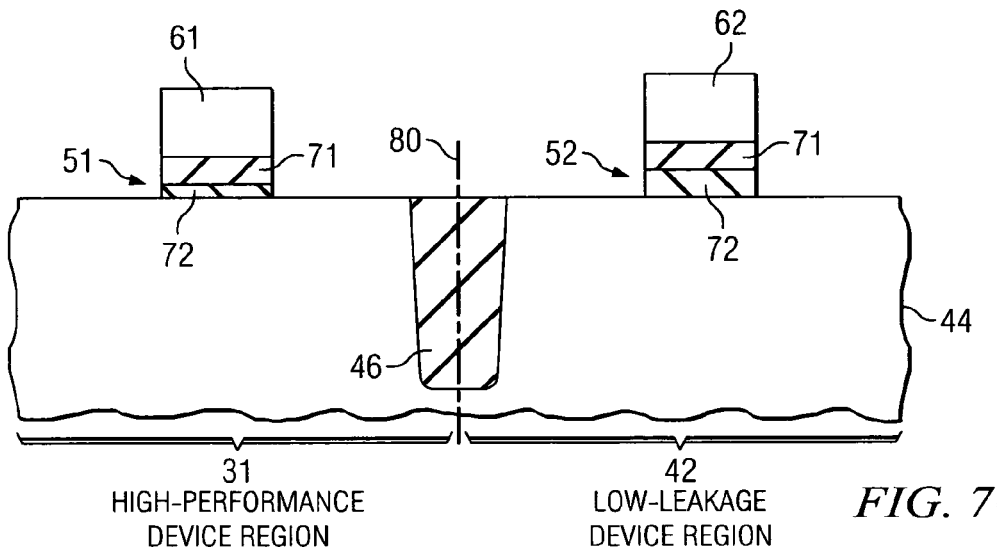
Figure 8A:
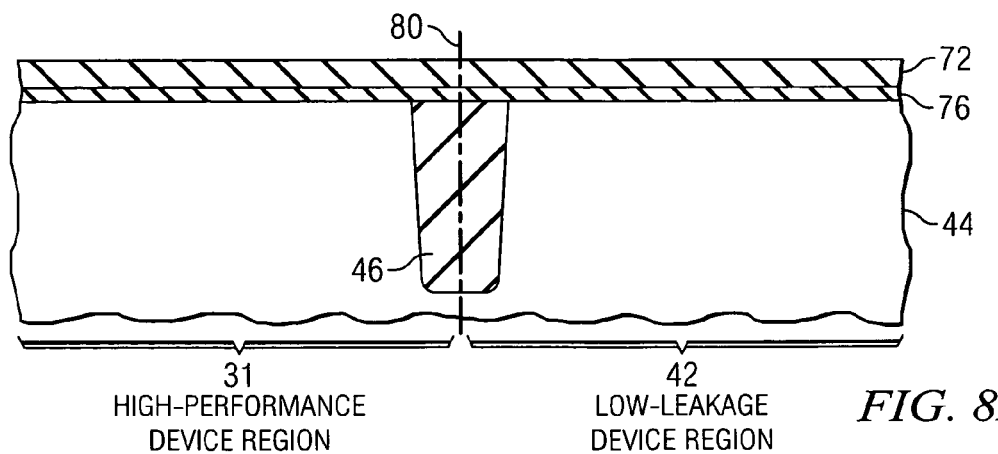
FIGS. 8A-8D show some example steps for fabricating a fifth embodiment of the present invention.
Figure 8B:
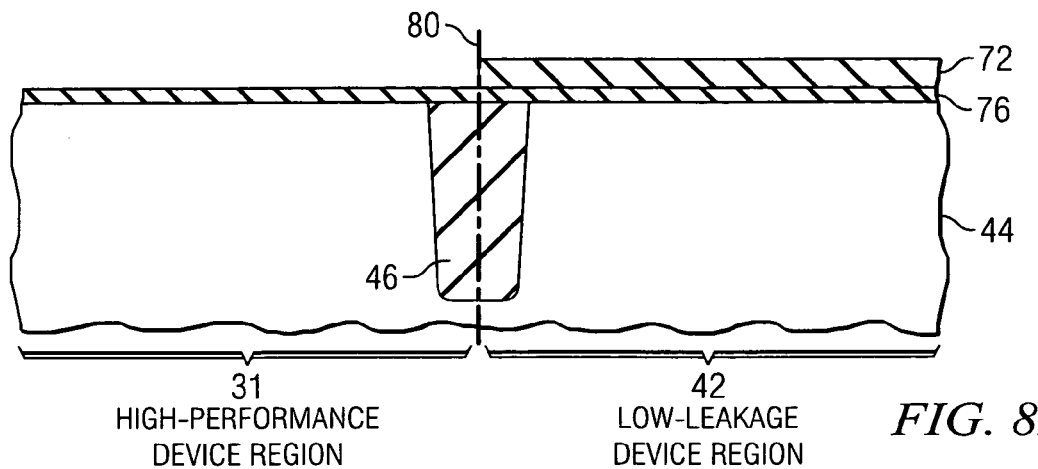
Figure 8C:
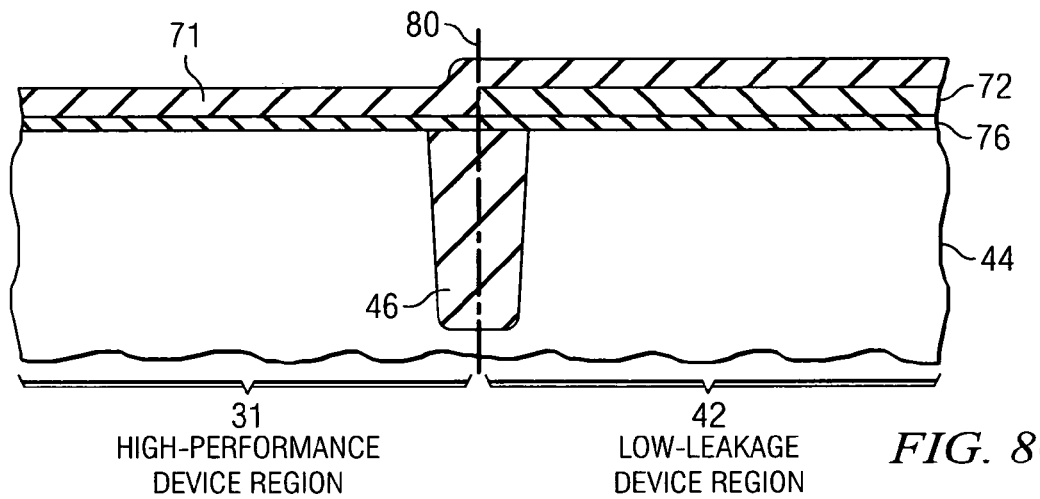
Figure 8D:
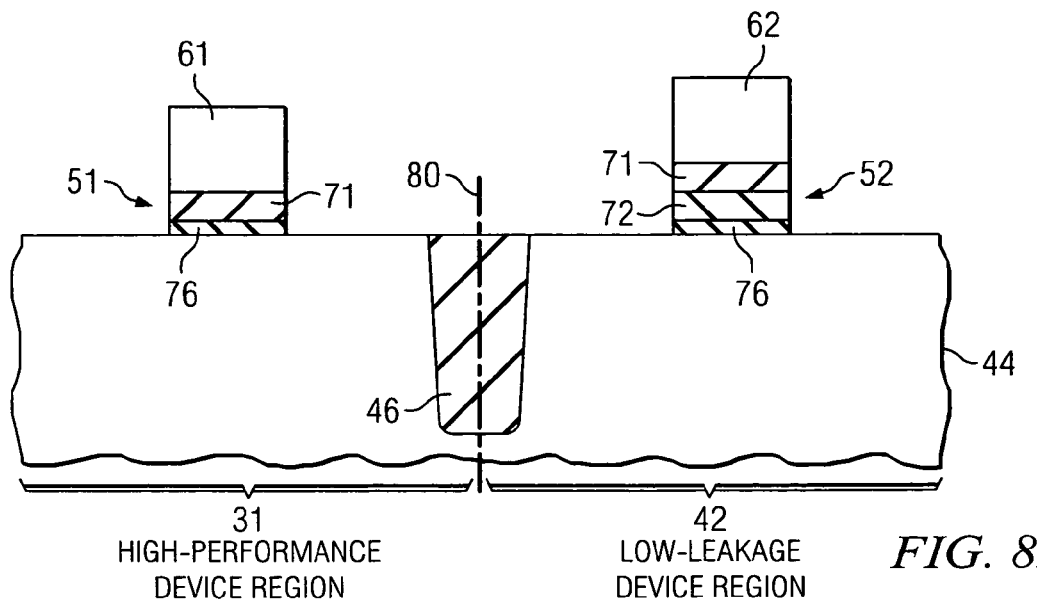

A method of fabricating the fourth embodiment is shown in FIGS. 6A, and 7A-7C. As shown in FIG. 7A, only part of the second high-permittivity dielectric material 72 is removed from the first transistor region 31 in the fourth embodiment. This results in the structure shown in FIG. 7C. Hence, the equivalent silicon oxide thickness of the first gate dielectric portion is different from the equivalent silicon oxide thickness of the second gate dielectric portion. Thus, the first gate dielectric portion 51 of the fourth embodiment (see FIG. 7C) includes the first high-permittivity dielectric material 71 and the relatively thinner portion of the second high-permittivity dielectric material 72, whereas the second gate dielectric portion 52 includes the first high-permittivity dielectric material 71 and the relatively thicker portion of the normal-permittivity dielectric material 76.

FIGS. 8A-8D illustrate some example steps for fabricating a fifth embodiment of the present invention. The fifth embodiment is a variation on the third embodiment (see FIGS. 6A-6D) by adding a normal-permittivity dielectric material 76 prior to forming the first and second high-permittivity dielectric materials 71, 72. Although not shown, the fifth embodiment may also be a variation on the fourth embodiment (see FIGS. 6A and 7A-7C) by varying the amount of the second high-permittivity dielectric material 72 removed (e.g., at FIG. 8B) so that a relatively thinner portion of the second high-permittivity dielectric material 72 remains in the first transistor region 31.

Figure 9A:
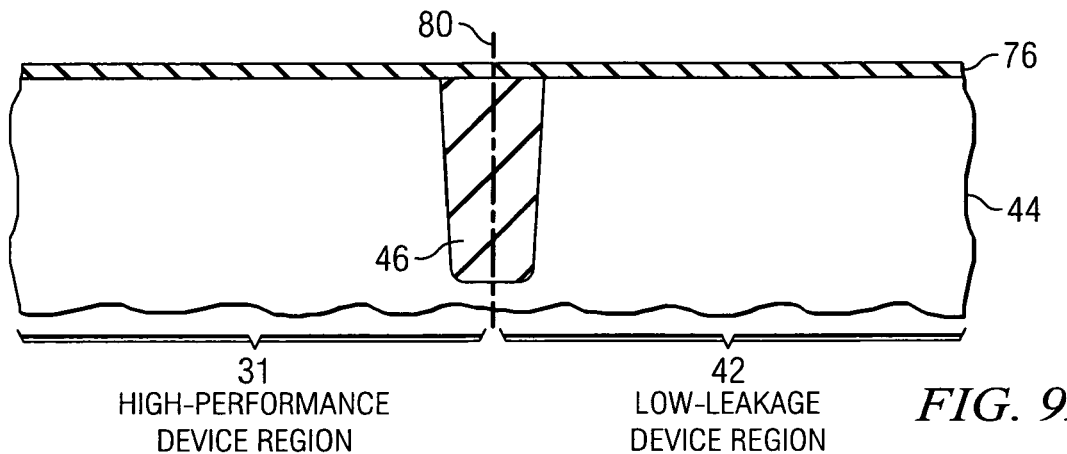
FIGS. 9A-9F show some example steps for fabricating a sixth embodiment of the present invention.
Figure 9B:
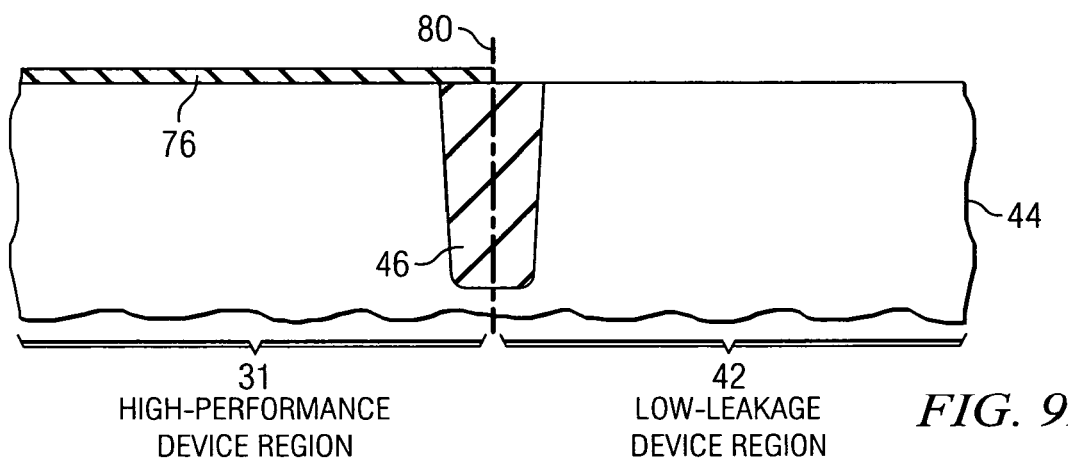
Figure 9C:
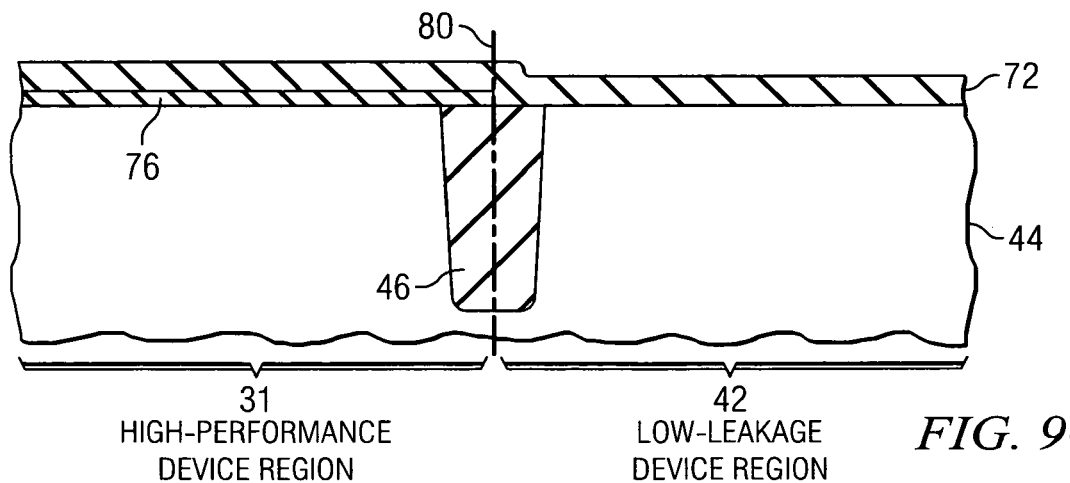
Figure 9D:
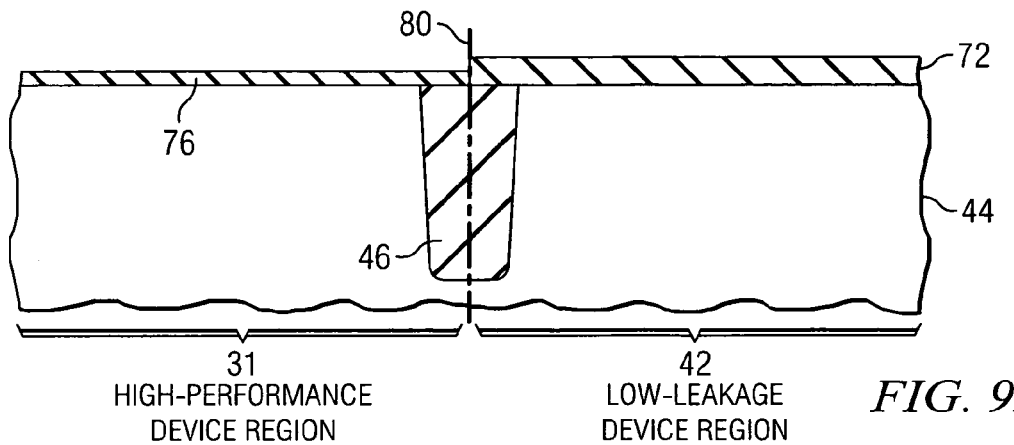
Figure 9E:
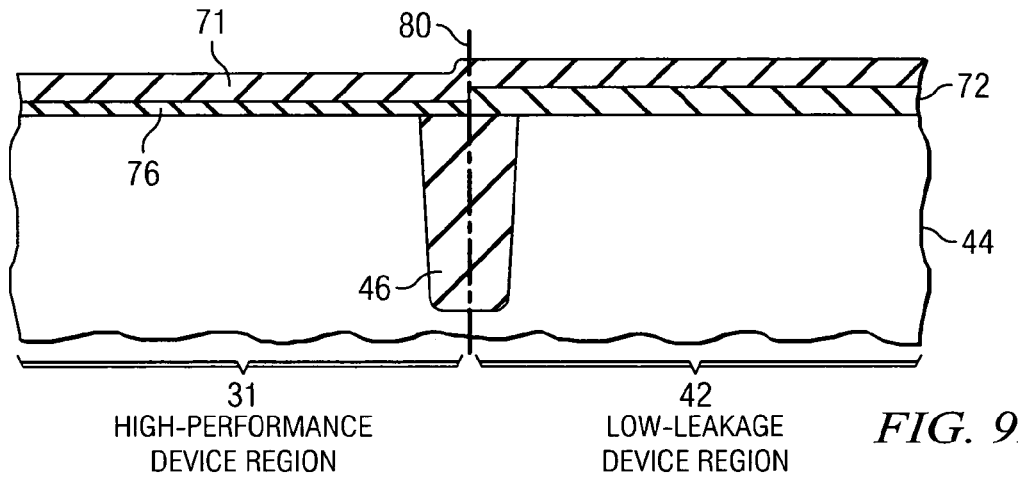
Figure 9F:
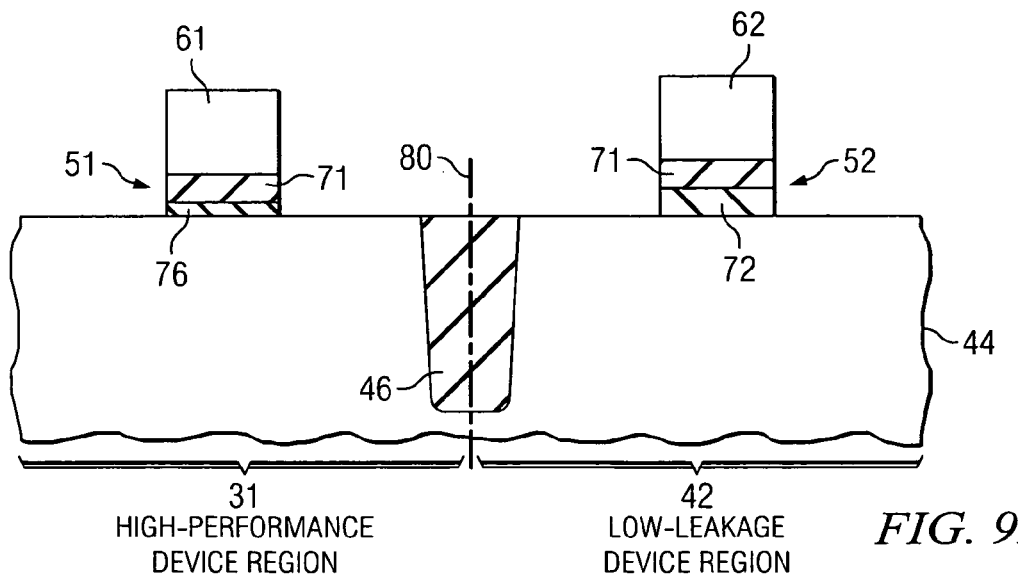

FIGS. 9A-9F illustrate some example steps for fabricating a sixth embodiment of the present invention. In FIG. 9A, a normal-permittivity dielectric material 76 is formed over the substrate 44. All or part of the normal-permittivity dielectric material 76 is then removed from the second transistor region 42. All of the normal-permittivity dielectric material 76 is shown removed in FIG. 9B, for example. As shown in FIG. 9C, a second high-permittivity dielectric material 72 is formed over the structure shown in FIG. 9B. All or part of the second high-permittivity dielectric material 72 is then removed from the first transistor region 31. All of the second high-permittivity dielectric material 72 is shown removed in FIG. 9D, for example. Then as shown in FIG. 9E, a first high-permittivity dielectric material 71 is formed over the structure shown in FIG. 9D. FIG. 9F shows the first and second gate electrodes 61, 62 along with the first and second gate dielectric portions 51, 52 in the first and second transistor regions 31, 42, respectively. Thus, in the variation of the sixth embodiment shown in FIG. 9F, the first gate dielectric portion 51 includes the first high-permittivity dielectric material 71 and the normal-permittivity dielectric material 76, while the second gate dielectric portion 52 includes the first and second high-permittivity dielectric materials 71, 72. As another variation (not shown) of a method for arriving at the same structure of the sixth embodiment shown in FIG. 9F (or a variation thereof), the second high-permittivity dielectric material 72 may be formed in the first and second transistor regions 31, 42, and then at least partially removed from the first transistor region 31 prior to the formation of the normal-permittivity dielectric material 76.

Figure 10A:
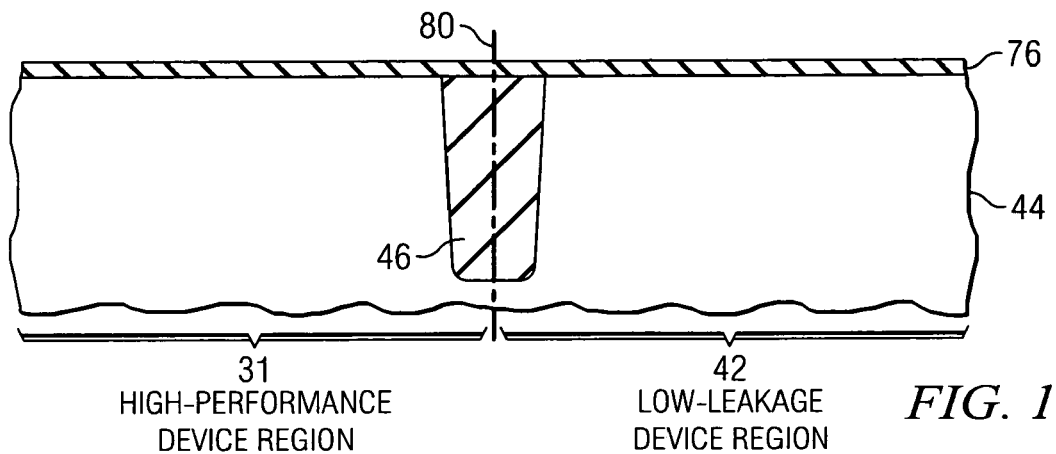
FIGS. 10A-10F show some example steps for fabricating a seventh embodiment of the present invention.
Figure 10B:
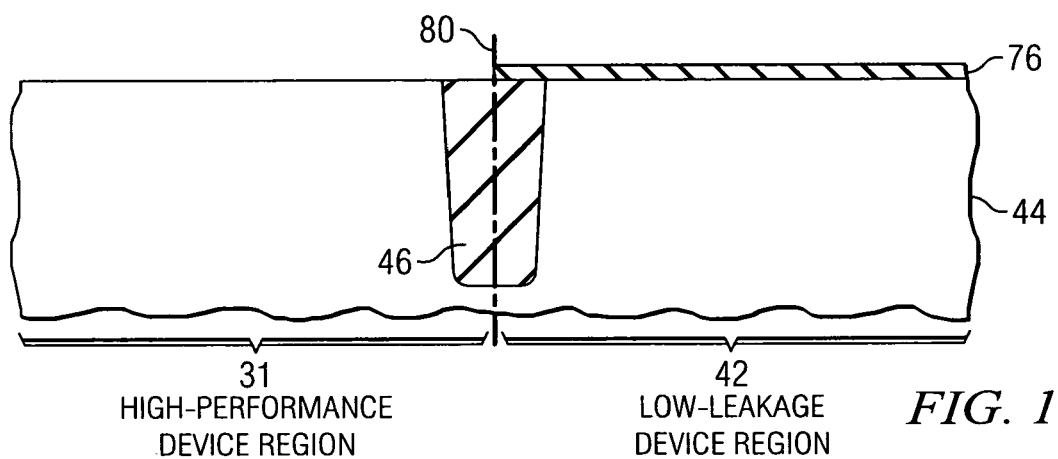
Figure 10C:
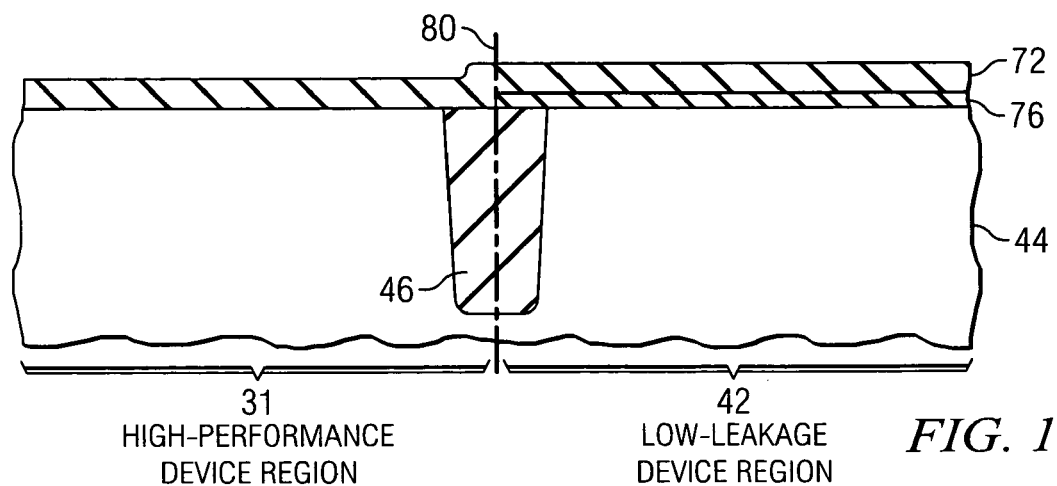
Figure 10D:
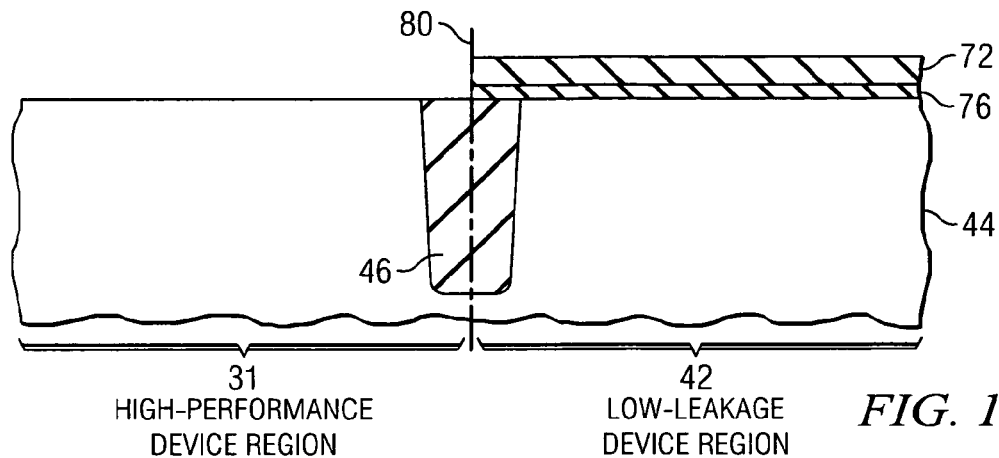
Figure 10E:
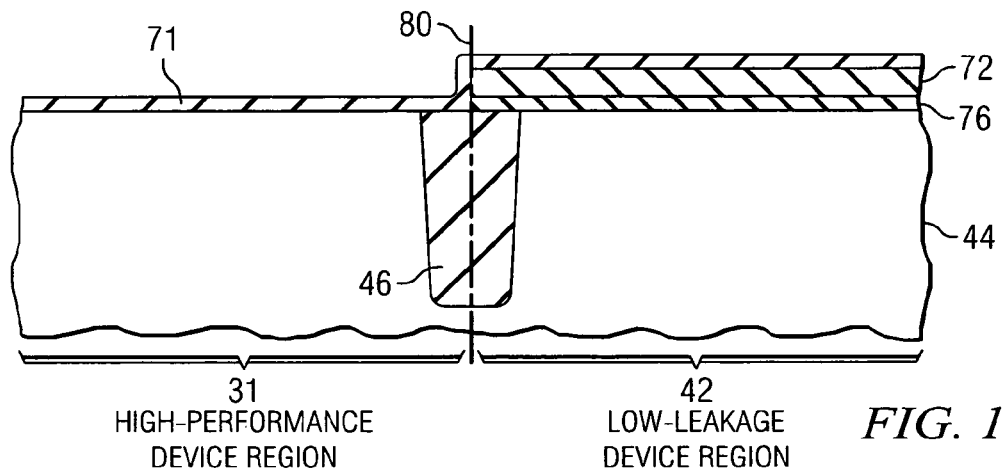
Figure 10F:
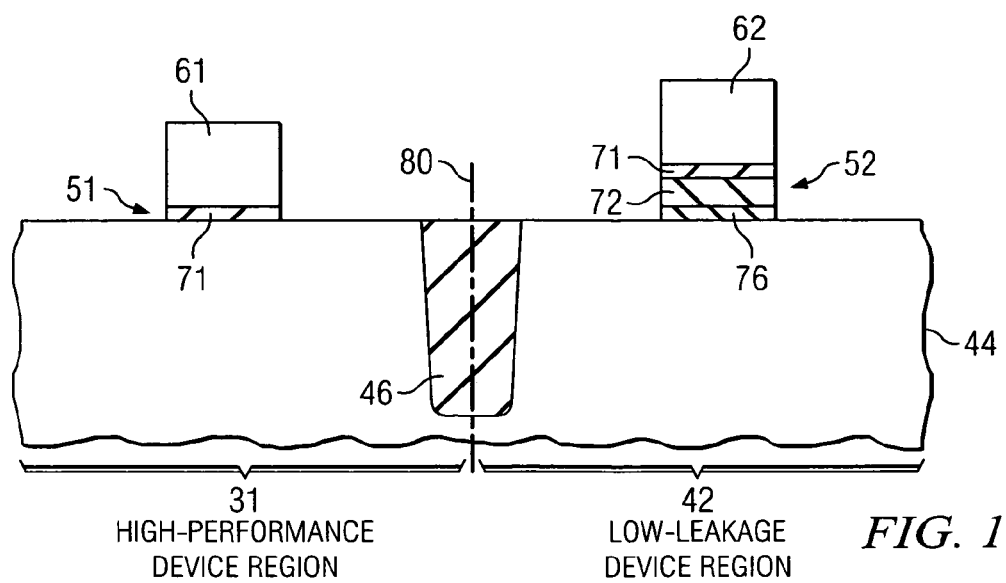

FIGS. 10A-10F show some example steps for fabricating a seventh embodiment of the present invention. In FIG. 10A, a normal-permittivity dielectric material 76 is formed over the substrate 44. Next, all or part of the normal-permittivity dielectric material 76 is removed from the first transistor region 31. All of the normal-permittivity dielectric material 76 is shown removed from the first transistor region 31 in FIG. 10B, for example. A second high-permittivity dielectric material 72 is formed over the structure of FIG. 10B. Then, all or part of the second high-permittivity dielectric material 72 is removed from the first transistor region 31. In FIG. 10D, all of the second high-permittivity dielectric material 72 is shown removed from the first transistor region 31, for example. A first high-permittivity dielectric material 71 is then formed over the structure of FIG. 10D, as shown in FIG. 10E for example. FIG. 10F shows the first and second gate electrodes 61, 62 along with the first and second gate dielectric portions 51, 52 in the first and second transistor regions 31, 42, respectively. Hence, in the variation of the seventh embodiment shown in FIG. 10F, the first gate dielectric portion 51 includes the first high-permittivity dielectric material 71, while the second gate dielectric portion 52 includes the first and second high-permittivity dielectric materials 71, 72 and the normal-permittivity dielectric material 76.

Figure 11A:
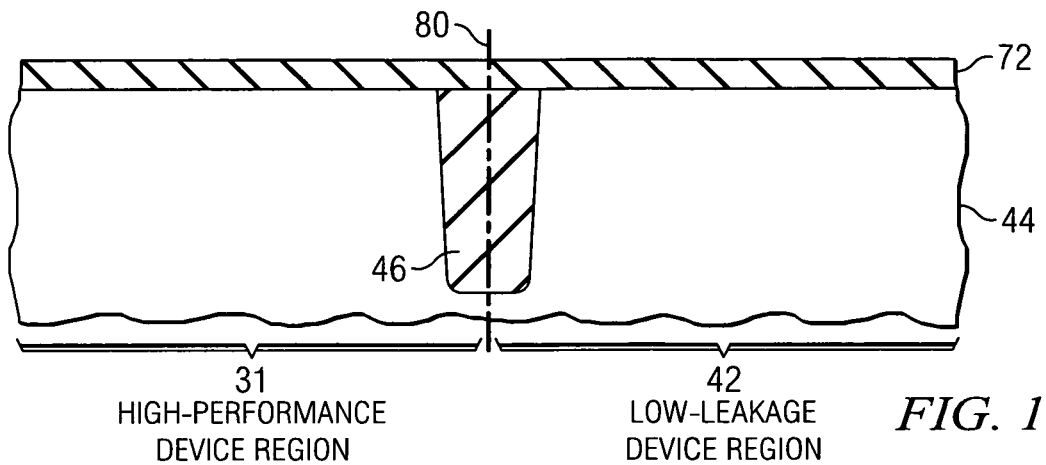
FIGS. 11A-11E show some example steps for fabricating an eighth embodiment of the present invention.
Figure 11B:
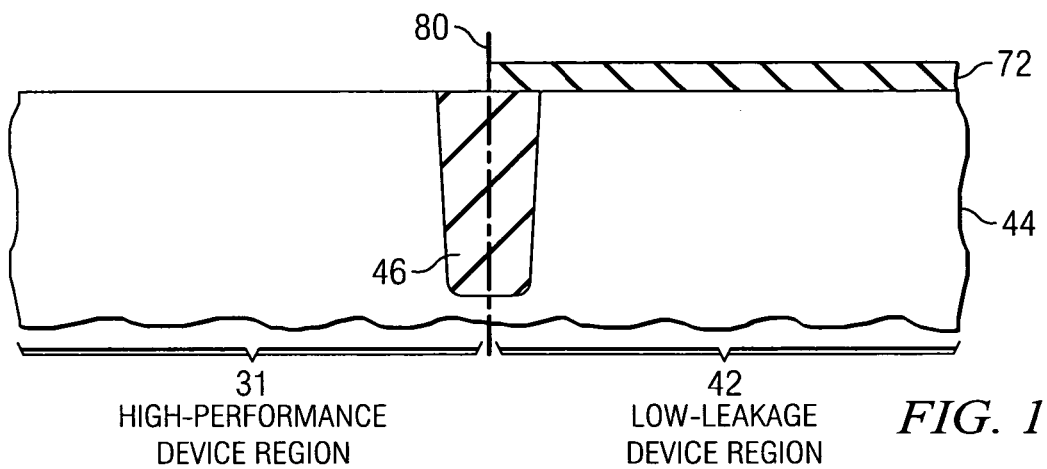
Figure 11C:
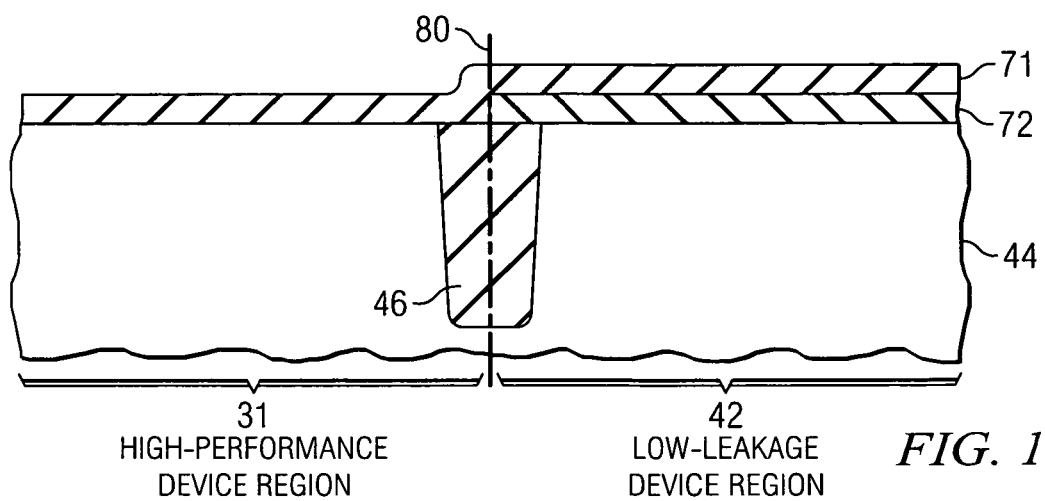
Figure 11D:
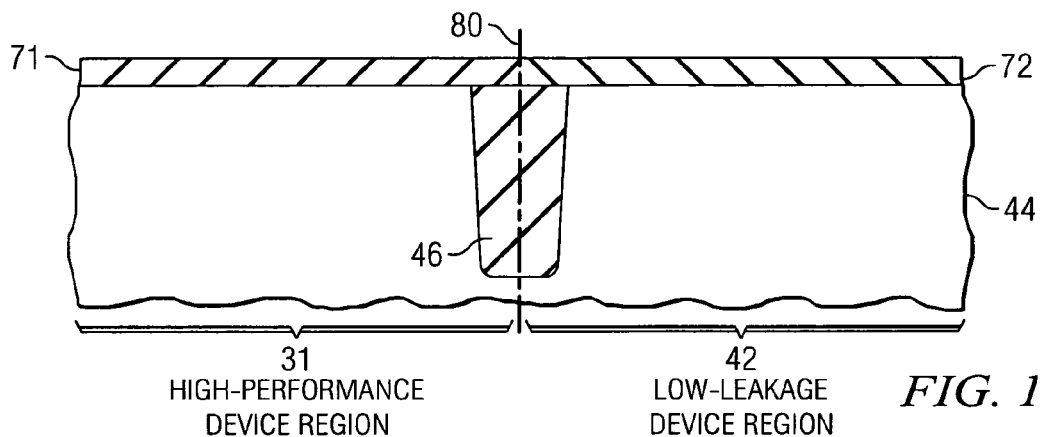
Figure 11E:
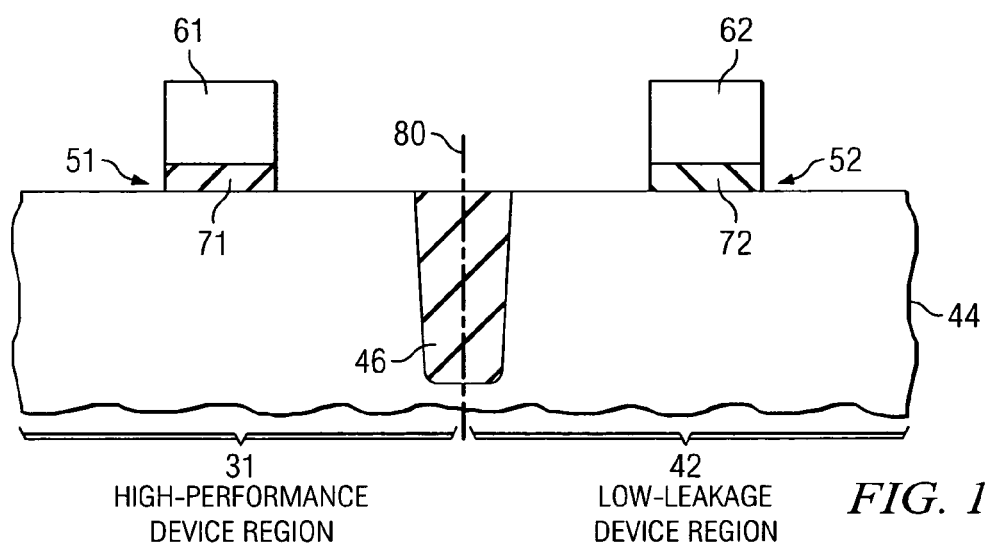

FIGS. 11A-11E show some example steps for fabricating an eighth embodiment of the present invention. In FIG. 11A, a second high-permittivity dielectric material 72 is formed over the substrate 44. Then, all or part of the second high-permittivity dielectric material 72 is removed from the first transistor region 31. In FIG. 11B, all of the second high-permittivity dielectric material 72 is shown removed from the first transistor region 31, for example. A first high-permittivity dielectric material 71 is then formed over the structure of FIG. 11B, as shown in FIG. 11C, for example. Then, all or part of the first high-permittivity dielectric material 71 is removed from the second transistor region 42. In FIG. 11D, all of the first high-permittivity dielectric material 71 is shown removed from the first transistor region 31, for example. FIG. 11E shows the first and second gate electrodes 61, 62 along with the first and second gate dielectric portions 51, 52 in the first and second transistor regions 31, 42, respectively. Hence, in the variation of the eighth embodiment shown in FIG. 11E, the first gate dielectric portion 51 includes the first high-permittivity dielectric material 71, while the second gate dielectric portion 52 includes the second high-permittivity dielectric material 72.

Figure 12:
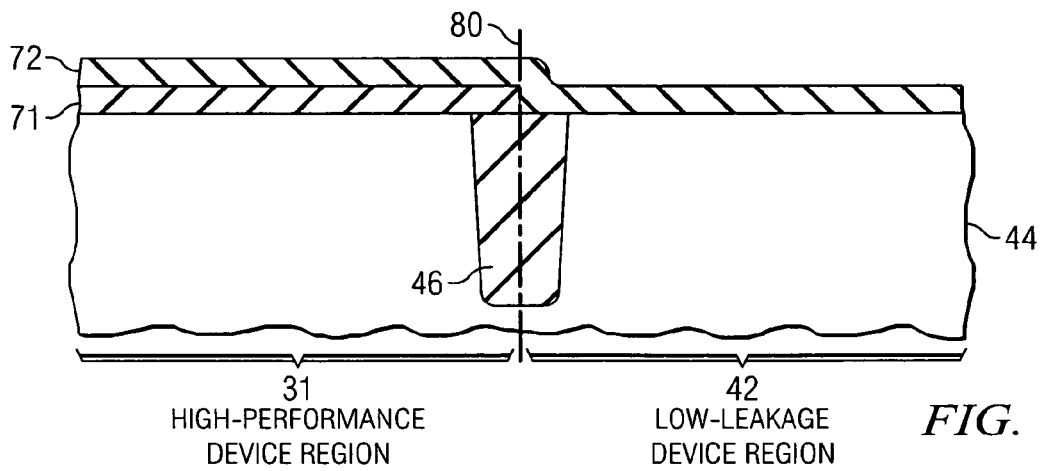
FIG. 12 shows a step in another method of arriving at a structure of the eighth embodiment.

FIG. 12 shows a step in another method of arriving at the structure of the eighth embodiment shown in FIG. 11E. In FIG. 12, the first high-permittivity dielectric material 71 has been formed over the substrate 44 (in the first and second transistor regions 31, 42) and the first high-permittivity dielectric material 71 has been at least partially removed from the second transistor region 42, prior to forming the second high-permittivity dielectric material 72.

Figure 13A:
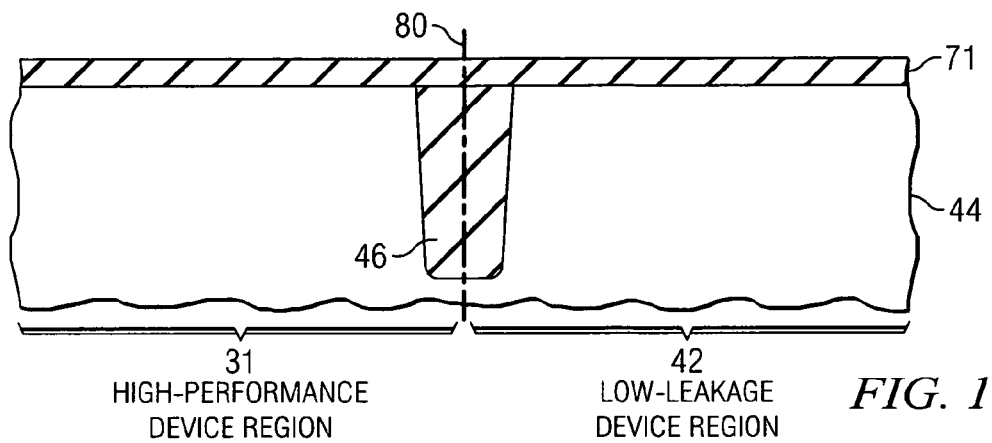
FIGS. 13A and 13B illustrate yet another method of arriving at a structure of the eighth embodiment.
Figure 13B:
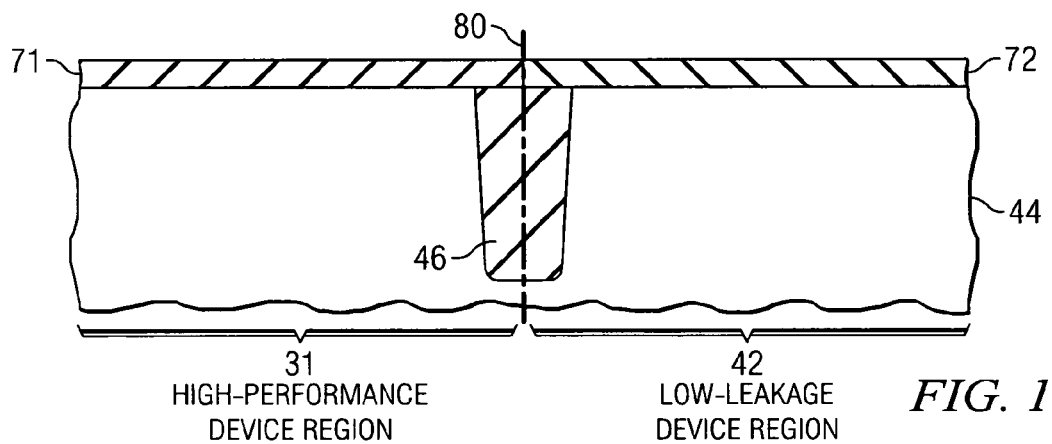
Figure 14A:
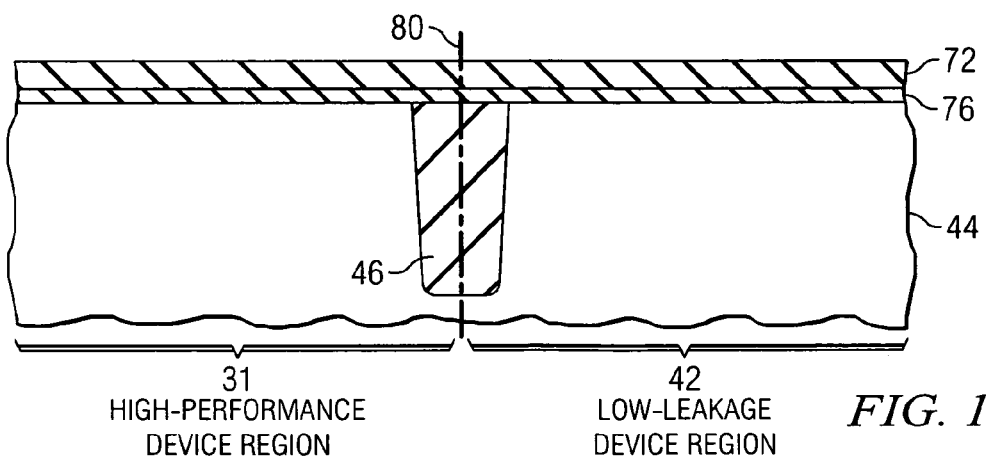
FIGS. 14A-14E show some example steps for fabricating a ninth embodiment of the present invention.
Figure 14B:
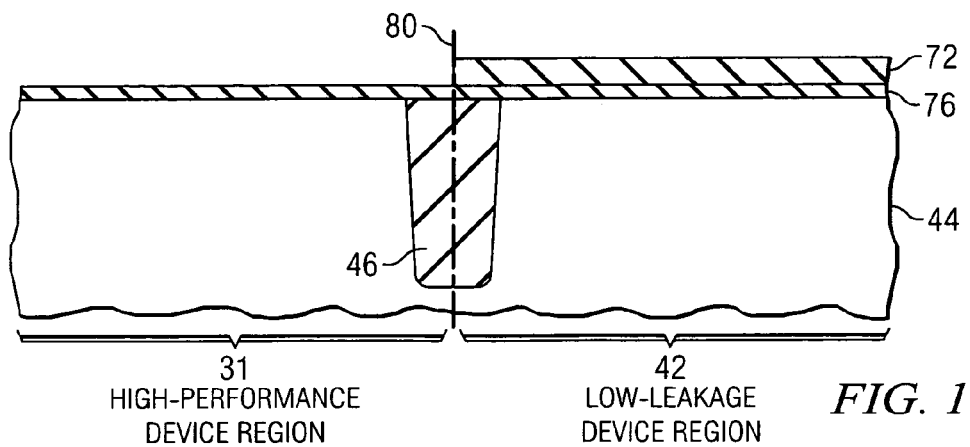
Figure 14C:
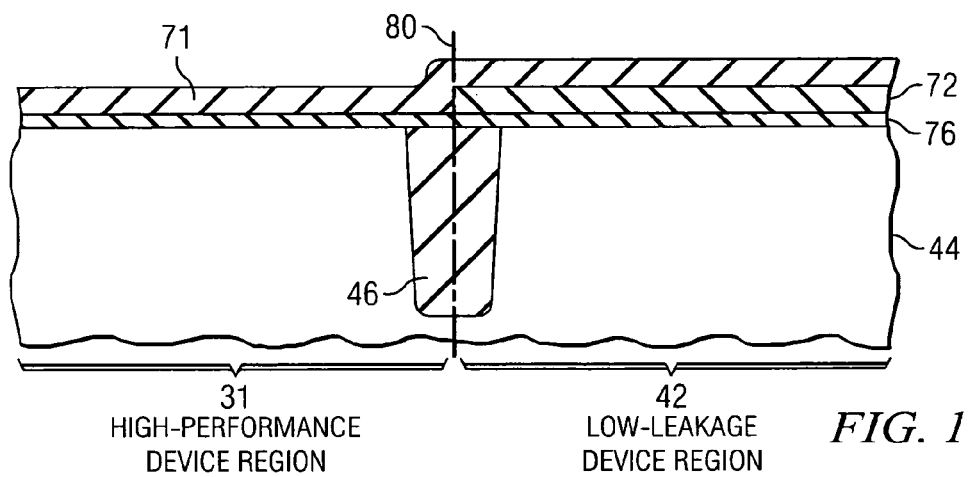
Figure 14D:
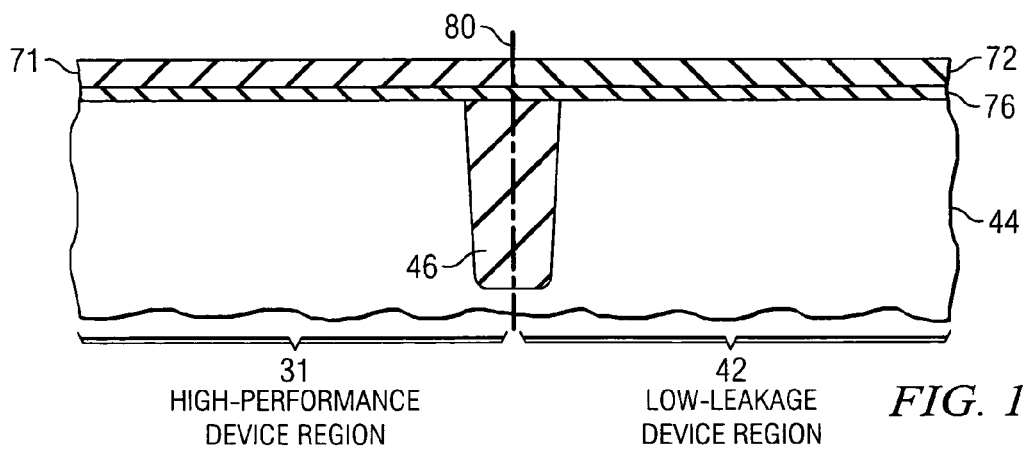
Figure 14E:
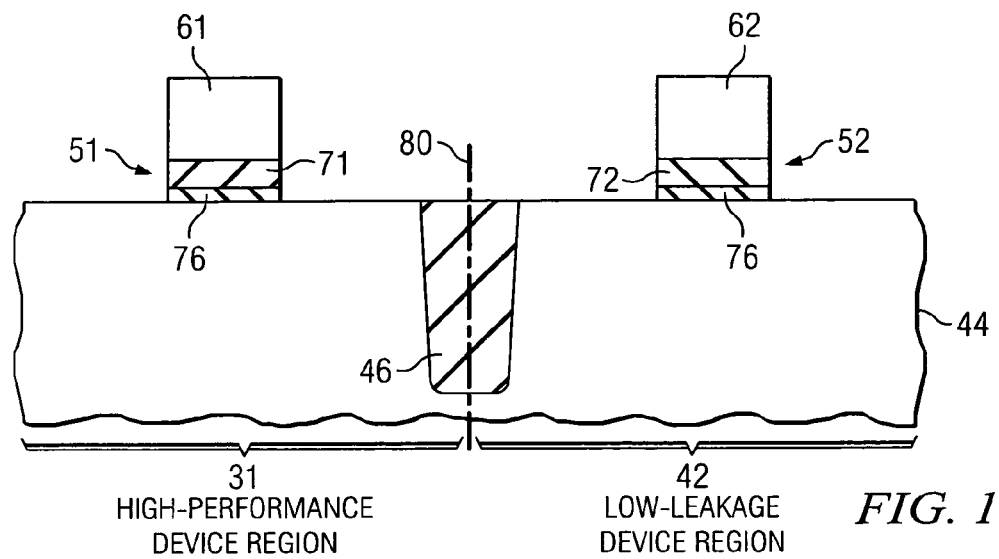

FIGS. 13A and 13B illustrate yet another method of arriving at the structure of the eighth embodiment shown in FIG. 11E. In FIG. 13A, the first high-permittivity dielectric material 71 is formed over the substrate 44. Then, the first high-permittivity dielectric material 71 in the second transistor region 42 is converted to a second high-permittivity dielectric material 72, as shown in FIG. 13B. For example, if the first high-permittivity dielectric material 71 is a metal oxide, then a nitridation process may be used to convert part of it to a metal oxynitride—to be the second high-permittivity dielectric material 72. As still another alternative method (not shown) for obtaining the structure of the eight embodiment, the second high-permittivity dielectric material 72 may be formed over the substrate 44, and then the second high-permittivity dielectric material 72 in the first transistor region 31 is converted to the first high-permittivity dielectric material 71.

FIGS. 14A-14E show some example steps for fabricating a ninth embodiment of the present invention. The ninth embodiment is a variation on the eighth embodiment (see FIG. 11E), wherein a normal-permittivity dielectric material 76 is formed prior to forming the first and second high-permittivity dielectric materials 71, 72. Thus, the steps of forming the ninth embodiment may be the same as that of forming the eighth embodiment, but with the addition of the normal-permittivity dielectric material 76 prior to forming the first and second high-permittivity dielectric materials 71, 72. As with the eighth embodiment, there are several methods of arriving at a variation of the ninth embodiment structure (see e.g., FIG. 14E).

Figure 15:
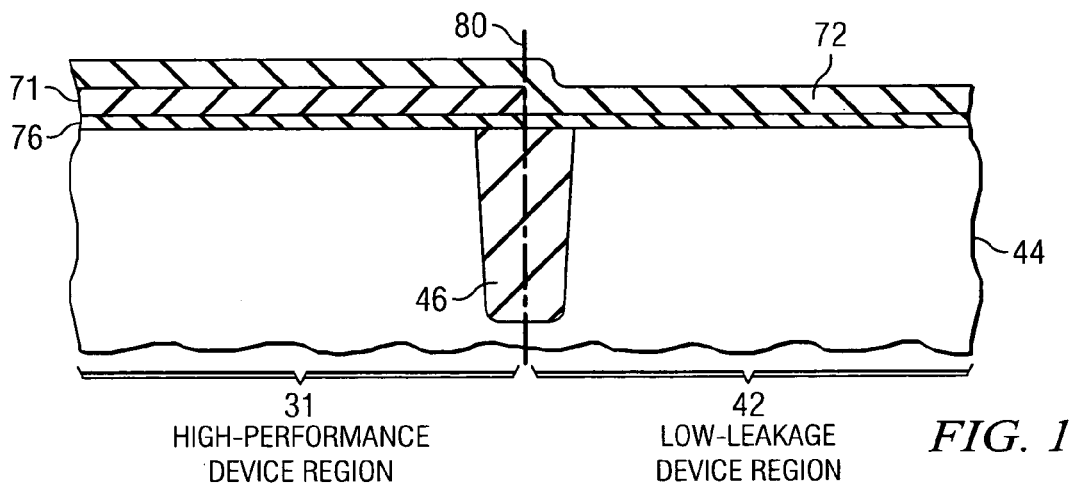
FIG. 15 shows an example step in an alternative method of fabricating the ninth embodiment.
Figure 16A:
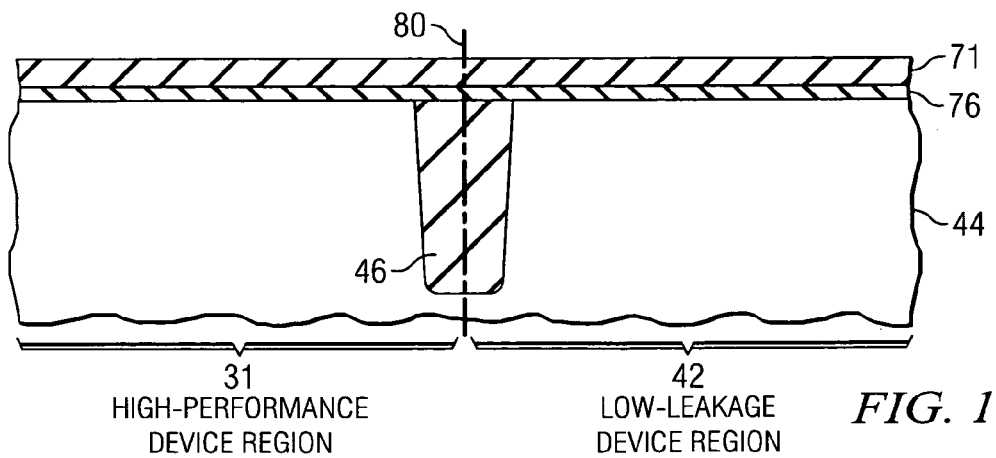
FIGS. 16A and 16B show some example steps to illustrate another alternative method for fabricating the ninth embodiment.
Figure 16B:
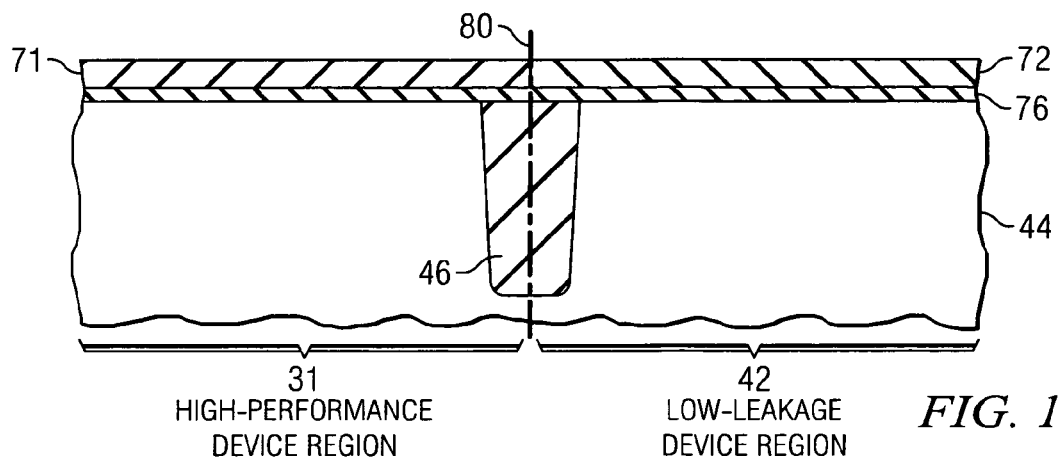

FIG. 15 shows an example step in an alternative method of fabricating the ninth embodiment. The alternative method illustrated by FIG. 15 is similar to the method illustrated by FIGS. 14A-14E, except that the first high-permittivity dielectric material 71 is formed over the first and second transistor regions 31, 42, and at least partially removed from the second transistor region 42, prior to forming the second high-permittivity dielectric material 72. FIGS. 16A and 16B show some example steps to illustrate another alternative method for fabricating the ninth embodiment and to arrive at the ninth embodiment structure (see e.g., FIG. 14E). In FIG. 16A, a first high-permittivity dielectric material 71 is formed over the normal-permittivity dielectric material 76 and over the substrate 44 in the first and second transistor regions 31, 42. Then, the first high-permittivity dielectric material 71 in the second transistor region 42 is converted to the second high-permittivity dielectric material 72, as described above with respect to the eighth embodiment (see e.g., FIGS. 13A and 13B). As still another alternative method (not shown) for obtaining a structure of the ninth embodiment, the second high-permittivity dielectric material 72 may be formed over the normal-permittivity dielectric material 76 and the substrate 44, and then the second high-permittivity dielectric material 72 in the first transistor region 31 is converted to the first high-permittivity dielectric material 71.

Figure 17A:
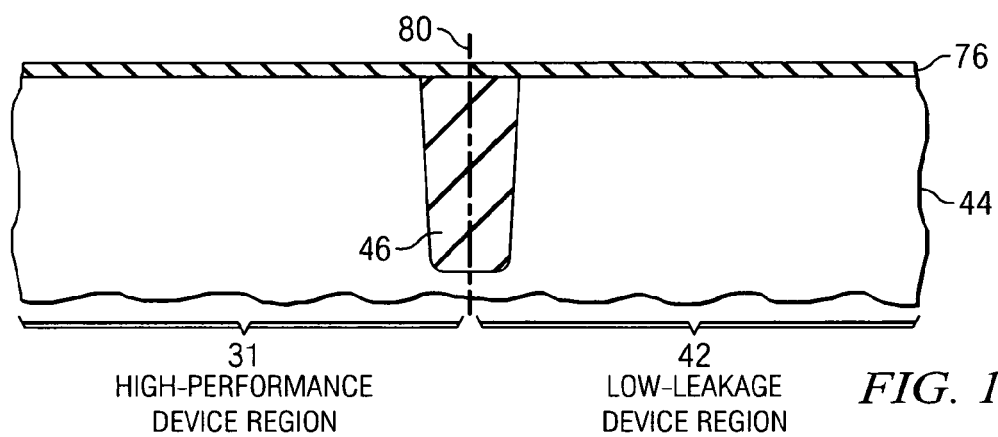
FIGS. 17A-17F show some example steps for fabricating a tenth embodiment of the present invention.
Figure 17B:
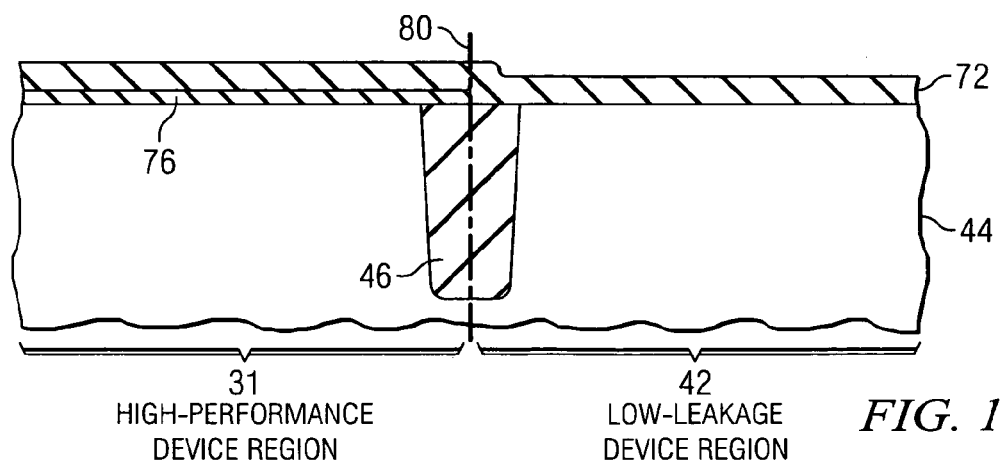
Figure 17C:
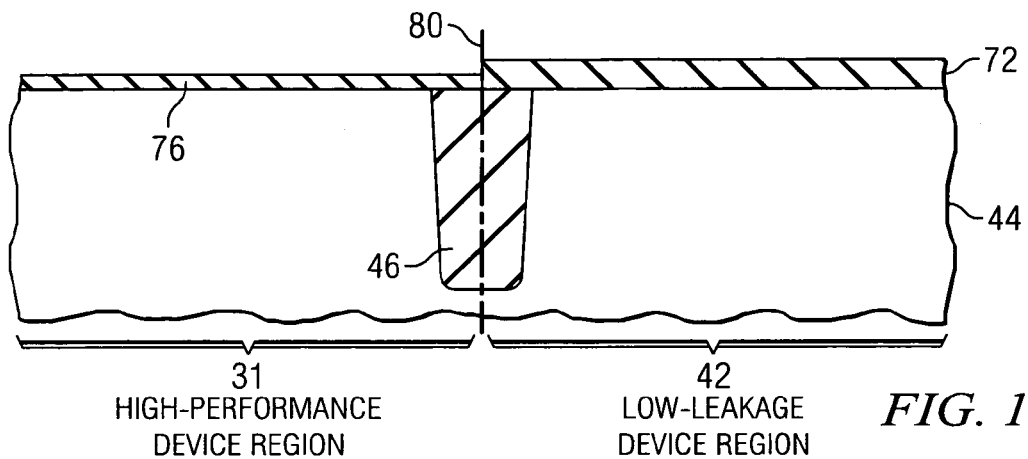
Figure 17D:
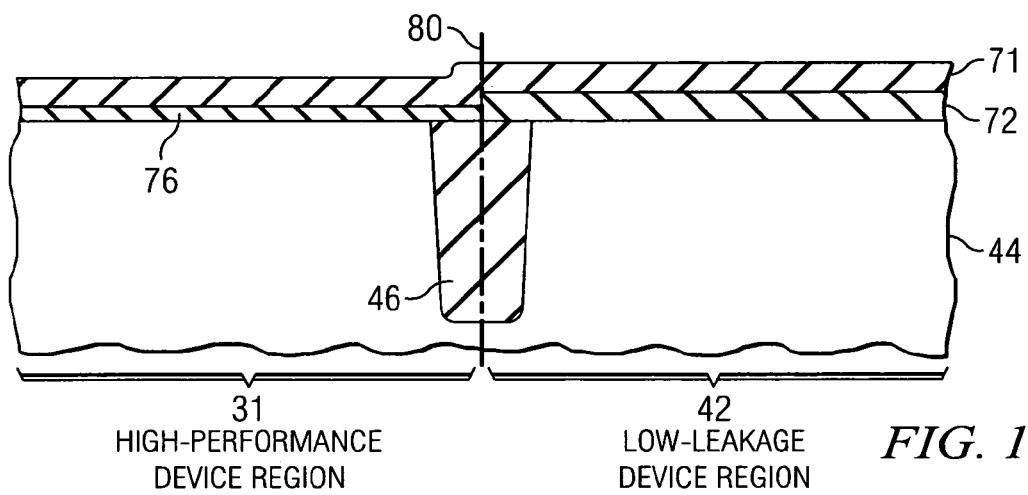
Figure 17E:
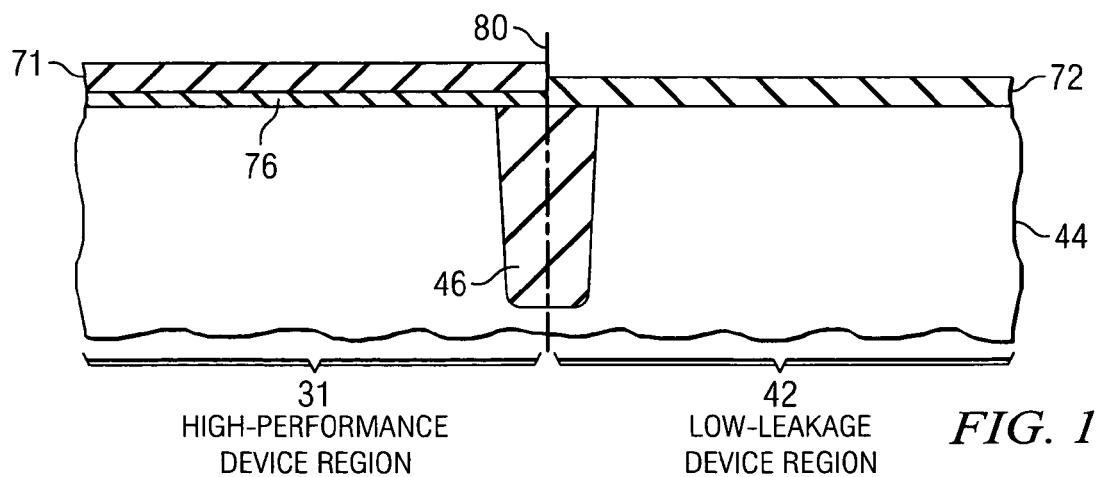
Figure 17F:
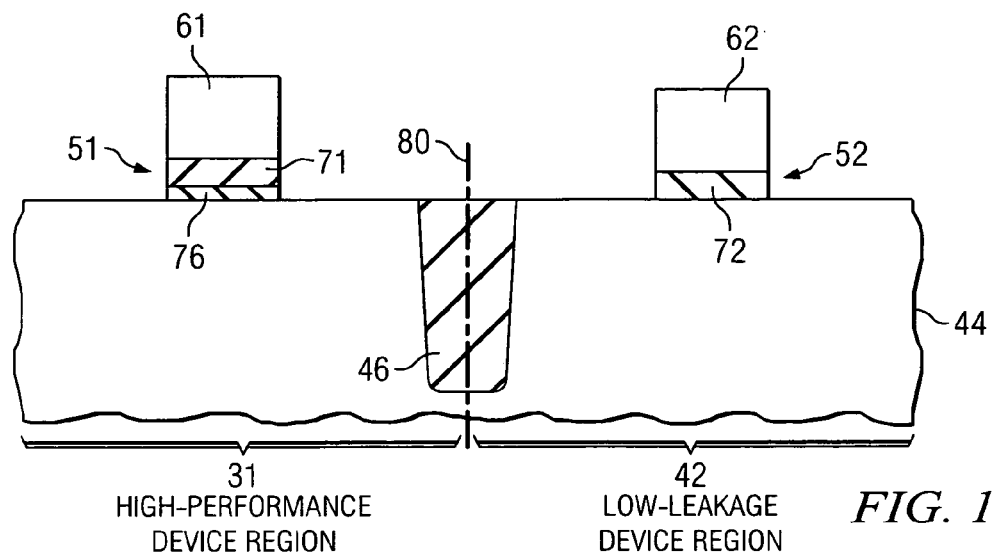

FIGS. 17A-17F show some example steps for fabricating a tenth embodiment of the present invention. In FIG. 17A, a normal-permittivity dielectric material 76 is formed over the substrate 44. Then, all or part of the normal-permittivity dielectric material 76 is removed from the second transistor region 42. All of the normal-permittivity dielectric material 76 has been removed from the second transistor region 42 in FIG. 17B, for example. Also in FIG. 17B, a second high-permittivity dielectric material 72 is formed over the remaining portions of the normal-permittivity dielectric material 76 and over the substrate 44. Then, all or part of the second high-permittivity dielectric material 72 is removed from the first transistor region 31. All of the second high-permittivity dielectric material 72 has been removed from the first transistor region 31 in FIG. 17C, for example. In FIG. 17D, a first high-permittivity dielectric material 71 is formed over the remaining portions of the normal-permittivity dielectric material 76, over the remaining portions of the second high-permittivity dielectric material 72, and over the substrate 44. Then, all or part of the first high-permittivity dielectric material 71 is removed from the second transistor region 42. All of the first high-permittivity dielectric material 71 has been removed from the second transistor region 42 in FIG. 17E, for example. This leads to the structure shown in FIG. 17F after the first and second gate electrodes 61, 62 and the first and second gate dielectric portions 51, 52 are formed, which is an example structure of the tenth embodiment.

Figure 18A:
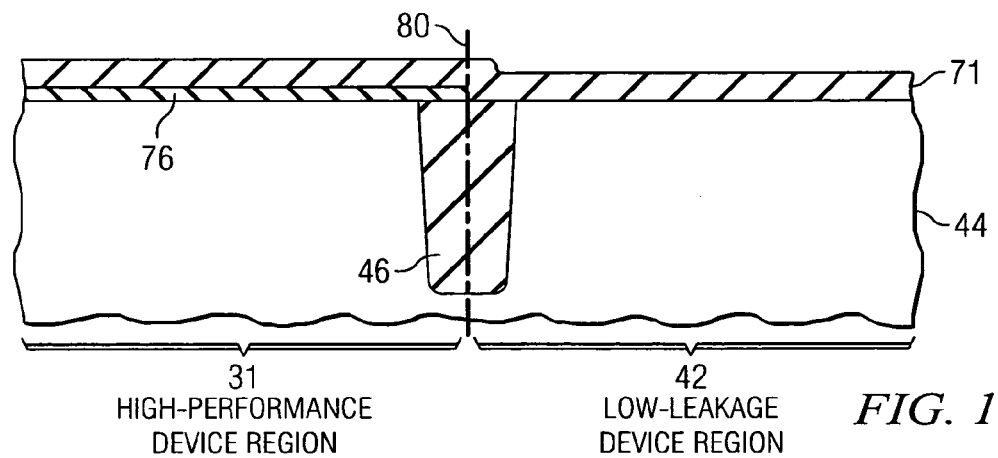
FIGS. 18A and 18B show some example steps to illustrate an alternative method of fabricating a structure of the tenth embodiment.
Figure 18B:
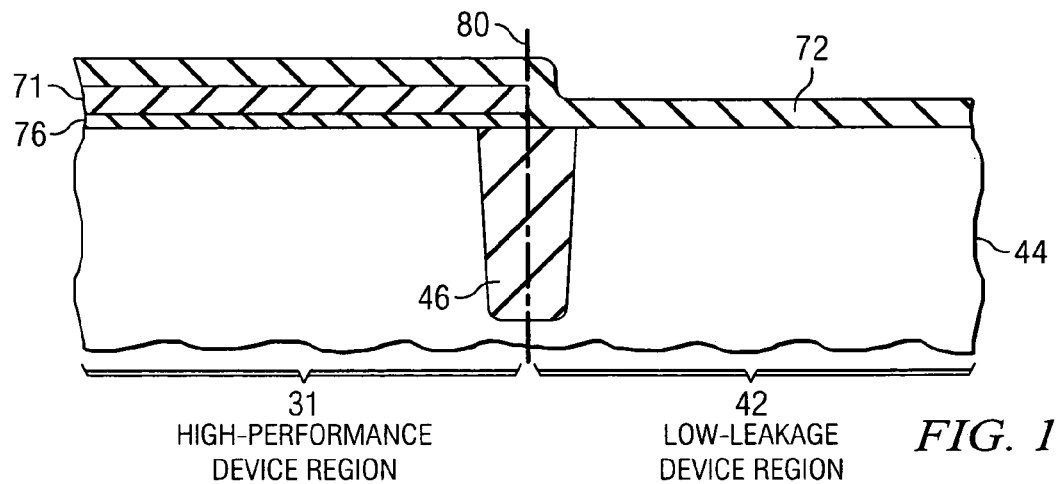
Figure 19A:
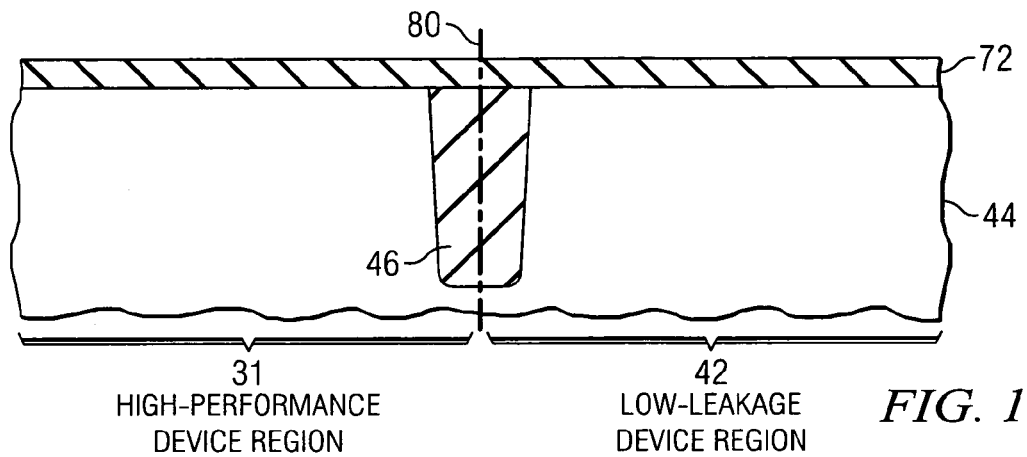
FIGS. 19A-19D show some example steps to illustrate another alternative method of fabricating a structure of the tenth embodiment.
Figure 19B:
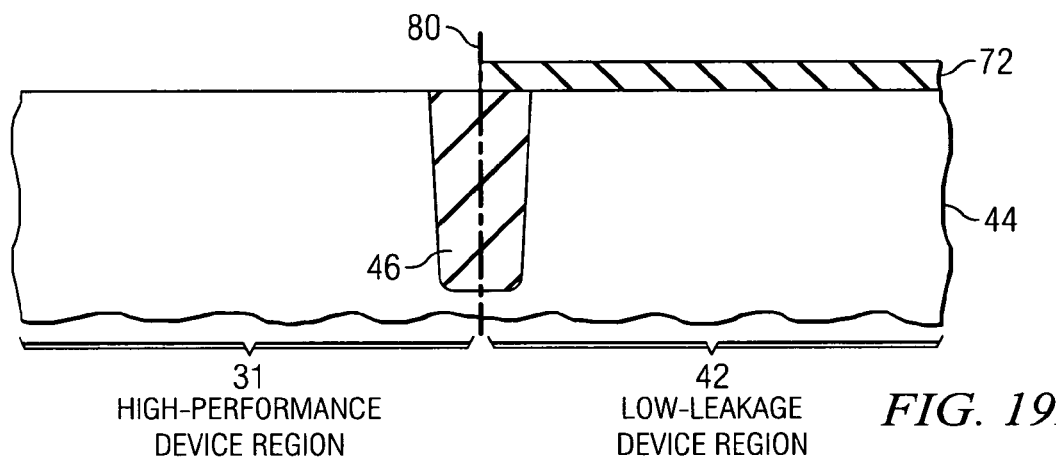
Figure 19C:
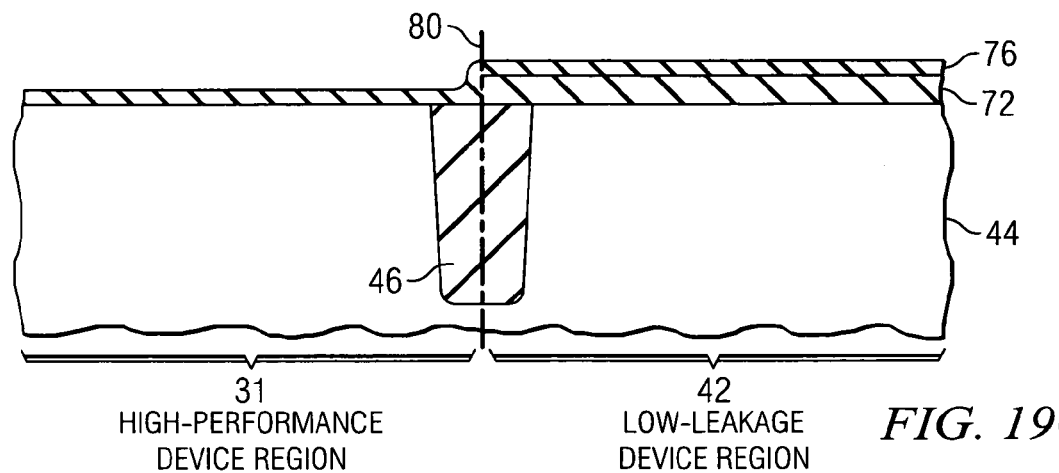
Figure 19D:
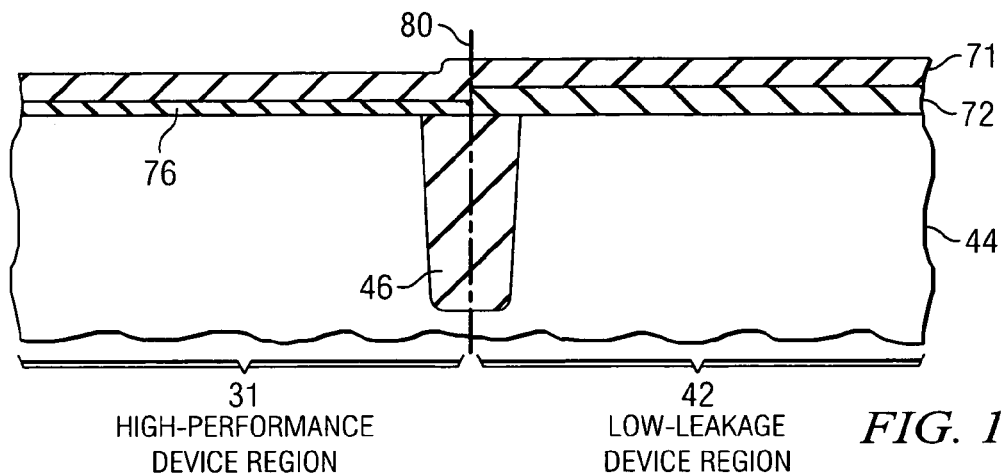
Figure 20A:
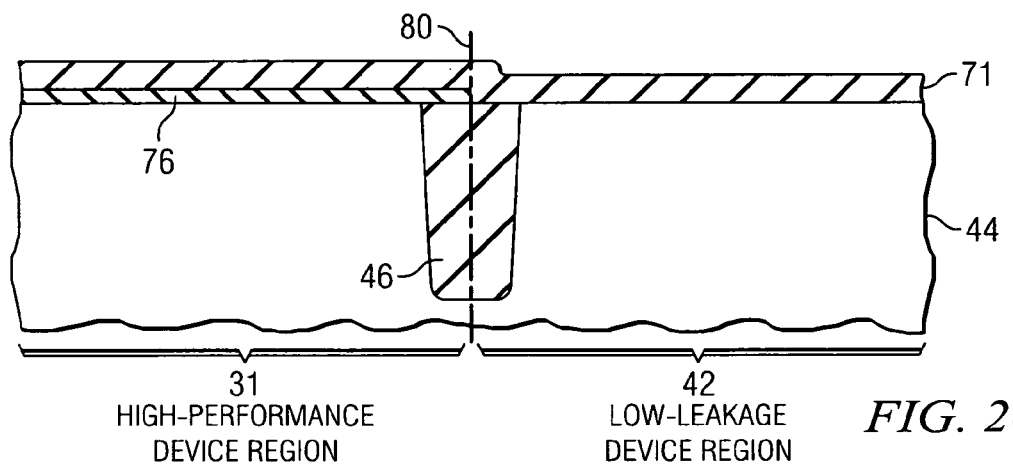
FIGS. 20A and 20B show some example steps to illustrate yet another alternative method of fabricating a structure of the tenth embodiment.
Figure 20B:
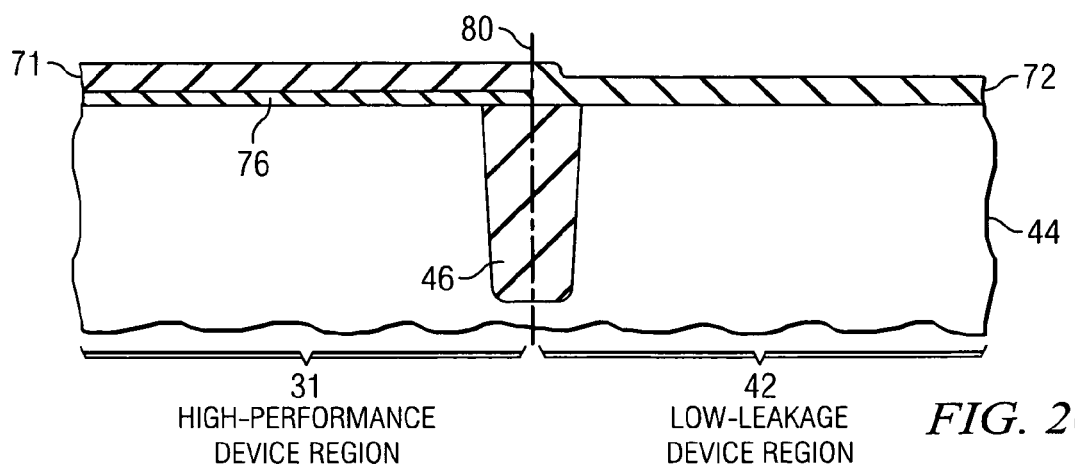

As with other embodiments discussed above, there are several alternative methods that may be used to arrive at gate dielectric structures of the tenth embodiment. FIGS. 18A and 18B show some example steps to illustrate an alternative method of fabricating a structure of the tenth embodiment. In comparison to the method shown in FIGS. 17A-17F, the first high-permittivity dielectric material 71 is formed after forming the normal-permittivity dielectric material 76 and prior to forming the second high-permittivity dielectric material 72 (see e.g., FIGS. 18A and 18B, leading to FIG. 17F). FIGS. 19A-19D show some example steps to illustrate another alternative method of fabricating a structure of the tenth embodiment. In comparison to the methods shown in FIGS. 17A-17F and 18A-18B, the second high-permittivity dielectric material 72 is formed prior to forming the normal-permittivity dielectric material 76 and the first high-permittivity dielectric material 71 (see e.g., FIGS. 19A-19D, leading to FIG. 17F). FIGS. 20A and 20B show some example steps to illustrate yet another alternative method of fabricating a structure of the tenth embodiment. In FIG. 20A, a first high-permittivity dielectric material 71 is formed over the remaining portions of the normal-permittivity dielectric material 76 and over the substrate 44 in the first and second transistor region 42s. Then, as shown in FIG. 20B, the first high-permittivity dielectric material 71 in the second transistor region 42 is converted to the second high-permittivity dielectric material 72. As still another alternative method (not shown) to obtaining a structure of the tenth embodiment, the second high-permittivity dielectric material 72 may be formed and then converted to the first high-permittivity dielectric material 71 in the first transistor region 31, for example.

Figure 21A:
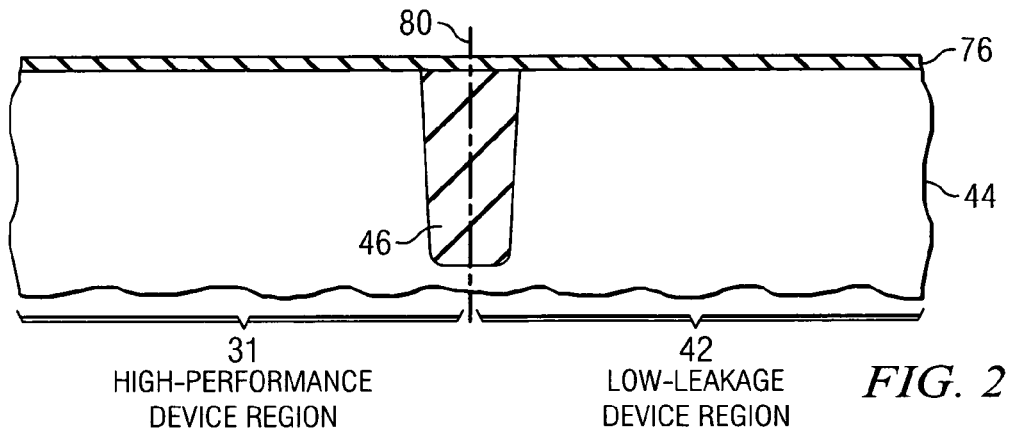
FIGS. 21A-21F show some example steps for fabricating an eleventh embodiment of the present invention.
Figure 21B:
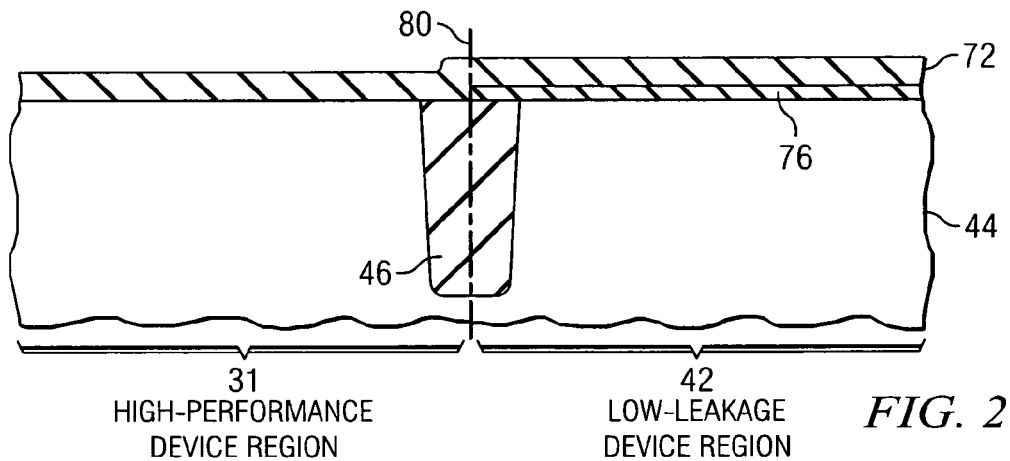
Figure 21C:
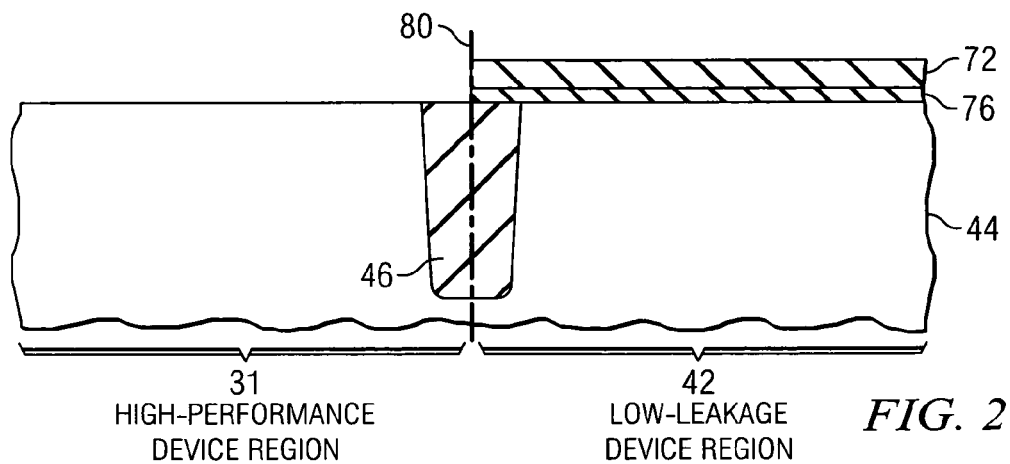
Figure 21D:
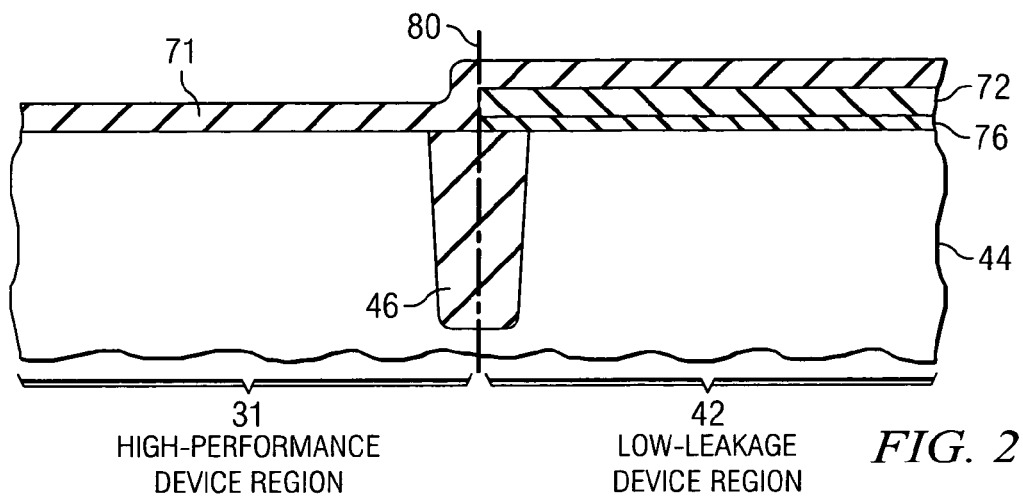
Figure 21E:
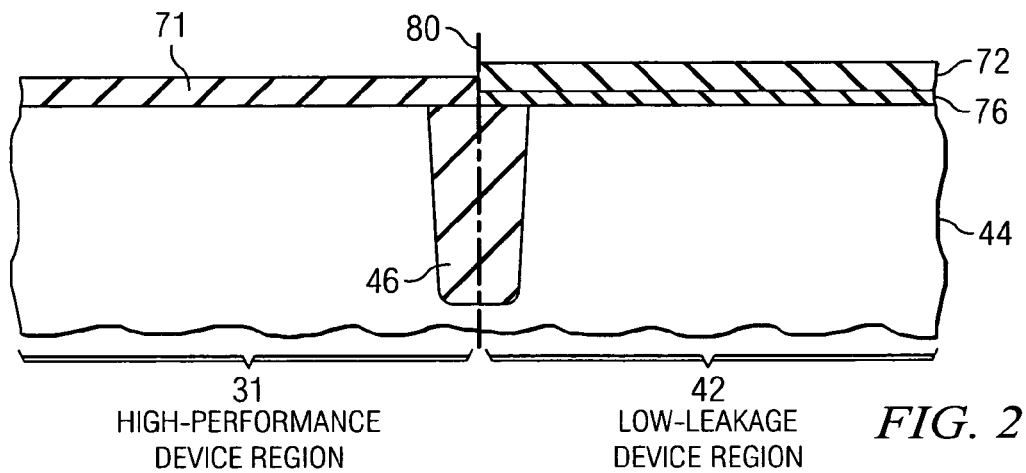
Figure 21F:
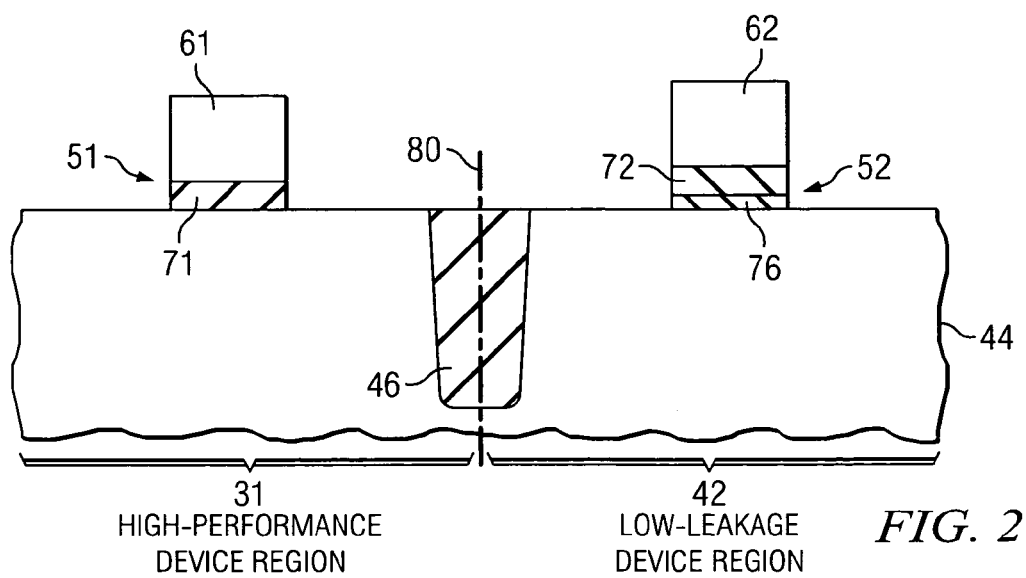
Figure 22A:
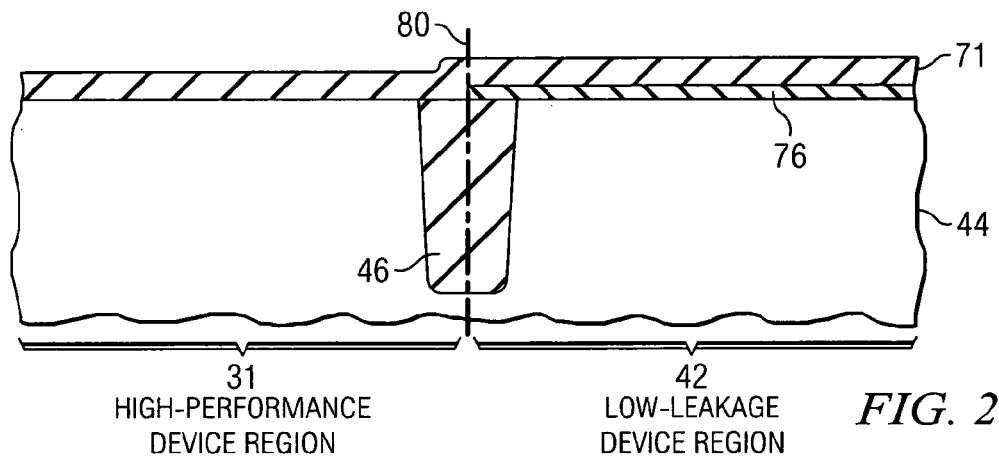
FIGS. 22A-22D show some example steps to illustrate an alternative method of fabricating a structure of the eleventh embodiment.
Figure 22B:
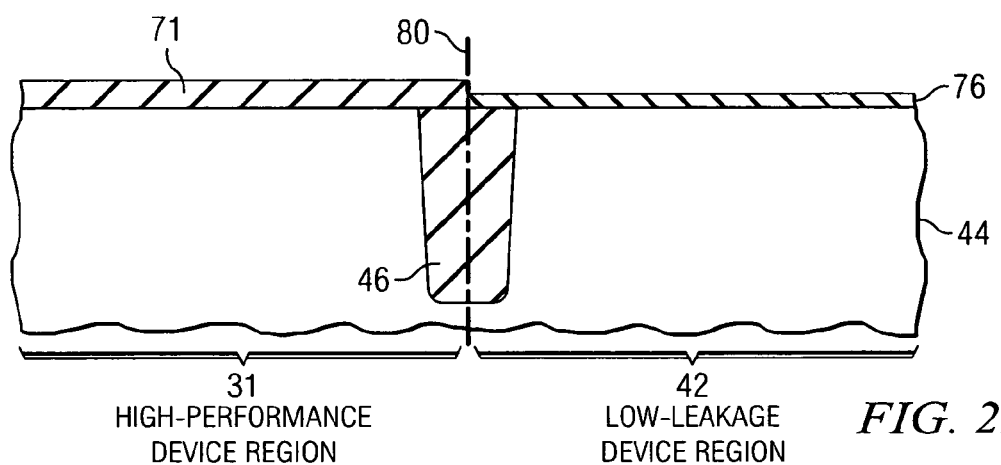
Figure 22C:
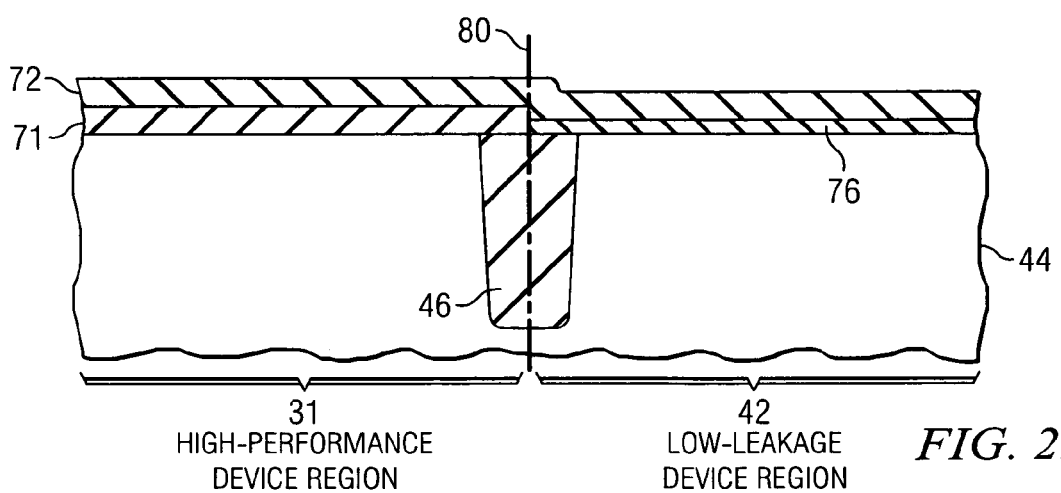
Figure 22D:
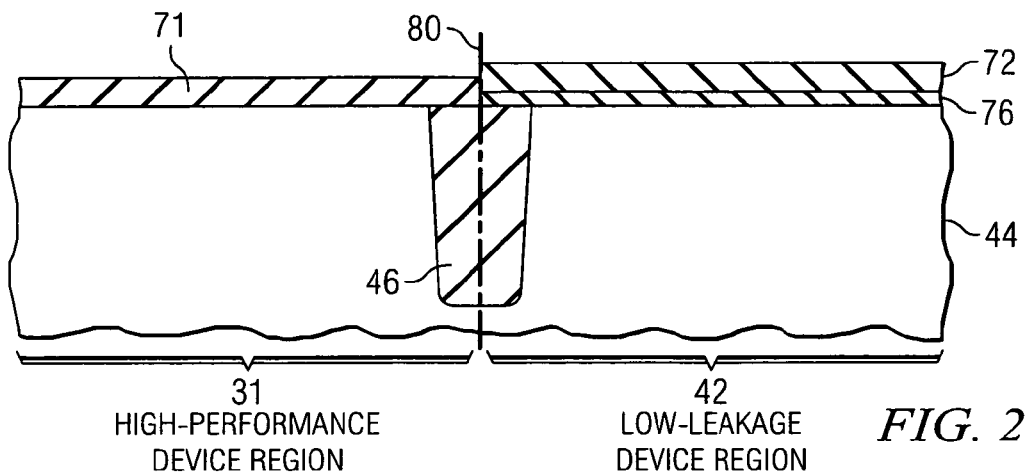

FIGS. 21A-21F show some example steps for fabricating an eleventh embodiment of the present invention. In FIG. 21A, a normal-permittivity dielectric material 76 is formed over the substrate 44. Then, all or part of the normal-permittivity dielectric material 76 is removed from the first transistor region 31. All of the normal-permittivity dielectric material 76 has been removed from the first transistor region 31 in FIG. 21B, for example. Also in FIG. 21B, a second high-permittivity dielectric material 72 is formed over the remaining portions of the normal-permittivity dielectric material 76 and over the substrate 44. Then, all or part of the second high-permittivity dielectric material 72 is removed from the first transistor region 31. All of the second high-permittivity dielectric material 72 has been removed from the first transistor region 31 in FIG. 21C, for example. In FIG. 21D, a first high-permittivity dielectric material 71 is formed over the remaining portions of the normal-permittivity dielectric material 76, over the remaining portions of the second high-permittivity dielectric material 72, and over the substrate 44. Then, all or part of the first high-permittivity dielectric material 71 is removed from the second transistor region 42. All of the first high-permittivity dielectric material 71 has been removed from the second transistor region 42 in FIG. 21E, for example. This leads to the structure shown in FIG. 21F after the first and second gate electrodes 61, 62 and the first and second gate dielectric portions 51, 52 are formed, which is an example of the eleventh embodiment.

Figure 23A:
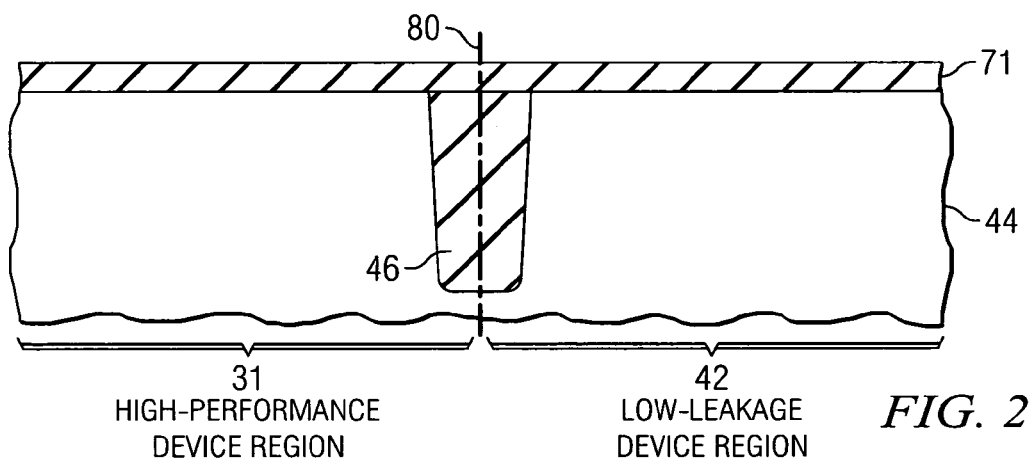
FIGS. 23A and 23B show some example steps to illustrate another alternative method of fabricating a structure of the eleventh embodiment.
Figure 23B:
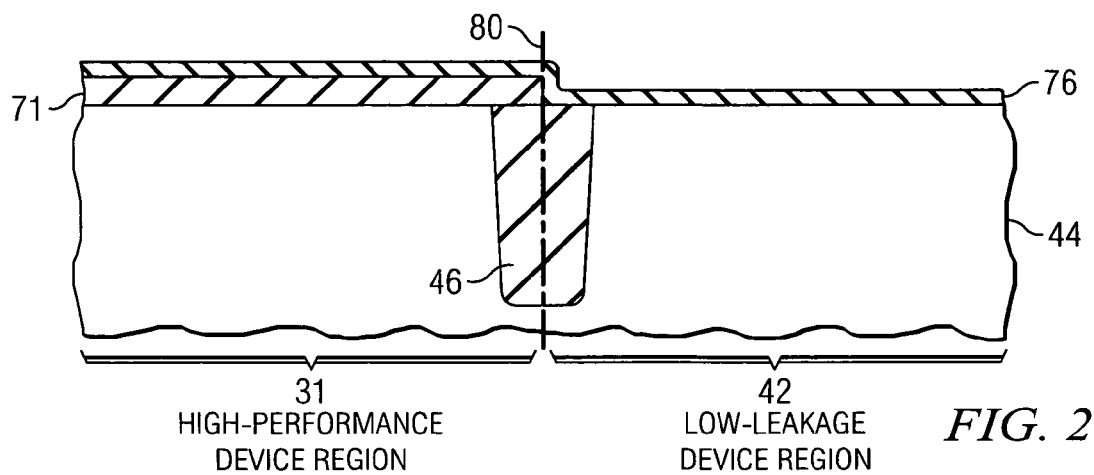
Figure 24A:
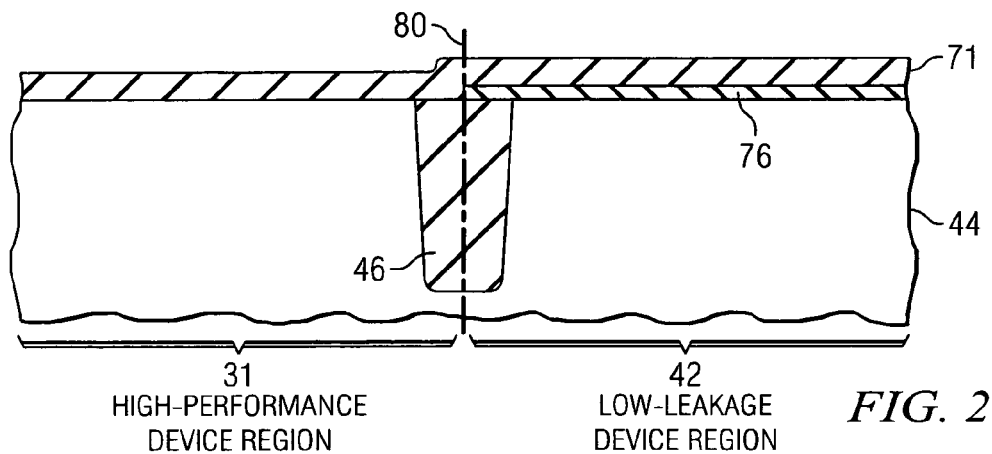
FIGS. 24A and 24B show some example steps to illustrate yet another alternative method of fabricating a structure of the eleventh embodiment.
Figure 24B:
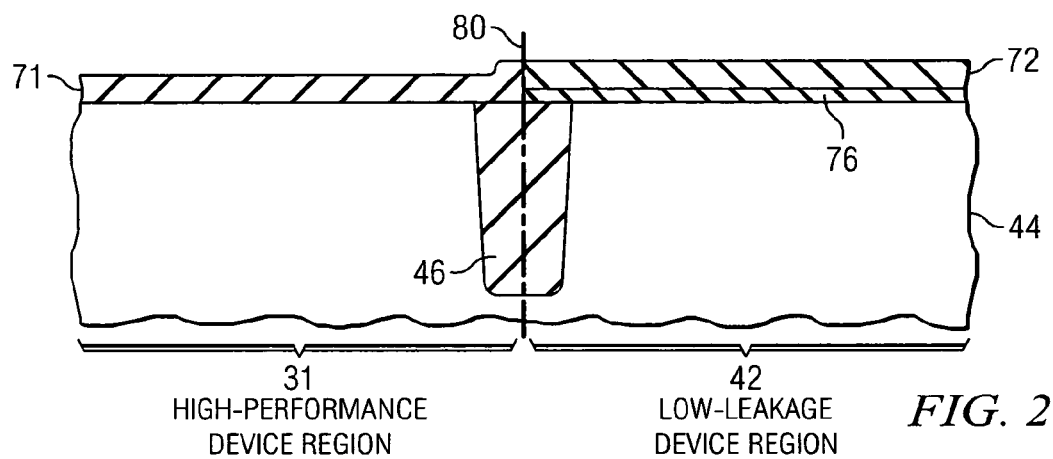

As with other embodiments discussed above, there are several alternative methods that may be used to arrive at gate dielectric structures of the eleventh embodiment. FIGS. 22A-22D show some example steps to illustrate an alternative method of fabricating a structure of the eleventh embodiment. In comparison to the method shown in FIGS. 21A-21F, the first high-permittivity dielectric material 71 is formed after forming the normal-permittivity dielectric material 76 and prior to forming the second high-permittivity dielectric material 72 (see e.g., FIGS. 22A-22D, leading to FIG. 21F). FIGS. 23A and 23B show some example steps to illustrate another alternative method of fabricating a structure of the eleventh embodiment. In comparison to the methods shown in FIGS. 21A-21F and 22A-22D, the first high-permittivity dielectric material 71 is formed prior to forming the normal-permittivity dielectric material 76 and the second high-permittivity dielectric material 72 (see e.g., FIGS. 23A and 23B, leading to FIG. 21F). FIGS. 24A and 24B show some example steps to illustrate yet another alternative method of fabricating a structure of the eleventh embodiment. In FIG. 24A, a first high-permittivity dielectric material 71 is formed over the remaining portions of the normal-permittivity dielectric material 76 and over the substrate 44 in the first and second transistor regions 31, 42. Then, as shown in FIG. 24B, the first high-permittivity dielectric material 71 in the second transistor region 42 is converted to the second high-permittivity dielectric material 72. As still another alternative method (not shown) to obtaining a structure of the tenth embodiment, the second high-permittivity dielectric material 72 may be formed and then converted to the first high-permittivity dielectric material 71 in the first transistor region 31, for example.

Figure 25A:
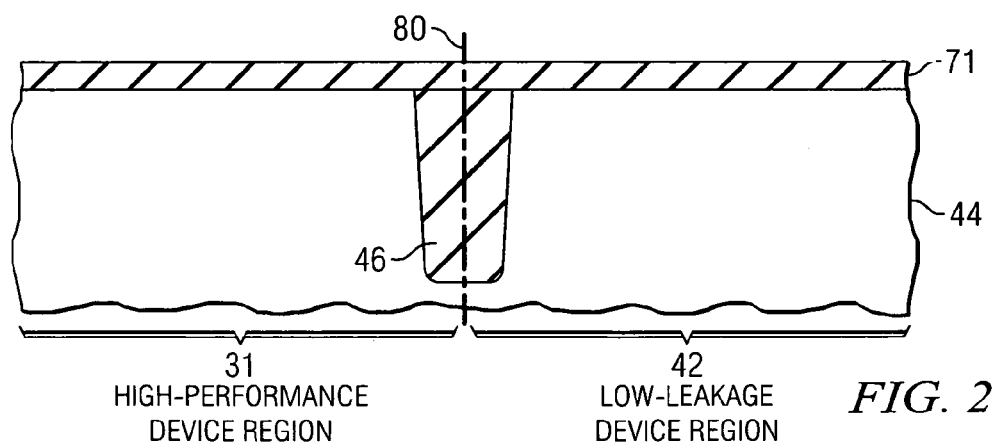
FIGS. 25A-25C show some example steps for fabricating a twelfth embodiment of the present invention.
Figure 25B:
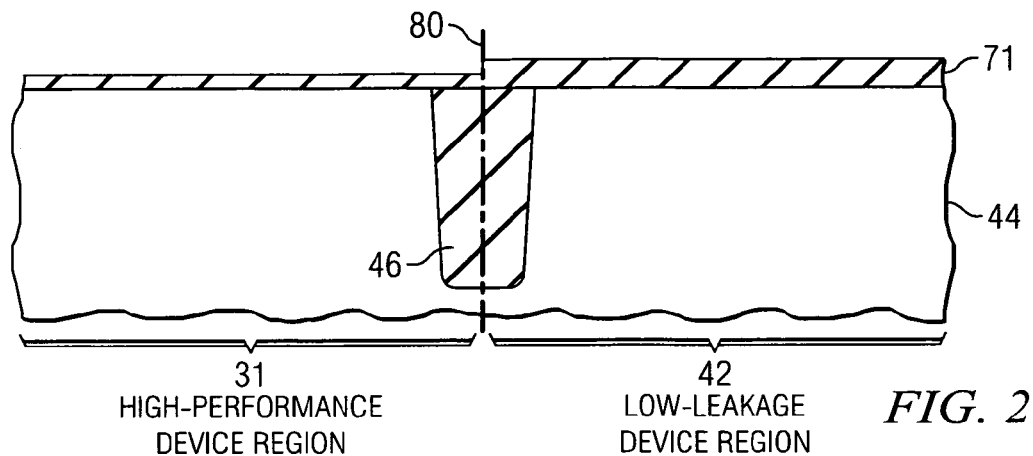
Figure 25C:
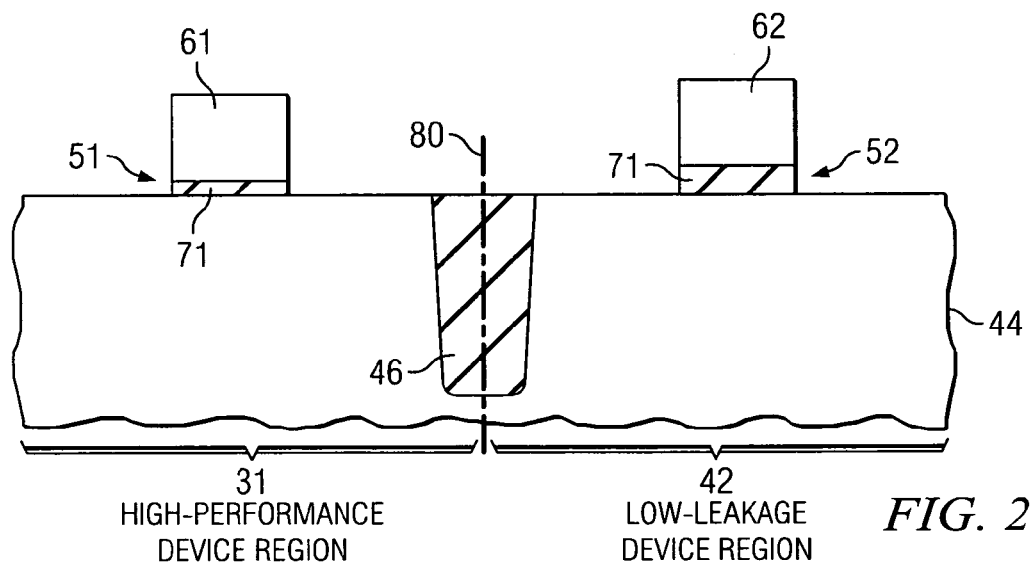

FIGS. 25A-25C show some example steps for fabricating a twelfth embodiment of the present invention. In FIG. 25A, a first high-permittivity dielectric material 71 is formed over the substrate 44. Next, part of the first high-permittivity dielectric material 71 is removed from the first transistor region 31, as shown in FIG. 25B. This leads to the structure shown in FIG. 25C after the first and second gate electrodes 61, 62 and the first and second gate dielectric portions 51, 52 are formed, which is an example structure of the twelfth embodiment. Hence in the structure shown in FIG. 25C, the first high-permittivity dielectric material 71 in the second transistor region 42 (for the second gate dielectric portion 52) is thicker than the first high-permittivity dielectric material 71 in the first transistor region 31 (for the first gate dielectric portion 51).

Figure 26A:
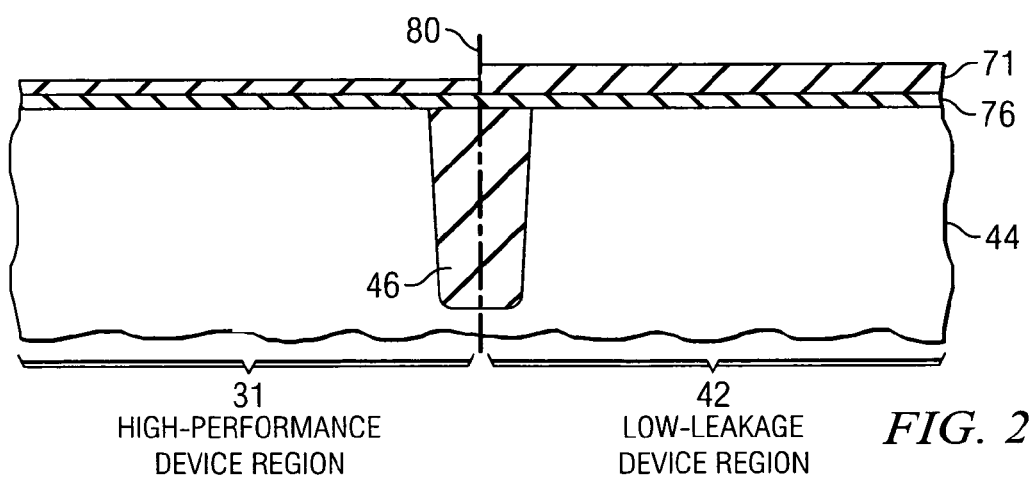
FIGS. 26A and 26B show some example steps for fabricating a thirteenth embodiment of the present invention.
Figure 26B:
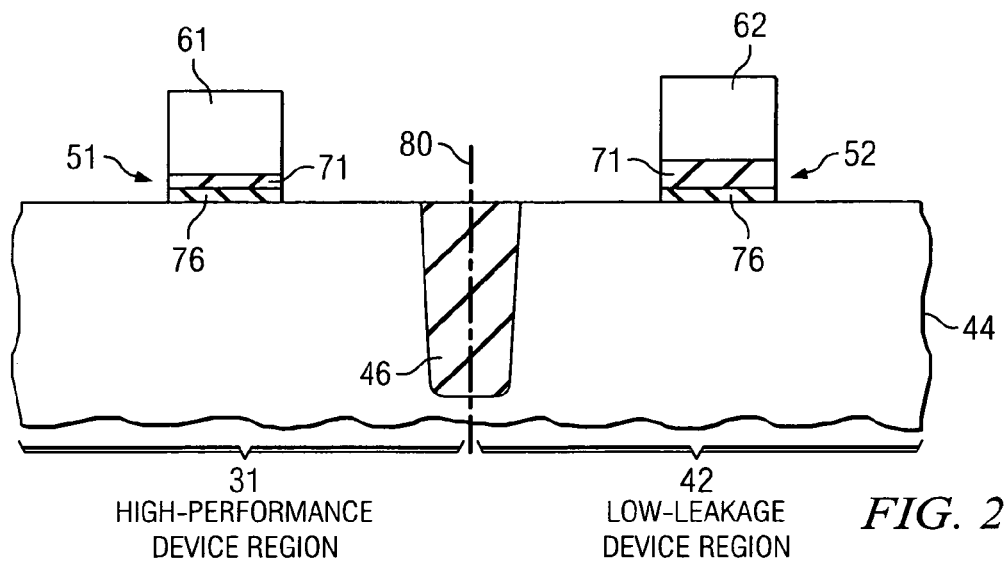

FIGS. 26A and 26B show some example steps for fabricating a thirteenth embodiment of the present invention. The thirteenth embodiment is a variation on the twelfth embodiment by adding the normal-permittivity dielectric material 76. Hence, a method of fabricating the thirteenth embodiment may be the same as the method of fabricating the twelfth embodiment (see e.g., FIGS. 25A-25C), but with the addition of forming the normal-permittivity dielectric material 76 prior to forming the first high-permittivity dielectric material 71.

Figure 27A:
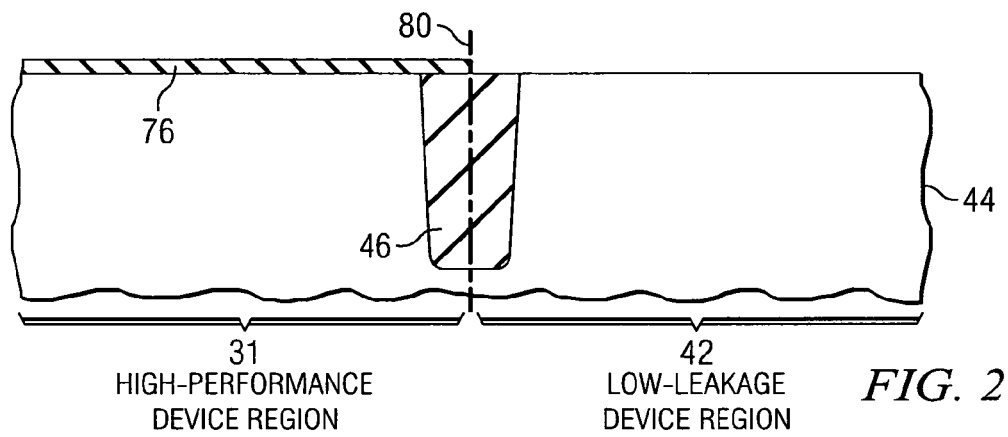
FIGS. 27A-27D show some example steps for fabricating a fourteenth embodiment of the present invention.
Figure 27B:
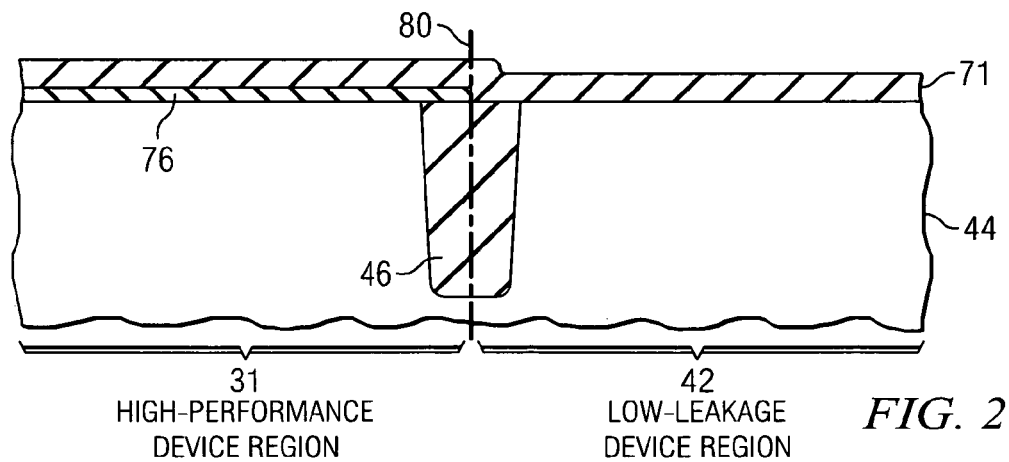
Figure 27C:
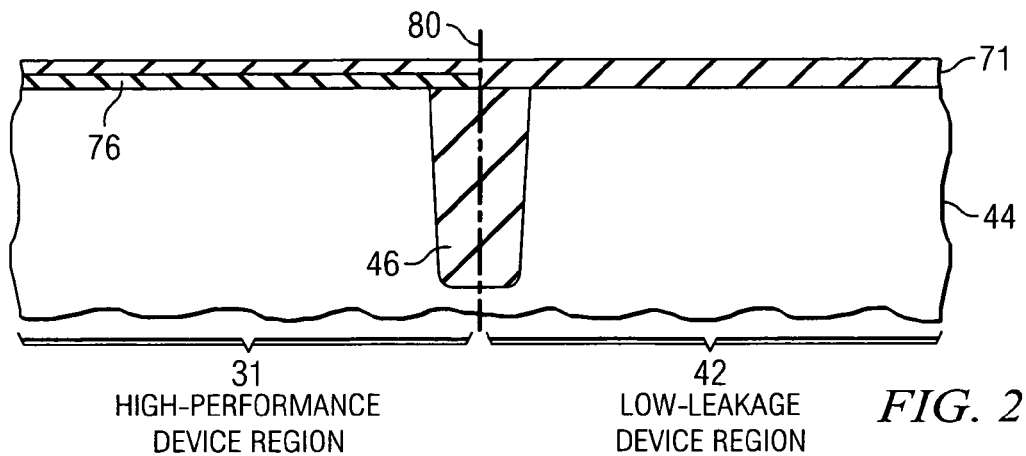
Figure 27D:
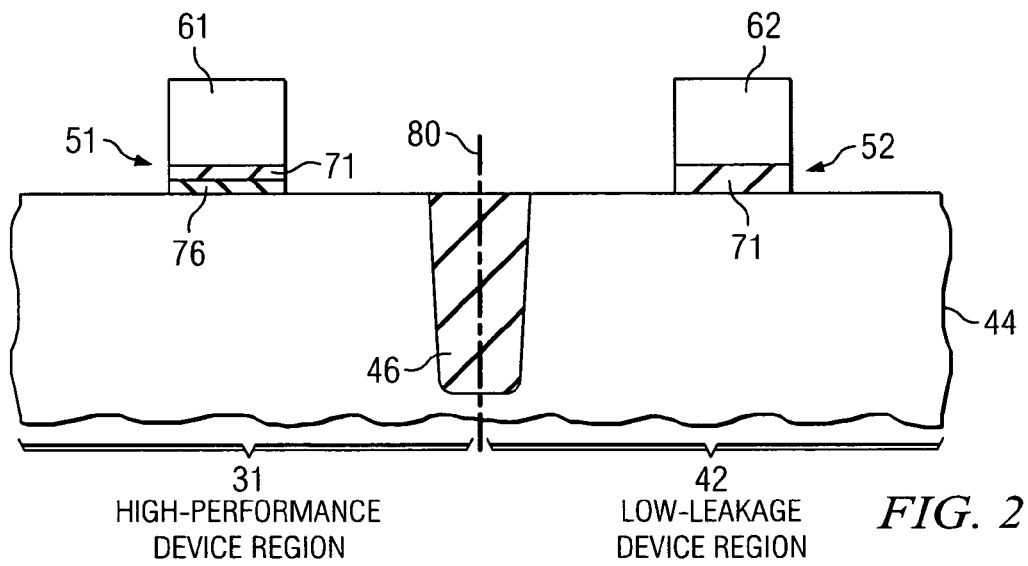
Figure 28A:
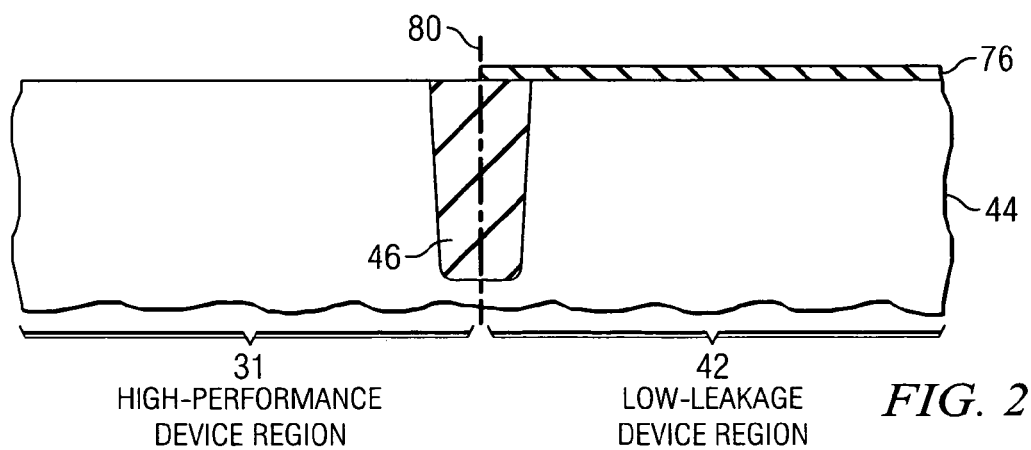
FIGS. 28A-28D show some example steps for fabricating a fifteenth embodiment of the present invention.
Figure 28B:
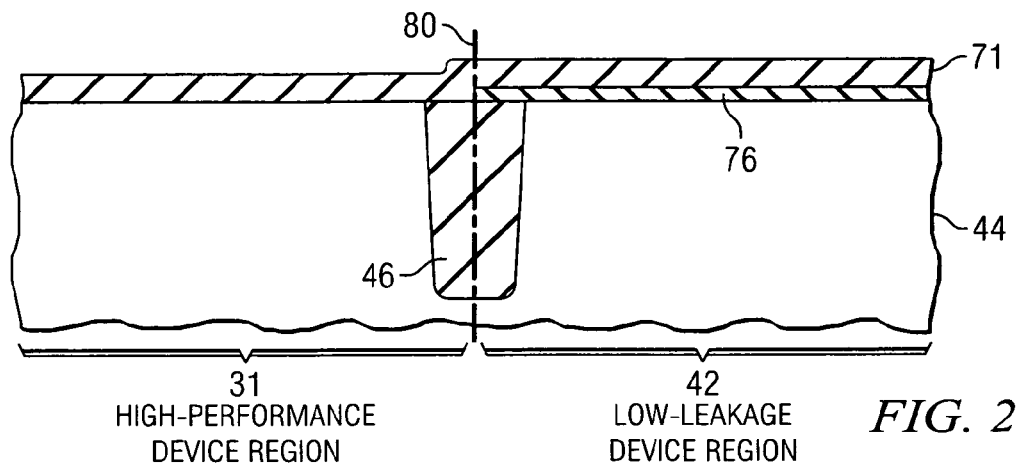
Figure 28C:
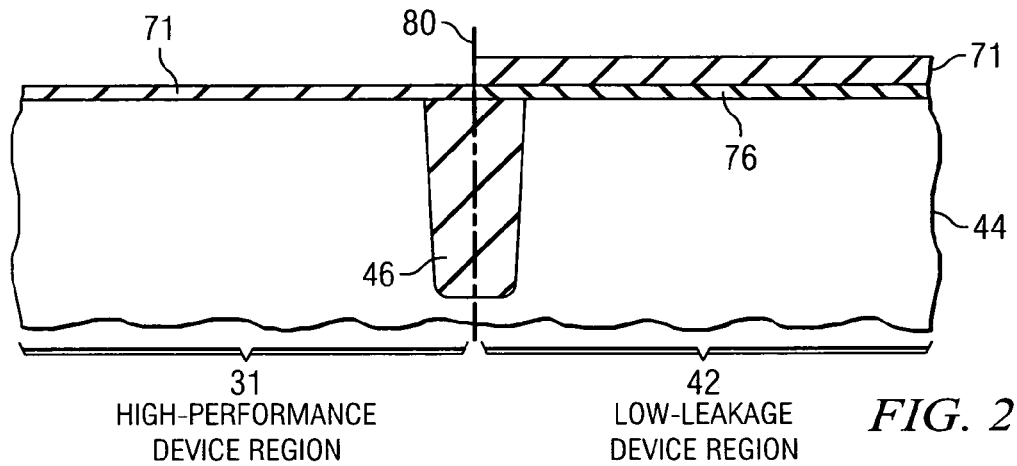
Figure 28D:
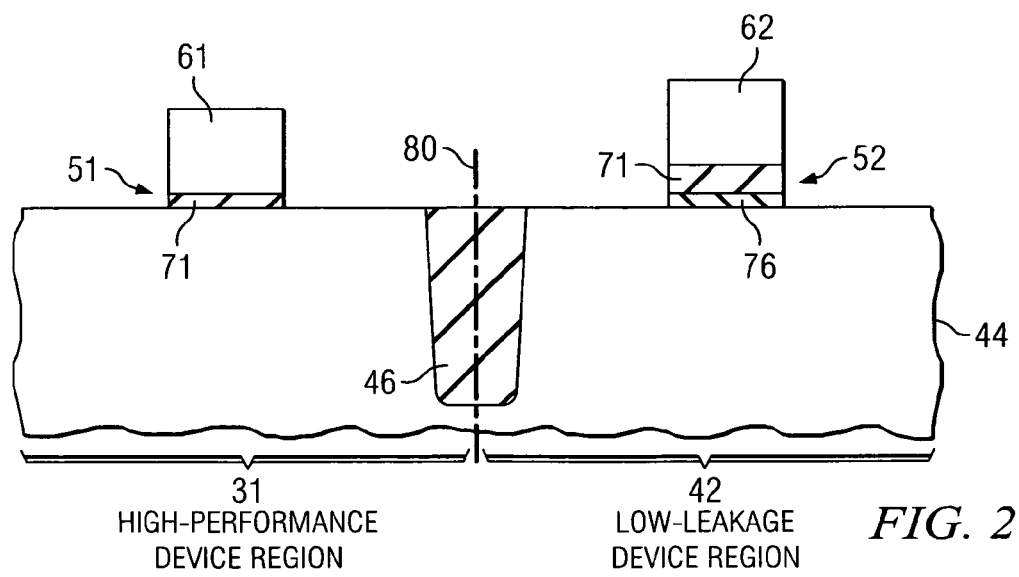

FIGS. 27A-27D show some example steps for fabricating a fourteenth embodiment of the present invention. A normal-permittivity dielectric material 76 is formed over the substrate 44. Part or all of the normal-permittivity dielectric material 76 is then removed from the second transistor region 42. In FIG. 27A, all of the normal-permittivity dielectric material 76 has been removed from the second transistor region 42, for example. In FIG. 27B, a first high-permittivity dielectric material 71 is formed over the remaining portion of the normal-permittivity dielectric material 76 and over the substrate 44. Next, part of the first high-permittivity dielectric material 71 is removed from the first transistor region 31, as shown in FIG. 27C. This leads to the structure shown in FIG. 27D after the first and second gate electrodes 61, 62 and the first and second gate dielectric portions 51, 52 are formed, which is an example structure of the fourteenth embodiment. Hence in the structure shown in FIG. 27D, the first high-permittivity dielectric material 71 in the second transistor region 42 (for the second gate dielectric portion 52) is thicker than the first high-permittivity dielectric material 71 in the first transistor region 31 (for the first gate dielectric portion 51). Also, in the fourteenth embodiment, the normal-permittivity dielectric material 76 in the first transistor region 31 (for the first gate dielectric portion 51) is thicker than the normal-permittivity dielectric material 76, if any, in the second transistor region 42 (for the second gate dielectric portion 52).

FIGS. 28A-28D show some example steps for fabricating a fifteenth embodiment of the present invention. The fifteenth embodiment is a variation on the fourteenth embodiment by removing all or part of the normal-permittivity dielectric material 76 from the first transistor region 31 rather than the second transistor region 42. Hence, a method of fabricating the fifteenth embodiment may be the same as the method of fabricating the fourteenth embodiment (see e.g., FIGS. 27A-27D), but with a different mask for removing the normal-permittivity dielectric material 76. Thus in the structure shown in FIG. 28D, the first high-permittivity dielectric material 71 in the second transistor region 42 (for the second gate dielectric portion 52) is thicker than the first high-permittivity dielectric material 71 in the first transistor region 31 (for the first gate dielectric portion 51). Also, in the fifteenth embodiment, the normal-permittivity dielectric material 76 in the second transistor region 42 (for the second gate dielectric portion 52) is thicker than the normal-permittivity dielectric material 76, if any, in the first transistor region 31 (for the first gate dielectric portion 51).

Figure 29A:
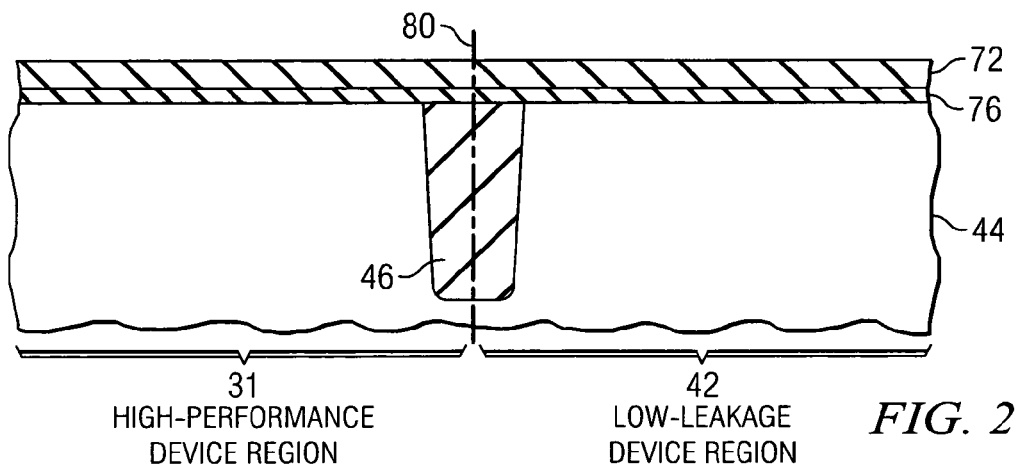
FIGS. 29A-29D show some example steps for fabricating a sixteenth embodiment of the present invention.
Figure 29B:
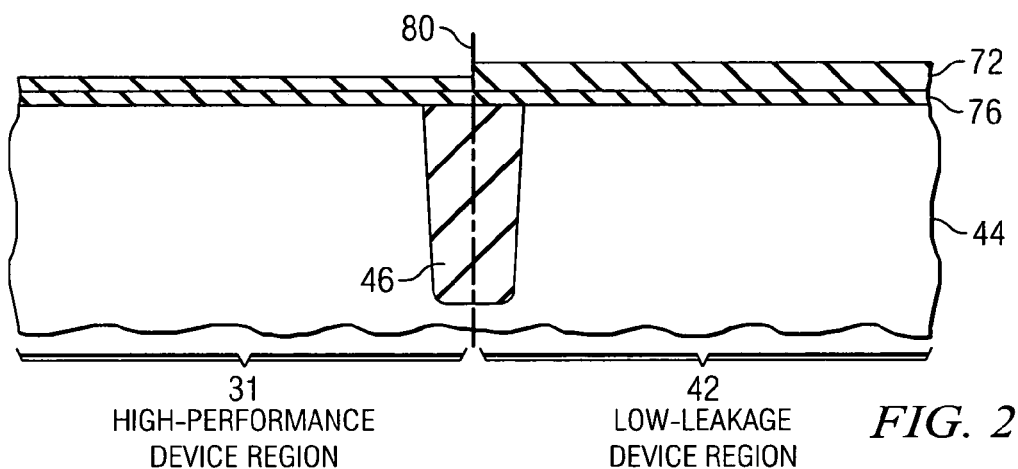
Figure 29C:
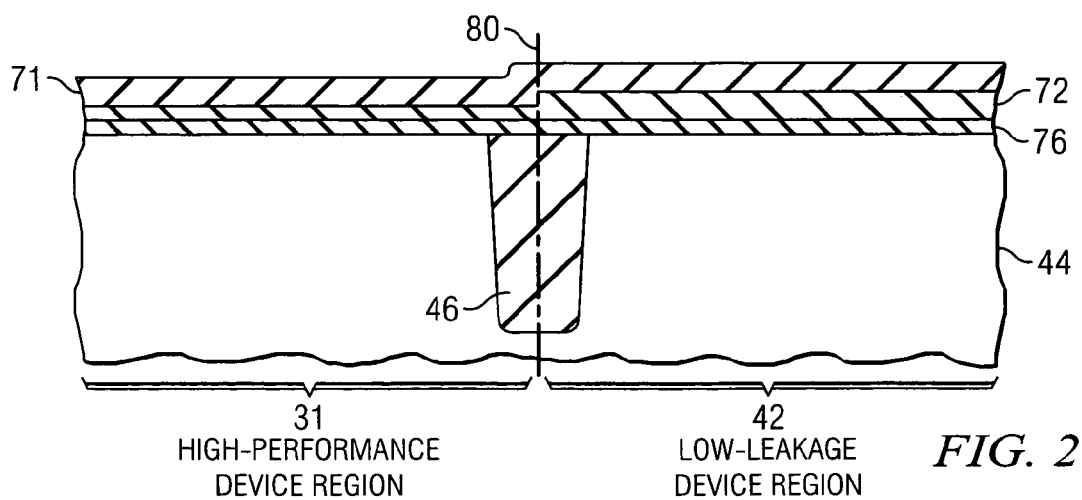
Figure 29D:
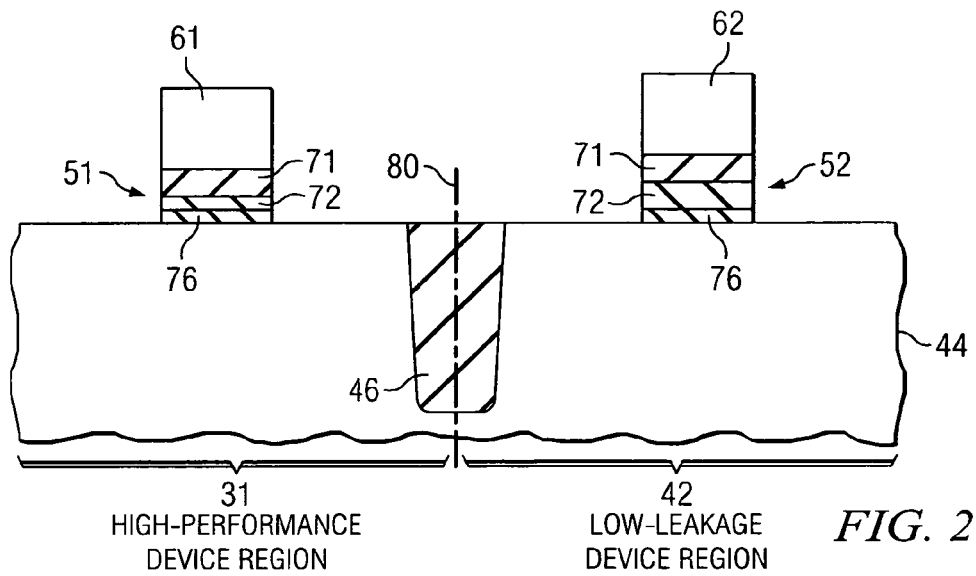

FIGS. 29A-29D show some example steps for fabricating a sixteenth embodiment of the present invention. In FIG. 29A, a normal-permittivity dielectric material 76 and a second high-permittivity dielectric material 72 are formed over the substrate 44. Next, part of the second high-permittivity dielectric material 72 is removed from the first transistor region 31, as shown in FIG. 29B. Then, a first high-permittivity dielectric material 71 is formed over the structure of FIG. 29B, as shown in FIG. 29C. This leads to the structure shown in FIG. 29D after the first and second gate electrodes 61, 62 and the first and second gate dielectric portions 51, 52 are formed, which is an example structure of the sixteenth embodiment. Hence in the structure shown in FIG. 29D, the second high-permittivity dielectric material 72 in the second transistor region 42 (for the second gate dielectric portion 52) is thicker than the second high-permittivity dielectric material 72 in the first transistor region 31 (for the first gate dielectric portion 51).

Figure 30A:
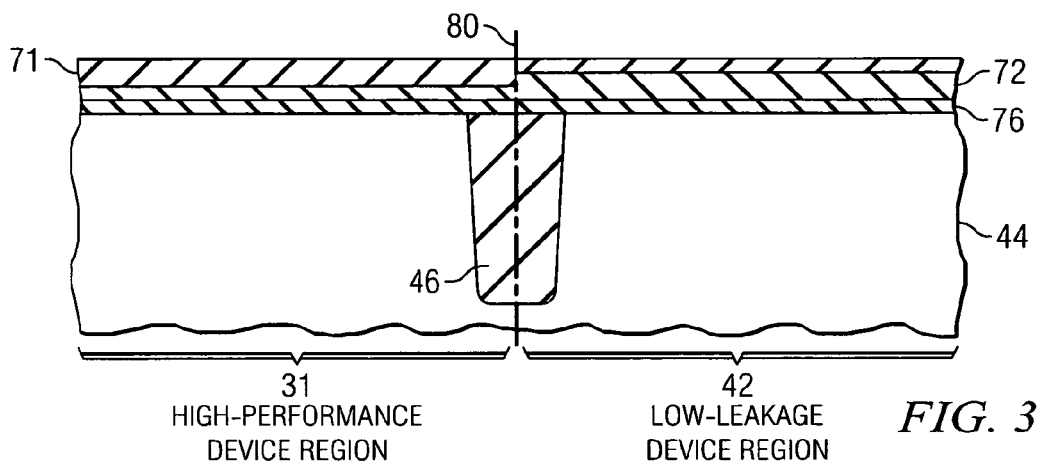
FIGS. 30A and 30B show some example steps for fabricating a seventeenth embodiment of the present invention.
Figure 30B:
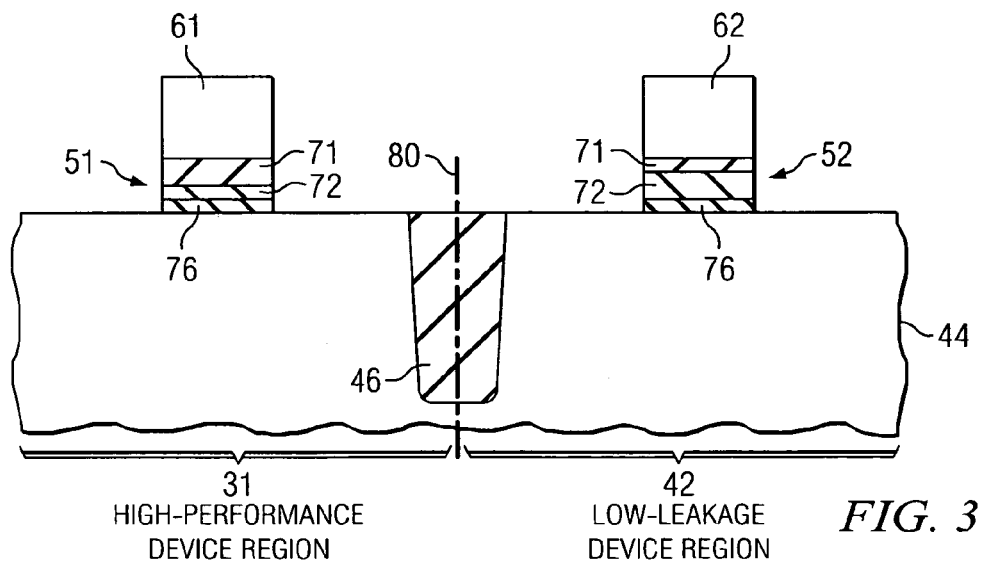

FIGS. 30A and 30B show some example steps for fabricating a seventeenth embodiment of the present invention. The seventeenth embodiment is a variation on the sixteenth embodiment by adding a step of removing all or part of the first high-permittivity dielectric material 71 from the first and/or second transistor regions 31, 42. In FIG. 30A, part of the first high-permittivity dielectric material 71 is removed from the second transistor region 42, for example. Hence, a method of fabricating the seventeenth embodiment may be the same as the method of fabricating the sixteenth embodiment (see e.g., FIGS. 29A-29C), but with the addition of the step of removing part of the first high-permittivity dielectric material 71.

Figure 31A:
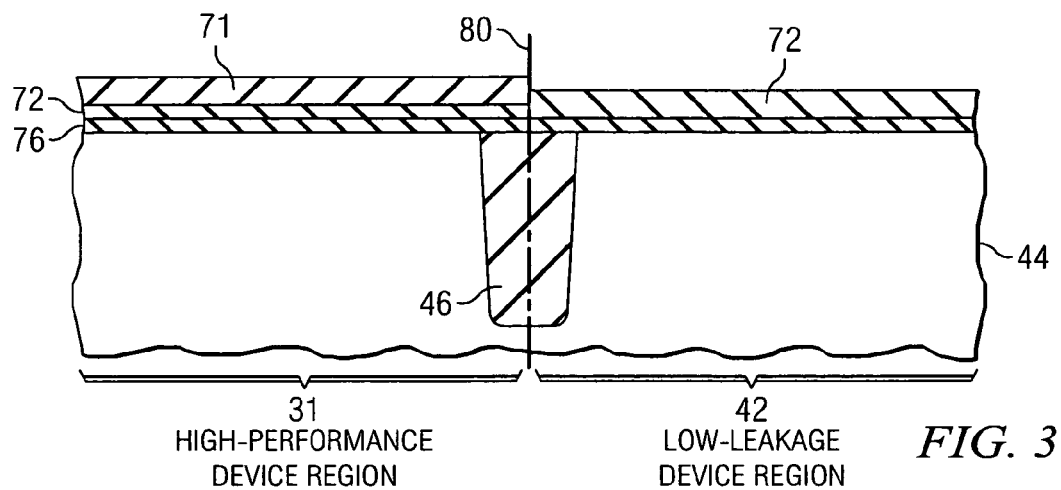
FIGS. 31A and 31B show some example steps for fabricating an eighteenth embodiment of the present invention.
Figure 31B:
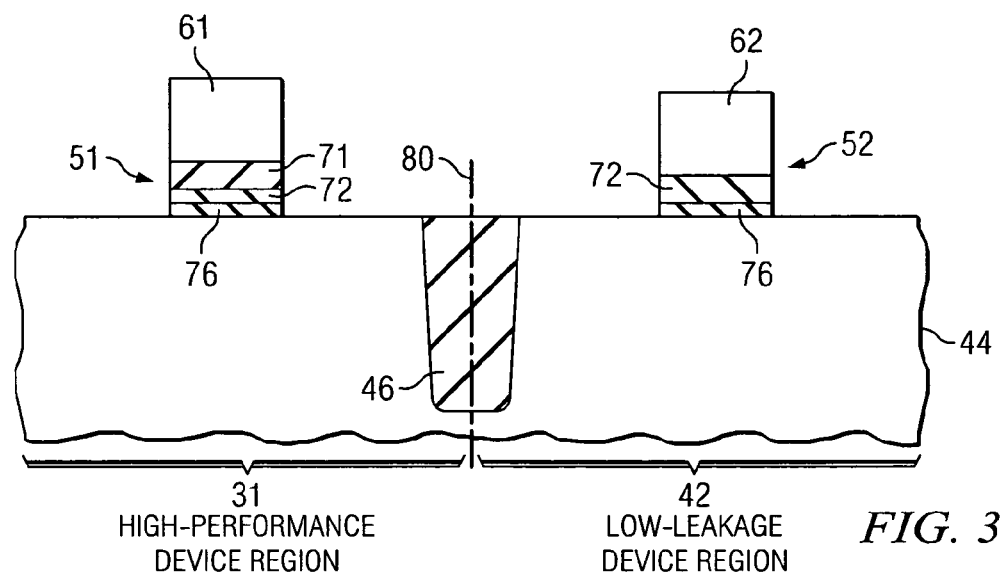

FIGS. 31A and 31B show some example steps for fabricating an eighteenth embodiment of the present invention. The eighteenth embodiment is a variation on the sixteenth embodiment (see e.g., FIGS. 29A-29D) in that all or part of the second high-permittivity dielectric material 72 is removed from the second transistor region 42 (as shown in FIG. 31A) rather than the first transistor region 31 (see e.g., FIG. 29B). In FIG. 31A, all of the second high-permittivity dielectric material 72 is removed from the second transistor region 42, for example. Hence, a method of fabricating the eighteenth embodiment may be the same as the method of fabricating the sixteenth embodiment, but with a different mask for removing the second high-permittivity dielectric material 72.

With the benefit of this disclosure, one of ordinary skill in the art may realize other variations on the methods and embodiments described above in accordance with the present invention. Also, some of the methods and/or embodiments described above may be combined to provide other methods and/or embodiments of the present invention.

Typically in an embodiment of the present invention, the equivalent silicon oxide thickness of the first gate dielectric portion 51 in the first transistor region 31 will differ from the equivalent silicon oxide thickness of the second gate dielectric portion 52 in the second transistor region 42 (either may be greater), even though the actual thickness of each gate dielectric portion 51, 52 may be the same (or different) (e.g., due to different materials). In other embodiments, however, the equivalent silicon oxide thickness of the first and second gate dielectric portions 51, 52 may be the same, while the actual thickness of each gate dielectric portion 51, 52 may be the same (or different), depending on the choice of materials included. Thus, the equivalent silicon oxide thickness for each gate dielectric portion 51, 52 may be specifically tuned or designed by varying the thickness of the material(s) included in the gate dielectric portion and/or by varying the choice of material(s) included in the gate dielectric portion. For example, the equivalent silicon oxide thickness of the first gate dielectric portion 51 may be less than about 10 angstroms (e.g., for a high-performance region) and the equivalent silicon oxide thickness of the second gate dielectric portion 52 may be greater than about 15 angstrom (e.g., for a low-leakage region). As an example, a gate dielectric portion in a core region (i.e., a high performance region) may have an equivalent silicon oxide thickness between 3 and 10 angstroms, and an I/O region (i.e., a low-leakage region) may have an equivalent silicon oxide thickness greater than or equal to 15 angstroms on the same chip (e.g., system-on-chip layout). This should be possible using an embodiment of the present invention, e.g., using an embodiment described above.

An embodiment of the present invention may also be formed in, on, or under a dummy structure. A dummy structure, which functions as etching profile controller to reduce loading effect and/or micro-loading effect during wet or dry etching process, may include a dummy gate electrode (e.g., poly-gate, metal-gate, or silicate-gate), dummy OD, or STI, for example.

Also, in an embodiment of the present invention, the normal-permittivity dielectric material in a transistor region may have an equivalent silicon oxide thickness of greater than or equal to 1 angstrom, for example. In a preferred embodiment, the normal-permittivity dielectric material in a transistor region has an equivalent silicon oxide thickness of greater than or equal to 15 angstroms, for example. In an embodiment where a gate dielectric portion includes a first and/or second high-permittivity dielectric material formed over a normal-permittivity dielectric material in at least one of the transistor regions, it is sometimes preferred to have such gate dielectric portion to have a greater equivalent silicon oxide thickness than at least one other gate dielectric portion.

Although the illustrative embodiments described above focus on two transistor regions, in any embodiment of the present invention there may be other transistor regions as well that have different gate dielectric structures than the first and second gate dielectric portions. For example, such other transistor regions may have a high-permittivity dielectric material, a normal-permittivity dielectric material, a stack of different high-permittivity dielectric materials, a stack including a high-permittivity dielectric material and a normal-permittivity dielectric material, or combinations thereof. Such other transistor regions may include, low power devices, core devices, I/O devices, high voltage devices, memory, or combinations thereof, for example.

An advantageous feature of an embodiment of the present invention may be that transistors having desired high switching speed can be fabricated on the same substrate 44 as transistors having desirable low gate leakage current characteristics. For example, this feature is particularly advantageous for embedded memory arrays.

Another advantageous feature of an embodiment of the present invention may be that it is well-suited for geometries of 0.13 microns, 90 nanometers, and even below wherein short channel effects are particularly pronounced. In addition to scalability, an embodiment of the present invention may provide the advantageous feature of being adaptable to double-gate structures, fin-FET structures, and other small geometry transistor structures, for example.

Other advantages of an embodiment of the present invention may be: 1. Ease of integrating multi-function devices (e.g., I/O and core) in one wafer; 2. Less or no degradation of device mobility; 3. Reducing interfacial layer generation; 4. Better reliability (e.g., NBTI and HC); 5. Lower operation power and lower gate leakage; or combinations thereof, for example.

Although embodiments of the present invention and at least some of its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating an integrated circuit comprising:
    forming a first gate dielectric portion on a substrate in a first transistor region, the first gate dielectric portion comprising a first high-permittivity dielectric material, and the first gate dielectric portion having a first equivalent silicon oxide thickness; and
    forming a second gate dielectric portion on the substrate in a second transistor region, the second gate dielectric portion comprising the first high-permittivity dielectric material, and the second gate dielectric portion having a second equivalent silicon oxide thickness, wherein the second equivalent silicon oxide thickness is different than the first equivalent silicon oxide thickness.

2. The method of claim 1, wherein the forming of the first and second gate dielectric portions comprises:
    forming a normal-permittivity dielectric material over the substrate in the first and second transistor regions;
    removing at least part of the normal-permittivity dielectric material from the first transistor region; and
    forming the first high-permittivity dielectric material over the substrate, wherein the first high-permittivity dielectric material overlies the normal-permittivity dielectric material remaining in the second transistor region.

3. The method of claim 1, wherein the forming of the first and second gate dielectric portions comprises:
    forming a normal-permittivity dielectric material over the substrate in the first and second transistor regions;
    removing part of the normal-permittivity dielectric material from the first transistor region such that the normal-permittivity dielectric material in the first transistor region has a first normal-permittivity-material thickness, the normal-permittivity dielectric material in the second transistor region has a second normal-permittivity-material thickness, and the first normal-permittivity-material thickness is less than the second normal-permittivity-material thickness; and
    forming the first high-permittivity dielectric material over the substrate, wherein the first high-permittivity dielectric material overlies the normal-permittivity dielectric material remaining in the first and second transistor regions.

4. The method of claim 1, wherein the forming of the first and second gate dielectric portions comprises:
    forming a second high-permittivity dielectric material over the substrate in the first and second transistor regions;
    removing part of the second high-permittivity dielectric material from the first transistor region such that the second high-permittivity dielectric material in the first transistor region has a first high-permittivity-material thickness, the second high-permittivity dielectric material in the second transistor region has a second high-permittivity-material thickness, and the first high-permittivity-material thickness is less than the second high-permittivity-material thickness; and
    forming the first high-permittivity dielectric material over the substrate, wherein the first high-permittivity dielectric material overlies the second high-permittivity dielectric material remaining in the first and second transistor regions.

5. The method of claim 1, wherein the forming of the first and second gate dielectric portions comprises:
    forming a second high-permittivity dielectric material over the substrate in the first and second transistor regions;
    removing at least part of the second high-permittivity dielectric material from the first transistor region; and
    forming the first high-permittivity dielectric material over the substrate, wherein the first high-permittivity dielectric material overlies the second high-permittivity dielectric material remaining in the second transistor region.

6. The method of claim 5, wherein the forming of the first and second gate dielectric portions further comprises:
    forming a normal-permittivity dielectric material over the substrate in the first and second transistor regions prior to the forming of the second high-permittivity dielectric material, such that the normal-permittivity dielectric material is located between the second high-permittivity dielectric material and the substrate.

7. The method of claim 1, wherein the forming of the first and second gate dielectric portions comprises:

forming a normal-permittivity dielectric material over the substrate in the first and second transistor regions;

removing at least part of the normal-permittivity dielectric material from the second transistor region;

forming a second high-permittivity dielectric material over the substrate in the first and second transistor regions;

removing at least part of the second high-permittivity dielectric material from the first transistor region; and forming the first high-permittivity dielectric material over the substrate, wherein the first high-permittivity dielectric material overlies the second high-permittivity dielectric material remaining in the second transistor region and overlies the normal-permittivity dielectric material remaining in the first transistor region.

8. The method of claim 1, wherein the forming of the first and second gate dielectric portions comprises:

forming a normal-permittivity dielectric material over the substrate in the first and second transistor regions;

removing at least part of the normal-permittivity dielectric material from the first transistor region;

forming a second high-permittivity dielectric material over the substrate in the first and second transistor regions, wherein the second high-permittivity dielectric material overlies the normal-permittivity dielectric material remaining in the second transistor region;

removing at least part of the second high-permittivity dielectric material from the first transistor region; and forming the first high-permittivity dielectric material over the substrate, wherein the first high-permittivity dielectric material overlies the second high-permittivity dielectric material and the normal-permittivity dielectric material remaining in the second transistor region.

9. The method of claim 1, wherein the forming of the first and second gate dielectric portions comprises:

forming the first high-permittivity dielectric material over the substrate in the first and second transistor regions; and removing part of the first high-permittivity dielectric material from the first transistor region such that the first high-permittivity dielectric material in the first transistor region has a first high-permittivity-material thickness, the first high-permittivity dielectric material in the second transistor region has a second high-permittivity-material thickness, and the first high-permittivity-material thickness is less than the second high-permittivity-material thickness.

10. The method of claim 9, wherein the forming of the first and second gate dielectric portions further comprises:

forming a normal-permittivity dielectric material over the substrate in the first and second transistor regions prior to the forming of the first high-permittivity dielectric material, such that the normal-permittivity dielectric material is located between the first high-permittivity dielectric material and the substrate.

11. The method of claim 9, wherein the forming of the first and second gate dielectric portions further comprises:

forming a normal-permittivity dielectric material over the substrate in the first and second transistor regions prior to the forming of the first high-permittivity dielectric material; and removing at least part of the normal-permittivity dielectric material from the second transistor region prior to the forming of the first high-permittivity dielectric material.

12. The method of claim 9, wherein the forming of the first and second gate dielectric portions further comprises:

forming a normal-permittivity dielectric material over the substrate in the first and second transistor regions prior to the forming of the first high-permittivity dielectric material; and removing at least part of the normal-permittivity dielectric material from the first transistor region prior to the forming of the first high-permittivity dielectric material.

13. The method of claim 1, wherein the forming of the first and second gate dielectric portions comprises:

forming a normal-permittivity dielectric material over the substrate in the first and second transistor regions;

forming a second high-permittivity dielectric material over the normal-permittivity dielectric material in the first and second transistor regions;

removing part of the second high-permittivity dielectric material from the first transistor region such that the second high-permittivity dielectric material in the first transistor region has a first high-permittivity-material thickness, the second high-permittivity dielectric material in the second transistor region has a second high-permittivity-material thickness, and the first high-permittivity-material thickness is less than the second high-permittivity-material thickness; and forming the first high-permittivity dielectric material over the second high-permittivity dielectric material.

14. The method of claim 13, wherein the forming of the first and second gate dielectric portions further comprises:

removing part of the first high-permittivity dielectric material from the second transistor region such that the first high-permittivity dielectric material in the second transistor region has a third high-permittivity-material thickness, the first high-permittivity dielectric material in the first transistor region has a fourth high-permittivity-material thickness, and the third high-permittivity-material thickness is less than the fourth high-permittivity-material thickness.

15. The method of claim 13, wherein the forming of the first and second gate dielectric portions further comprises:

removing at least part of the first high-permittivity dielectric material from the second transistor region.

16. A method of fabricating an integrated circuit comprising:

forming a first gate dielectric portion on a substrate in a first transistor region, the first gate dielectric portion comprising a first high-permittivity dielectric material; and forming a second gate dielectric portion on the substrate in a second transistor region, the second gate dielectric portion comprising a second high-permittivity dielectric material, wherein the second high-permittivity dielectric material is different than the first high-permittivity dielectric material.

17. The method of claim 16, wherein the forming of the first and second gate dielectric portions comprises:

forming the second high-permittivity dielectric material over the substrate in the first and second transistor regions;

removing part of the second high-permittivity dielectric material from the first transistor region such that the second high-permittivity dielectric material in the first transistor region has a first high-permittivity-material thickness, the second high-permittivity dielectric material in the second transistor region has a second high-permittivity-material thickness, and the first high-permittivity-material thickness is less than the second high-permittivity-material thickness; and forming the first high-permittivity dielectric material over the substrate, wherein the first high-permittivity dielectric material overlies the second high-permittivity dielectric material remaining in the first and second transistor regions.

18. The method of claim 16, wherein the forming of the first and second gate dielectric portions comprises:
forming the second high-permittivity dielectric material over the substrate in the first and second transistor regions;
removing at least part of the second high-permittivity dielectric material from the first transistor region; and
forming the first high-permittivity dielectric material over the substrate in the first and second transistor regions.

19. The method of claim 18, wherein the forming of the first and second gate dielectric portions further comprises:
prior to the forming of the first and second high-permittivity dielectric materials, forming a normal-permittivity dielectric material over the substrate in the first and second transistor regions, such that the normal-permittivity dielectric material is located between the second high-permittivity dielectric material and the substrate.

20. The method of claim 19, wherein the forming of the first and second gate dielectric portions further comprises:
removing at least part of the first high-permittivity dielectric material from the second transistor region.

21. The method of claim 16, wherein the forming of the first and second gate dielectric portions comprises:
forming the second high-permittivity dielectric material over the substrate in the first and second transistor regions;
removing at least part of the second high-permittivity dielectric material from the first transistor region;
forming the first high-permittivity dielectric material over the substrate in the first and second transistor regions; and
removing at least part of the first high-permittivity dielectric material from the second transistor region.

22. The method of claim 16, wherein the forming of the first and second gate dielectric portions comprises:
forming a normal-permittivity dielectric material over the substrate in the first and second transistor regions;
removing at least part of the normal-permittivity dielectric material from the second transistor region;
forming the second high-permittivity dielectric material over the substrate in the first and second transistor regions;
removing at least part of the second high-permittivity dielectric material from the first transistor region;
forming the first high-permittivity dielectric material over the substrate in the first and second transistor regions; and
removing at least part of the first high-permittivity dielectric material from the second transistor region.

23. The method of claim 16, wherein the forming of the first and second gate dielectric portions comprises:
forming a normal-permittivity dielectric material over the substrate in the first and second transistor regions;
removing at least part of the normal-permittivity dielectric material from the first transistor region;
forming the second high-permittivity dielectric material over the substrate in the first and second transistor regions;
removing at least part of the second high-permittivity dielectric material from the first transistor region;
forming the first high-permittivity dielectric material over the substrate in the first and second transistor regions; and
removing at least part of the first high-permittivity dielectric material from the second transistor region.

24. The method of claim 16, wherein the forming of the first and second gate dielectric portions comprises:
forming the first high-permittivity dielectric material over the substrate in the first and second transistor regions;
converting the first high-permittivity dielectric material in the second transistor region to the second high-permittivity dielectric material.

25. The method of claim 24, wherein the forming of the first and second gate dielectric portions further comprises:
prior to the forming of the first high-permittivity dielectric material, forming a normal-permittivity dielectric material over the substrate in the first and second transistor regions, such that the normal-permittivity dielectric material is located between the second high-permittivity dielectric material and the substrate.

26. The method of claim 25, wherein the forming of the first and second gate dielectric portions further comprises:
prior to the forming of the first high-permittivity dielectric material, removing at least part of the normal-permittivity dielectric material from the second transistor region.

27. The method of claim 25, wherein the forming of the first and second gate dielectric portions further comprises:
prior to the forming of the first high-permittivity dielectric material, removing at least part of the normal-permittivity dielectric material from the first transistor region.

28. A method of fabricating an integrated circuit comprising:
forming a first gate dielectric portion on a substrate in a first transistor region, the first gate dielectric portion comprising a first high-permittivity dielectric material, and the first gate dielectric portion having a first equivalent silicon oxide thickness; and
forming a second gate dielectric portion on the substrate in a second transistor region, the second gate dielectric portion comprising a second high-permittivity dielectric material, the second high-permittivity dielectric material being different than the first high-permittivity dielectric material, and the second gate dielectric portion having a second equivalent silicon oxide thickness, wherein the second equivalent silicon oxide thickness is different than the first equivalent silicon oxide thickness.

* * * * *